United States Patent [19]
Katayama et al.

[11] Patent Number: 5,994,744
[45] Date of Patent: Nov. 30, 1999

[54] ANALOG SWITCHING CIRCUIT

[75] Inventors: Tetsuya Katayama, Aichi-ken; Takeshi Miki; Junji Hayakawa, both of Okazaki; Hiroyuki Ban, Aichi-ken, all of Japan

[73] Assignee: Denso Corporation, Kariya, Japan

[21] Appl. No.: 08/898,752

[22] Filed: Jul. 23, 1997

Related U.S. Application Data

[63] Continuation-in-part of application No. 08/669,227, Jun. 24, 1996.

[30] Foreign Application Priority Data

| Jun. 22, 1995 | [JP] | Japan | 7-156439 |
| Jun. 22, 1995 | [JP] | Japan | 7-156447 |
| Apr. 26, 1996 | [JP] | Japan | 8-107195 |
| Jul. 24, 1996 | [JP] | Japan | 8-194997 |

[51] Int. Cl.$^6$ .................................................. H01L 29/72
[52] U.S. Cl. .......................... 257/370; 257/298; 257/372; 257/378; 257/393; 257/394; 327/534
[58] Field of Search ..................... 257/298, 370, 257/372, 378, 393, 394; 327/534

[56] References Cited

U.S. PATENT DOCUMENTS 4,511,814  4/1985  Matsuo et al. ........................... 257/296
5,321,650  6/1994  Kikuchi et al. ........................... 257/370

FOREIGN PATENT DOCUMENTS 6-103733  12/1994  Japan .

Primary Examiner—Edward Wojciechowicz
Attorney, Agent, or Firm—Pillsbury Madison & Sutro LLP

[57] ABSTRACT

An analog switching circuit comprises an insulated-gate field-effect transistor (Q20) having two n-type input-side and outpu-side semiconductor regions (201, 202) and a p-type semiconductor substrate region 203, for controlling conductiveness between an input terminal (IN) and an output terminal (OUT) based on a gate potential. A surge pulse detecting circuit (1020), responsive to an electric potential (Vi) of the input terminal (IN), produces a detection signal of a surge pulse equivalent to a forward bias of a PN junction formed between the semiconductor substrate region (203) and the input-side semiconductor region (201). A substrate potential setting circuit (1010) varies an electric potential of the semiconductor substrate region (203) in response to the electric potential (Vi) of the input terminal (IN) when aby detection signal is produced. Furthermore, a gate potential control circuit (1030) varies the gate potential of the insulated-gate field-effect transistor (Q20) in the same direction as the electric potential of the semiconductor substrate region (203) when the detection signal is produced.

42 Claims, 23 Drawing Sheets

ANALOG SWITCHING CIRCUIT

This application is a continuation-in-part of applicant's application Ser. No. 08/669,227, filed Jun. 24, 1996, entitled "Switching Circuit Having MOS Transistors."

BACKGROUND OF THE INVENTION

1. Field of the Invention

The present invention relates generally to an analog switching circuit having a plurality of MOS transistors, and more particularly to an analog switching circuit comprising a gate potential control circuit as well as a substrate potential setting circuit. The switching circuit of the present invention is, for example, applied to a CMOS analog switching circuit or a circuit having the CMOS analog switching circuit.

2. Description of the Related Art 2.1. Previously Proposed Art:

A conventional complementary metal-oxide-semiconductor (CMOS) analog switching circuit is shown in FIG. 1.

As shown in FIG. 1, a conventional CMOS analog switching circuit 701 has a pair of p-channel MOS (PMOS) transistor Q110 and n-channel MOS (NMOS) transistor Q120 functioning as a CMOS analog switch, and the transistors Q110 and Q120 respectively function as a transfer gate. A control signal transmitted through a control terminal G is converted and amplified by a first converting buffer INV11. The control signal converted is input to a base of the PMOS transistor Q110. Also, the control signal converted is again converted and amplified by a second converting buffer INV12, and the control signal converted by the second converting buffer INV12 is input to a base of the NMOS transistor Q120. This conventional CMOS analog switching circuit 701 is well-known.

When a surge pulse having a positive voltage is applied to an input terminal IN, a lateral p-n-p bipolar transistor in which an n-type semiconductor substrate (or an n-type well region) placed just under the PMOS transistor Q110 functions as a base, a p-type region functioning as an input side main electrode of the PMOS transistor Q110 functions as an emitter and a p-type region functioning as an output side main electrode of the PMOS transistor Q110 functions as a collector is formed as a lateral p-n-p parasitic transistor Ty. Therefore, even though the transistors Q110 and Q120 are turned off to turn off the CMOS analog switching circuit 701, the positive surge is transmitted to an output terminal OUT of the CMOS analog switching circuit 701 through the parasitic transistor Ty, and an electric potential at the output terminal OUT is changed as a result of an influence of the positive surge.

In the same manner, when a surge pulse having a negative voltage is input to the input terminal IN, a lateral n-p-n bipolar transistor in which an p-type well placed just under the NMOS transistor Q120 functions as a base, an n-type region functioning as an input side main electrode of the NMOS transistor Q120 functions as an emitter and an n-type region functioning as an output side main electrode of the NMOS transistor Q120 functions as a collector is formed as a lateral n-p-n parasitic transistor Tx. Therefore, even though the transistors Q110 and Q120 are turned off to turn off the CMOS analog switching circuit 701, the negative surge is transmitted to the output terminal OUT through the parasitic transistor Tx, and an electric potential at the output terminal OUT is changed as a result of an influence of the negative surge.

FIG. 2 shows another conventional CMOS analog switching circuit.

As shown in FIG. 2, a conventional CMOS analog switching circuit 702 has the transistors Q110 and Q120 and a deformed MOS inverter 703 composed of a loading device and a driver device arranged between the input terminal IN and a grounded electric potential terminal Vss. The loading device is composed of a pair of NMOS transistor Q130 and PMOS transistor Q140 functioning as a CMOS transfer gate (or an analog switch). The driver device is formed by an NMOS transistor Q150 of which a source is grounded. In the deformed MOS inverter 703, when an electric potential at the control terminal G is set to a high level, the transistors Q120, Q130 and Q140 are turned on. Therefore, an input signal passing through the input terminal IN is transmitted to the p-type well of the NMOS transistor Q120 through the transistors Q130 and Q140. That is, an electric potential of the p-type well of the NMOS transistor Q120 changes with an electric potential of the input signal. Therefore, a channel conductance demodulating effect of the NMOS transistor Q120 caused by the change of the electric potential of the input signal is reduced, and an on-state characteristic of the NMOS transistor Q120 is improved.

However, in the conventional CMOS analog switching circuit 702, when a positive surge is input to the input terminal IN, the positive surge still influences on the output terminal OUT through the parasitic transistor Ty in the same manner as in the conventional CMOS analog switching circuit 701.

To solve the adverse influence of the positive surge and the negative surge, an analog switching circuit is disclosed in the Published Unexamined Japanese Patent Application No. H6-103733 of 1994. In this analog switching circuit, a first-stage CMOS analog switch integrated in a first-stage semiconductor region and a second-stage CMOS analog switch integrated in a second-stage semiconductor region are connected with each other in series on a semiconductor substrate, and a charge absorbing region having a conductive type opposite to that of the semiconductor substrate is formed on a surface of the semiconductor substrate along a boundary portion between the first-stage semiconductor region and the second-stage semiconductor region. In the above configuration, when a surge pulse is input to an input terminal of the first-stage CMOS analog switch, a p-n junction between the charge absorbing region connected with the input terminal of the first-stage CMOS analog switch and the semiconductor substrate is formed on the surface of the semiconductor substrate, and the p-n junction is set in a forward bias condition. Therefore, even though minority carriers are injected from the charge absorbing region to the semiconductor substrate, the influence of the minority carriers on an output terminal of the second-stage CMOS analog switch can be removed.

2.2. Problems to be Solved by the Invention:

However, because the first-stage CMOS analog switch (or a transfer gate) and the second-stage CMOS analog switch (or another transfer gate) are connected with each other in series, operational delays of the analog switches occur in series, and a delay of an output signal is increased. In particular, because an electric power accumulated in a parasitic capacitor which is generated at a connecting point of the analog switches is discharged through a channel resistor of the first-stage CMOS analog switch and an output resistor of an external amplifier connected with the first-stage CMOS analog switch, a signal transmission delay and a signal waveform distortion (or a high-frequency attenuation) depending on a CR time constant determined by a parasitic capacitance C of the parasitic capacitor and a resistance R of the channel resistor occur in the analog switches (or transfer switches).

Also, when a sum of two resistances (called on-state resistances) of the analog switches arranged in series in a condition that the analog switches are turned on is equalized with an on-state resistance of an analog switching circuit in which a single analog switch is only arranged, it is required to widen an area of each of the analog switches twice. As a result, there is a drawback that a chip area required for the analog switches arranged in series becomes four times as wide as that for an analog switching circuit in which a single analog switch is only arranged.

Further more, a threshold value of NMOS transistor Q120 is not constant due to manufacturing errors. When the threshold value of NMOS transistor Q120 is extremely low, a problem arises. That is, if a substrate region potential of the NMOS transistor Q120 is reduced in response to a negative surge pulse, there is a possibility that the NMOS transistor Q120 may be turned on erroneously due to a potential difference between the gate potential and the substrate (or well) region potential.

SUMMARY OF THE INVENTION

An object of the present invention is to provide an analog switching circuit capable of preventing both of a CMOS field-effect transistor, i.e., insulated-gate field-effect transistor, and its parasitic transistor from being erroneously turned on due to a negative serge pulse applied to the input terminal.

In order to accomplish this and other related objects, the present invention provides a novel and improved analog switching circuit having various aspects which will be described hereinafter. Reference numerals in parentheses, added in the following description, are used for demonstrating the correspondence to components described in preferred embodiments of the present invention and not used for narrowly interpreting the scope of claims of the present invention.

A first aspect of the present invention provides an analog switching circuit comprises an insulated-gate field-effect transistor (Q20) having a first-conductive type input-side semiconductor region (201) connected to the input terminal (IN), a first-conductive type output-side semiconductor region (202) connected to the output terminal (OUT), and a second-conductive type semiconductor substrate region (203). The insulated-gate field-effect transistor (Q20) controls conductiveness between the input terminal (IN) and the output terminal (OUT) based on a gate potential. A surge pulse detecting means (1020), responsive to an electric potential (Vi) of the input terminal (IN), produces a detection signal when the electric potential (Vi) of the input terminal (IN) reaches a surge voltage level equivalent to a forward bias of a PN junction formed between the semiconductor substrate region (203) and the input-side semiconductor region (201). A substrate potential setting means (1010) varies an electric potential of the semiconductor substrate region (203) in response to the electric potential Vi of the input terminal (IN) when the detection signal is produced from the surge pulse detecting means (1020). In addition, a gate potential control means (1030) varies the gate potential of the insulated-gate field-effect transistor (Q20) in the same direction as the electric potential of the semiconductor substrate region (203) when the detection signal is produced from the surge pulse detecting means (1020).

Preferably, the gate potential of the insulated-gate field-effect transistor (Q20) follows the electric potential (Vi) of the input terminal (IN) under a control of the gate potential control means (1030).

The gate potential control means (1030) may comprise voltage transmission means (1031b, 1031c, 1031d) for transmitting the electric potential (Vi) of the input terminal (IN) to a gate of the insulated-gate field-effect transistor (Q20).

In a preferable mode, the insulated-gate field-effect transistor (Q20) serves as a first insulated-gate field-effect transistor, while the substrate potential setting means (1010) comprises a second insulated-gate field-effect transistor (Q30) connected between the input terminal (IN) and the semiconductor substrate region (203). A control is performed in the following manner:

the second insulated-gate field-effect transistor (Q30) is turned on when the first insulated-gate field-effect transistor (Q20) is turned on so that the electric potential of the semiconductor substrate region (203) follows the electric potential (Vi) of the input terminal (IN);

the second insulated-gate field-effect transistor (Q30) is turned off when the first insulated-gate field-effect transistor (Q20) is turned off so that the electric potential of the semiconductor substrate region (203) is fixed to a constant voltage (Vss); and a parasitic transistor of the second insulated-gate field-effect transistor (Q30) is activated when the electric potential (Vi) of the input terminal (IN) reaches the surge voltage level under a condition where the second insulated-gate field-effect transistor (Q30) in turned off so that the electric potential of the semiconductor substrate region (203) follows the electric potential (Vi) of the input terminal (IN).

The substrate potential setting means (1010) may comprise switch means (55) interposed between the second insulated-gate field-effect transistor (Q30) and a voltage source providing the constant voltage (Vss). In this case, the switch means (55) disconnects the second insulated-gate field-effect transistor (Q30) from the voltage source when the detection signal is produced from the surge pulse detecting means (1020).

Next, a second aspect of the present invention provides a switching circuit for transmitting a first signal applied to an input terminal (IN) to an output terminal (OUT) and transmitting a second signal applied to the output terminal (OUT) to the input terminal (IN) according to a control signal applied to a control terminal (G). This switching circuit comprises an insulated-gate field-effect transistor (Q20) having a first-conductive type input-side semiconductor region (201) connected to the input terminal (IN),a first-conductive type output-side semiconductor region (202) connected to the output terminal (OUT), and a second-conductive type semiconductor substrate region (203) arranged between the input-side semiconductor region (201) and the output-side semiconductor region (202). A first p-n junction is set between the semiconductor substrate region (203) and the input-side semiconductor region (201). A second p-n junction is set between the semiconductor substrate region (203) and the output-side semiconductor region (202). A channel portion of the semiconductor substrate region (203) has a conductive type inverted from the second-conductive type to the first-conductive type in response to the control signal supplied from the control terminal (G), thereby transmitting the input signal from the input-side semiconductor region (201) to the output-side semiconductor region (202) through the channel portion of the semiconductor substrate region (203) or transmitting the output signal from the output-side semiconductor region (202) to the input-side semiconductor region (201) through the channel portion of the semiconductor substrate region (203). An electric potential setting means (52) is provided for varying an electric potential of the semiconductor substrate region (203) to prevent a first forward current from flowing across the first p-n junction by decreasing a first differential voltage at the first p-n junction when a surge pulse is applied to the input terminal (IN) so as to increase the first differential voltage or to prevent a second forward current from flowing across the second p-n junction by decreasing a second differential voltage at the second p-n junction when a surge pulse is applied to the output terminal (OUT) so as to increase the second differential voltage. In addition, a gate potential control means (1030) is provided for varying a gate potential of the insulated-gate field-effect transistor (Q20) in the same direction as the electric potential of the semiconductor substrate region (203) when the surge pulse is applied to the input terminal (IN) or the output terminal (OUT).

According to the features of one preferred embodiment, the first-conductive type is an n-type and the second-conductive type is a p-type, and the electric potential of the semiconductor substrate region (203) is set to a particular electric potential. The electric potential setting means (52) comprises a surge pulse detecting means (53) and substrate potential controlling means (55). The surge pulse detecting means (53) judges whether or not an electric potential (Vi) of the input terminal (IN) is lower than a reference electric potential (Vref1) to detect the surge pulse when the electric potential (Vi) of the input terminal (IN) is lower than the reference electric potential (Vref1). The substrate potential controlling means (55) maintains the particular electric potential of the semiconductor substrate region (203) when no surge pulse is detected by the surge pulse detecting means (53) and sets the semiconductor substrate region (203) to a floating potential when any surge pulse is detected by the surge pulse detecting means (53).

According to the features of another preferred embodiment, the first-conductive type is an n-type and the second-conductive type is a p-type, and the electric potential of the semiconductor substrate region (203) is set to a particular electric potential. The electric potential setting means (52) comprises a surge pulse detecting means (53) and a substrate potential controlling means (55). The surge pulse detecting means (53) judges whether or not an electric potential (Vi) of the input terminal (IN) is lower than a reference electric potential (Vref1) to detect the surge pulse when the electric potential (Vi) of the input terminal (IN) is lower than the reference electric potential (Vref1). The substrate potential controlling means (55) maintains the particular electric potential of the semiconductor substrate region (203) when no surge pulse is detected by the surge pulse detecting means (53) and changes the particular electric potential of the semiconductor substrate region (203) to decrease an electric potential difference between the semiconductor substrate region (203) and the input-side semiconductor region (201) when any surge pulse is detected by the surge pulse detecting means (53).

According to the features of still another preferred embodiment, the first-conductive type is an n-type and the second-conductive type is a p-type, and the electric potential of the semiconductor substrate region (203) is set to a particular electric potential. The electric potential setting means (52) comprises a surge pulse detecting means (54) and a substrate potential controlling means (55). The surge pulse detecting means (54) judges whether or not an electric potential (Vo) of the output terminal (OUT) is lower than a reference electric potential (Vref2) to detect the surge pulse when the electric potential (Vo) of the output terminal (OUT) is lower than the reference electric potential (Vref2). The substrate potential controlling means (55) maintains the particular electric potential of the semiconductor substrate region (203) when no surge pulse is detected by the surge pulse detecting means (54) and sets the semiconductor substrate region (203) to a floating potential when any surge pulse is detected by the surge pulse detecting means (54).

According to the features of yet another preferred embodiment, the first-conductive type is an n-type and the second-conductive type is a p-type, and the electric potential of the semiconductor substrate region (203) is set to a particular electric potential. The electric potential setting means (52) comprises a surge pulse detecting means (54) and a substrate potential controlling means (55). The surge pulse detecting means (54) judges whether or not an electric potential (Vo) of the input terminal (OUT) is lower than a reference electric potential (Vref2) to detect the surge pulse when the electric potential (Vo) of the output terminal (OUT) is lower than the reference electric potential (Vref2). The substrate potential controlling means (55) maintains the particular electric potential of the semiconductor substrate region (203) when no surge pulse is detected by the surge pulse detecting means (54) and changes the particular electric potential of the semiconductor substrate region (203) to decrease an electric potential difference between the semiconductor substrate region (203) and the output-side semiconductor region (202) when any surge pulse is detected by the surge pulse detecting means (54).

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS (First Embodiment)

Figure 3A:
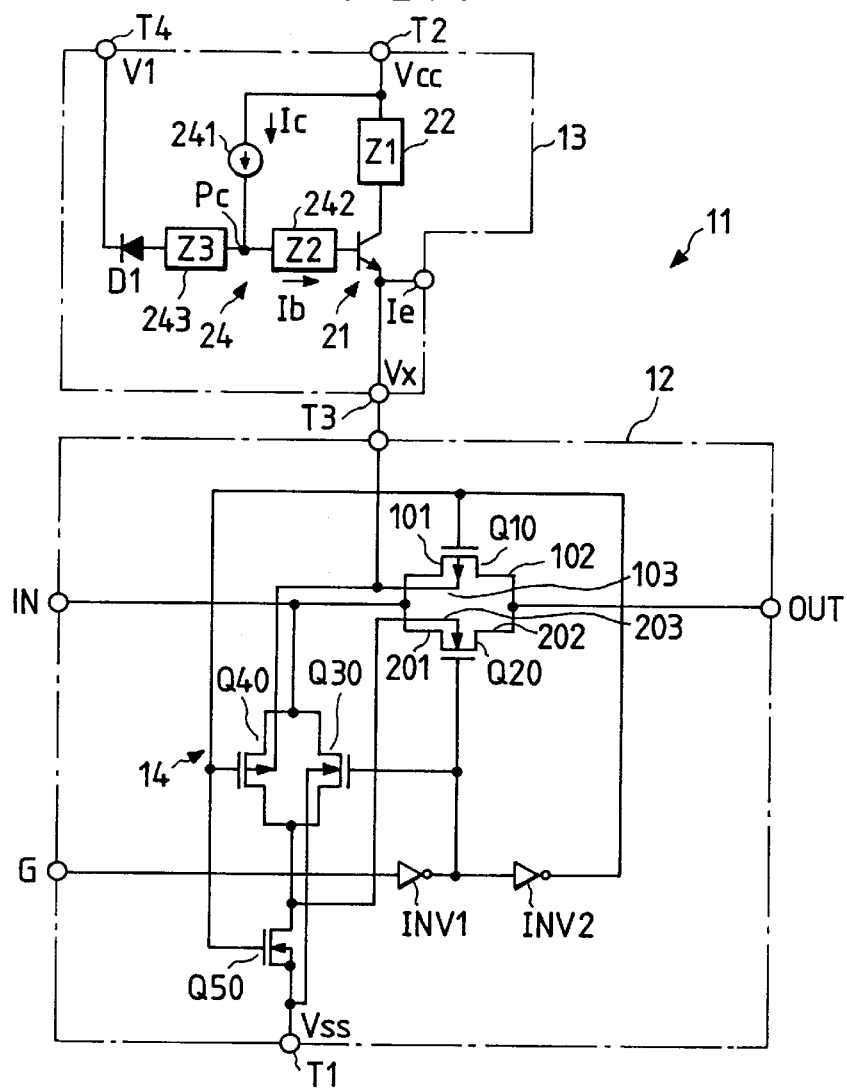
FIG. 3A is a circuit diagram of an analog switching circuit according to a first embodiment of the present invention.
Figure 3B:
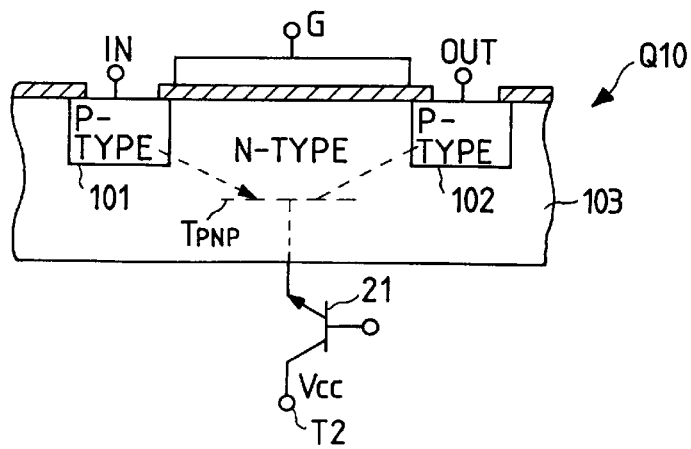
FIG. 3B is a cross-sectional view of a PMOS transistor of a CMOS analog switch shown in FIG. 3A.

An analog switching circuit is described as an example of a switching circuit with reference to FIGS. 3A and 3B according to a first embodiment of the present invention.

As shown in FIG. 3A, an MOS analog switching circuit 11 comprises a CMOS analog switch (or a CMOS transfer gate) 12 and an electric potential setting circuit 13 for setting an electric potential applied to the CMOS analog switch 12. The electric potential setting circuit 13 represents an electric potential setting means.

The CMOS analog switch 12 comprises a PMOS transistor Q10 and an NMOS transistor Q20 connected with each other in parallel, a first CMOS inverter INV1 for converting an electric potential of a control signal applied to a control input terminal G to apply the converted electric potential to the gate of the NMOS transistor Q20, and a second CMOS inverter INV2 for again converting the electric potential of the control signal converted by the first CMOS converter INV1 to apply the electric potential converted by the second CMOS inverter INV2 to the gate of the PMOS transistor Q10. An input terminal IN is connected with a p-type input side semiconductor region 101 of the PMOS transistor Q10 and an n-type input side semiconductor region 201 of the NMOS transistor Q20, and an output terminal OUT is connected with a p-type output side semiconductor region 102 of the PMOS transistor Q10 and an n-type output side semiconductor region 202 of the NMOS transistor Q20. An electric potential of an n-type semiconductor substrate region (or a semiconductor region placed just under a gate) 103 of the PMOS transistor Q10 is controlled by the electric potential setting circuit 13, and 203 denotes a p-type well region (or a semiconductor region placed just under a gate) of the NMOS transistor Q20.

A fundamental operation in the CMOS analog switch 12 is described.

When an electric potential of a control signal applied to the control input terminal G is set to a low level, the transistors Q10 and Q20 are turned on, and the CMOS analog switch 12 is turned on. In detail, in cases where an electric potential of the input terminal IN is higher than that of the output terminal OUT, the p-type input side semiconductor region 101 of the PMOS transistor Q10 and the n-type output side semiconductor region 202 of the NMOS transistor Q20 respectively function as a source, carriers (positive holes) move from the input terminal IN to the output terminal OUT through the PMOS transistor Q10, carriers (electrons) move from the output terminal OUT to the input terminal IN through the NMOS transistor Q20. In contrast, in cases where an electric potential of the input terminal IN is lower than that of the output terminal OUT, the p-type output side semiconductor region 102 of the PMOS transistor Q10 and the n-type input side semiconductor region 201 of the NMOS transistor Q20 respectively function as a source, carriers (positive holes) move from the output terminal OUT to the input terminal IN through the PMOS transistor Q10, and carriers (electrons) move from the input terminal IN to the output terminal OUT through the NMOS transistor Q20. Therefore, the electric potential of the output terminal OUT agrees with that of the input terminal IN. In this case, when an electric potential of the input terminal IN is higher than that of the output terminal OUT, because of the increase of a threshold value for a gate electric potential in the NMOS transistor Q20 and the increase of an on-state resistance of the NMOS transistor Q20, a current mainly flows through the PMOS transistor Q10. In contrast, in cases where an electric potential of the input terminal IN is lower than that of the output terminal OUT, because of the increase of a threshold value for a gate electric potential in the PMOS transistor Q10 and the increase of an on-state resistance of the PMOS transistor Q10, a current mainly flows through the NMOS transistor Q20.

The CMOS analog switch 12 further comprises an NMOS transistor electric potential setting element 14 for setting an electric potential of the p-type well region 203 of the NMOS transistor Q20. The NMOS transistor electric potential setting element 14 is formed by arranging a deformed MOS inverter composed of a pair of NMOS transistor Q30 and PMOS transistor Q40 functioning as a loading device and a source-grounded NMOS transistor Q50 functioning as a driver device between the input terminal IN and a low potential electric source terminal T1. A CMOS transfer gate (or an analog switch) is formed by the transistors Q30 and Q40.

In the NMOS transistor electric potential setting element 14, when an electric potential at the control input terminal G is set to a low level, the transistors Q20, Q30 and Q40 are turned on, and an input signal applied to the input terminal IN is transmitted to the p-type well region 203 of the NMOS transistor Q20 through the transistors Q30 and Q40. That is, an electric potential of the p-type well region 203 of the NMOS transistor Q20 changes with an electric potential Vi of the input signal. Therefore, a channel conductance demodulating effect of the NMOS transistor Q20 caused by the change of the electric potential of the input signal is reduced, and an on-state characteristic of the NMOS transistor Q20 is improved. When an electric potential at the control input terminal G is set to a high level, the transistor Q50 is turned on, the transistors Q30 and Q40 are turned off, and an electric potential of the p-type well region 203 of the NMOS transistor Q20 is set to a low electric potential (or a grounded potential) Vss of the low potential electric source terminal T1. Also, the NMOS transistor Q20 is turned off. Therefore, even though the electric potential Vi at the input terminal IN (or the electric potential Vi of the input signal) is set to a low level, a p-n junction between the n-type input side semiconductor region 201 and the p-type well region 203 in the NMOS transistor Q20 is not set to a forward bias condition. In contrast, when an electric potential at the control input terminal G is set to a low level, the transistor Q50 is turned off, and the transistors Q30 and Q40 are turned on. Because a CMOS analog switch (or the transfer gate) is formed by the transistors Q30 and Q40, a channel conductance of each of the transistors Q30 and Q40 is maintained to a high value regardless of the change of the electric potential Vi of the input signal. As a result, because the electric potential Vi at the input terminal IN (or the electric potential Vi of the input signal) is applied to the p-type well region 203 in the NMOS transistor Q20 through the transistors Q30 and Q40, an electric potential of the p-type well region 203 in the NMOS transistor Q20 changes with the electric potential Vi of the input signal. Therefore, a channel conductance demodulating effect of the NMOS transistor Q20 caused by the change of the electric potential of the n-type input side semiconductor region 201 of the NMOS transistor Q20 is reduced, and an on-state characteristic of the NMOS transistor Q20 is improved.

The electric potential setting circuit 13 comprises an n-p-n emitter follower transistor 21 of which an emitter is connected with the n-type semiconductor substrate region 103 of the PMOS transistor Q10 through a connecting terminal T3, a collector side resistor 22 connecting a collector of the n-p-n emitter follower transistor 21 and a high potential electric source terminal T2, and a base current setting circuit 24 for setting a base current Ib supplied to a base of the n-p-n emitter follower transistor 21. In this case, it is applicable that the emitter of the n-p-n emitter follower transistor 21 be connected with the low potential electric source terminal T1 through a prescribed emitter loading device. A resistor or a zener diode in which a breakdown voltage is higher than a reference electric potential Vi applied to the base current setting circuit 24 can use as the emitter loading device.

The base current setting circuit 24 comprises a first resistor 242 connected with the base of the n-p-n emitter follower transistor 21, a diode D1 connected with a reference electric potential terminal T4, a second resistor 243 connecting the first resistor 242 and the diode D1, and a constant current source 241 connected with the high potential electric source terminal T2 for supplying a constant current Ic from the terminal T2 to a common connecting point Pc between the first and second resistors 242 and 243 to supply the base current Ib to the base of the n-p-n emitter follower transistor 21. The constant current source 241 represents a reference current supplying means for supplying a reference current from the terminal T2 to the common connecting point Pc, the first resistor 242 represents a base current supplying means, and the second resistor 243 represents a difference current absorbing means for absorbing a difference between the reference current and the base current.

An operation in the electric potential setting circuit 13 is described.

When any surge pulse having a positive voltage is not applied to the input terminal IN, an emitter current ie is supplied from the n-p-n emitter follower transistor 21 to the PMOS transistors Q10 and Q30 of the CMOS analog switch 12 as a leakage current at a p-n junction of each transistor. In this case, a base current Ib of which a value is 1/K of that of the emitter current Ie is supplied from the base current setting circuit 24 to the base of the n-p-n emitter follower transistor 21. A value K denotes a current amplification factor in the n-p-n emitter follower transistor 21. That is, a constant current Ic is supplied from the base current setting circuit 24 to the common connecting point Pc, a difference current Ic-Ib is discharged to the reference electric potential terminal T4 through the second resistor 243, and the base current Ib flows from the common connecting point Pc to the base of the n-p-n emitter follower transistor 21.

Next, an action of the electric potential setting circuit 13 for a surge pulse having a steep high voltage is described. When a reference electric potential at the reference electric potential terminal T4 is V1, a resistance value of the first resistor 242 is Z2, a resistance value of the second resistor 243 is Z3, an output electric potential (or an emitter electric potential) of the electric potential setting circuit 13 which is equivalent to an electric potential of the n-type semiconductor substrate region 103 of the PMOS transistor Q10 is Vx, a forward voltage drop between the emitter and the base in the n-p-n emitter follower transistor 21 is ΔV, and the forward voltage drop ΔV is equal to another forward voltage drop in the diode D1, an equation (1) is obtained by considering a common contacting voltage Vc at the common contacting point Pc.

$$Z3*(Ic-Ib)+\Delta V+V1=Z2*Ib+\Delta V+Vx \tag{1}$$

Therefore, $$Vx=Z3*Ic-(Z3+Z2)*Ib+V1 \tag{2}$$

Assuming that the base current Ib is constant, the emitter electric potential Vx is determined by the reference electric potential V1. Also, the common contacting voltage Vc is obtained from the equation (1).

$$Vc=Z2*Ib+\Delta V+Vx \tag{3}$$

$$Vc=V1-Ib*Z3+Ic*Z3+\Delta V \tag{4}$$

An equation (5) is obtained by changing the equation (4).

$$Ib=(V1-Vc+Ic*Z3+\Delta V)/Z3 \tag{5}$$

When the equation (3) is rearranged by substituting the equation (5) into the equation (3), an equation (6) is obtained.

$$Vc = Z2^*(V1 - Vc + Ic^*Z3 + \Delta V)/Z3 + \Delta V + Vx \tag{6}$$

An equation (7) is obtained by changing the equation (6).

$$Vc^*(1 + Z2/Z3) = Z2^*(V1 + Ic^*Z3 + \Delta V)/Z3 + \Delta V + Vx \tag{7}$$

Therefore, when the emitter electric potential Vx is increased because of a positive surge pulse applied to the input terminal IN, the common connecting electric potential Vc at the common connecting point Pc is increased according to the equation (7). Also, even though a positive surge pulse is applied to the input terminal IN and the emitter electric potential Vx is increased, because the common connecting electric potential Vc at the common connecting point Pc is increased according to the increase of the emitter electric potential Vx, a reverse bias of a p-n junction between the emitter and the base in the n-p-n emitter follower transistor 21 can be prevented. That is, the breakdown of the n-p-n emitter follower transistor 21 resulting from the reverse bias can be prevented.

Accordingly, as shown in FIG. 3B, because a lateral p-n-p parasitic transistor Tpnp in which the n-type semiconductor substrate region 103 of the PMOS transistor Q10 functions as a base, the p-type input side semiconductor region 101 of the PMOS transistor Q10 functions as an emitter and the p-type output side semiconductor region 102 of the PMOS transistor Q10 functions as a collector is not turned on because any base current of the lateral p-n-p parasitic transistor Tpnp does not flow from the n-type semiconductor substrate region 103 to the high potential electric source terminal T2 through the n-p-n emitter follower transistor 21, the positive surge pulse applied to the input terminal IN does not influence on the output terminal OUT.

It is applicable that a base electric potential at the base of the n-p-n emitter follower transistor 21 be set to a constant value. In this case, the emitter electric potential Vx of the n-p-n emitter follower transistor 21 is increased when a positive surge pulse is input to the input terminal IN. Therefore, there is a probability that the breakdown of the p-n junction between the emitter and the base in the n-p-n emitter follower transistor 21 occurs.

Figure 1:
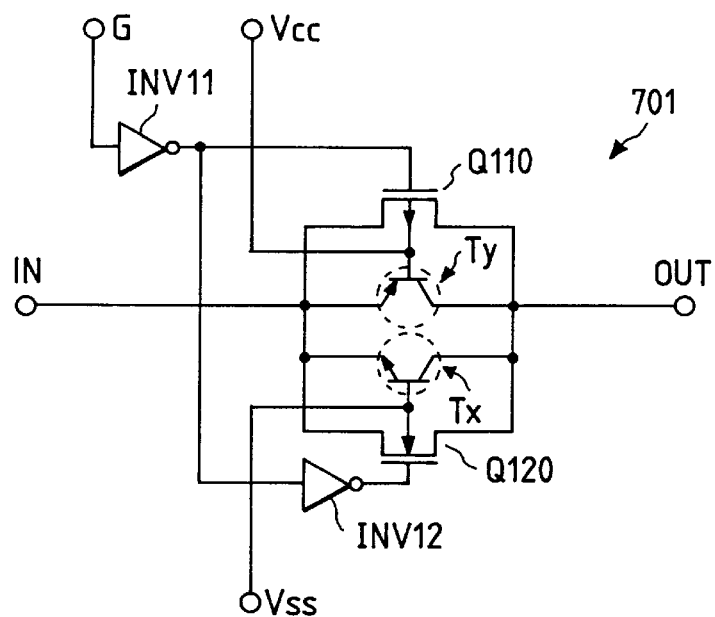
FIG. 1 shows a conventional CMOS analog switching circuit.
Figure 2:
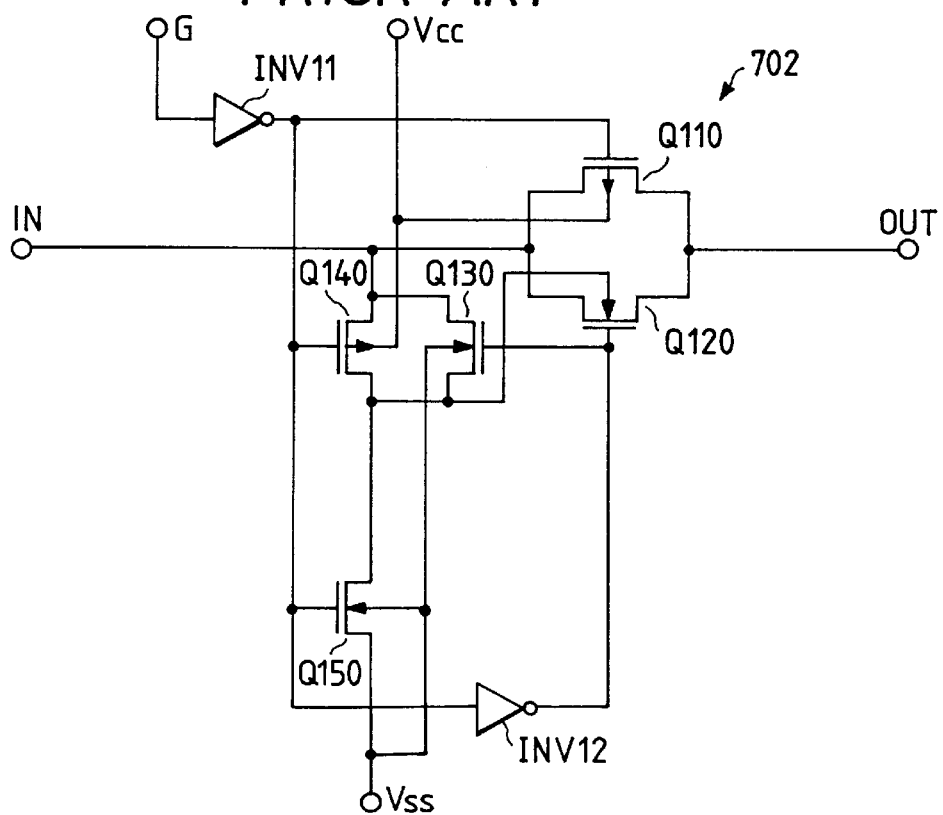
FIG. 2 shows another conventional CMOS analog switching circuit.

Also, it is capable that a high level electric potential Vcc of the high potential electric source terminal T2 be directly applied to the base of the n-p-n emitter follower transistor 21. However, in this case, even though any positive surge pulse is not input to the input terminal IN, a high electric potential of Vcc−0.7 V is always applied to the n-type semiconductor substrate region 103 of the PMOS transistor Q10, and this condition is not preferable. That is, in cases where the high level electric potential Vcc is directly applied to the n-type semiconductor substrate region 103 in the same manner as in the prior art shown in FIG. 1 or 2, when an electric potential of the n-type semiconductor substrate region 103 becomes higher than the high level electric potential Vcc because of the positive surge pulse, the breakdown of a p-n junction between the emitter and the base in the n-p-n emitter follower transistor 21 occurs, and a base current of the lateral p-n-p parasitic transistor Tpnp in which the n-type semiconductor substrate 103 functions as a base, the p-type input side semiconductor region 101 functions as an emitter and the p-type output side semiconductor region 102 functions as a collector flows from the n-type semiconductor substrate 103 to the high potential electric source terminal T2 through the p-n junction between the base and the emitter in the n-p-n emitter follower transistor 21 to turn on the lateral p-n-p parasitic transistor Tpnp. Therefore, there is a drawback that a collector current of the lateral p-n-p parasitic transistor Tpnp flows from the p-type input side semiconductor region 101 to the p-type output side semiconductor region 102 even though the PMOS transistor Q10 is turned off. That is, an adverse influence of the positive surge pulse is exerted on the output terminal OUT. This drawback is solved by the electric potential setting circuit 13 of the first embodiment. That is, the electric potential setting circuit 13 functions as a one directional electric source.

(Second Embodiment)

Figure 4:
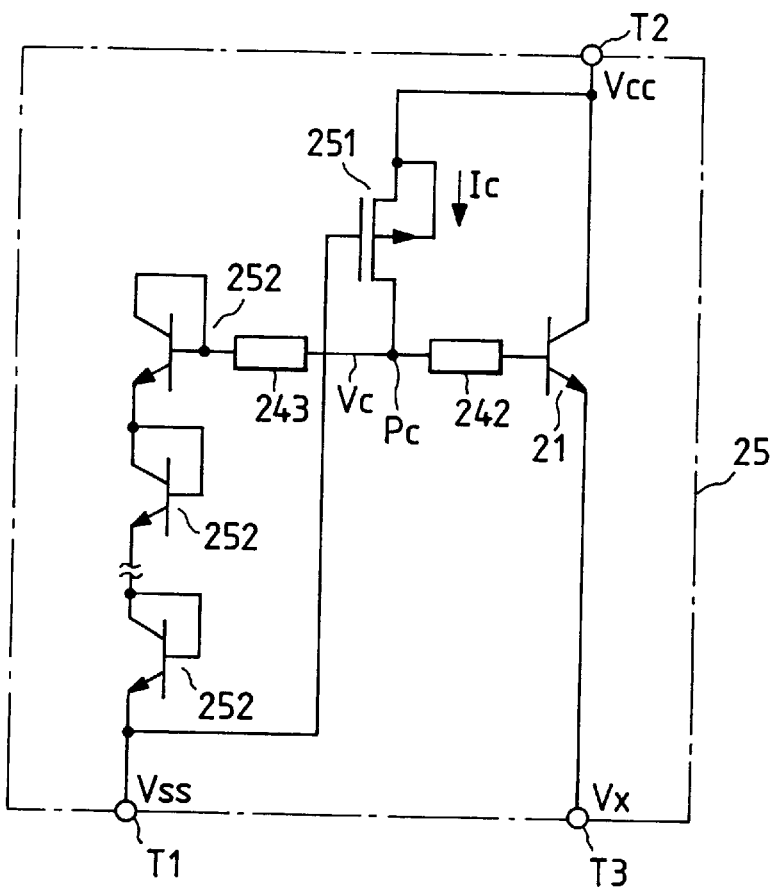
FIG. 4 is a circuit diagram showing another electric potential setting circuit according to a second embodiment of the present invention.

FIG. 4 is a circuit diagram of another electric potential setting circuit according to a second embodiment of the present invention.

As shown in FIG. 4, an electric potential setting circuit 25 connected with the n-type semiconductor substrate region 103 of the PMOS transistor Q10 comprises the n-p-n emitter follower transistor 21, the first resistor 242, the second resistor 243, a constant current source 251 connected with the high potential electric source terminal T2 for supplying a constant current Ic from the terminal T2 to the common connecting point Pc to supply the base current Ib to the base of the n-p-n emitter follower transistor 21, and a series of n-p-n transistors 252 connected with the second resistor 243.

The constant current source 251 is composed of a source-grounded PMOS transistor in which a gate is connected with the low potential electric source terminal T1, a source is connected with the high potential electric source terminal T2 and a drain is connected with the common connecting point Pc. A base of a first-stage n-p-n transistor 252 is connected with the second resistor 243, an emitter of one n-p-n transistor 252 is connected with a collector of another lower-stage n-p-n transistor 252, and an emitter of a final-stage n-p-n transistor 252 is connected with the low potential electric source terminal T1.

In the above configuration of the electric potential setting circuit 25, a constant electric potential circuit required to provide the reference electric potential V1 can be easily obtained by the series of n-p-n transistors 252.

In the second embodiment, the constant current source 251 is composed of the source-grounded PMOS transistor. However, it is applicable that the constant current source 251 be composed of a p-n-p transistor in which the high level electric potential Vcc is applied to an emitter, a collector is connected with the common connecting point Pc and the low level electric potential Vss is applied to a base through a base current limiting resistor.

(Third Embodiment)

Figure 5:
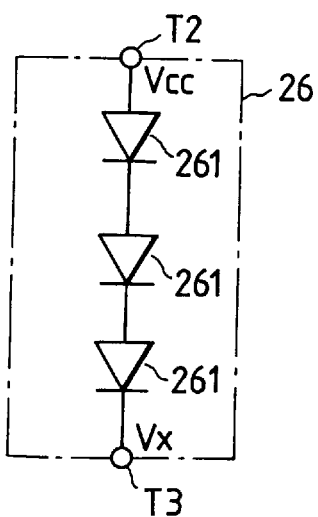
FIG. 5 is a circuit diagram showing another electric potential setting circuit according to a third embodiment of the present invention.

FIG. 5 is a circuit diagram of another electric potential setting circuit according to a third embodiment of the present invention.

As shown in FIG. 5, an electric potential setting circuit 26 comprises a series of junction diodes 261 arranged between the n-type semiconductor substrate region 103 of the PMOS transistor Q10 and the high potential electric source terminal T2.

In the above configuration, even though an electric potential of the n-type semiconductor substrate region 103 becomes higher than the high level electric potential Vcc, because a plurality of junction diodes 261 are connected with each other in series, the breakdown of the junction diodes 261 can be prevented.

(Fourth Embodiment)

Figure 6:
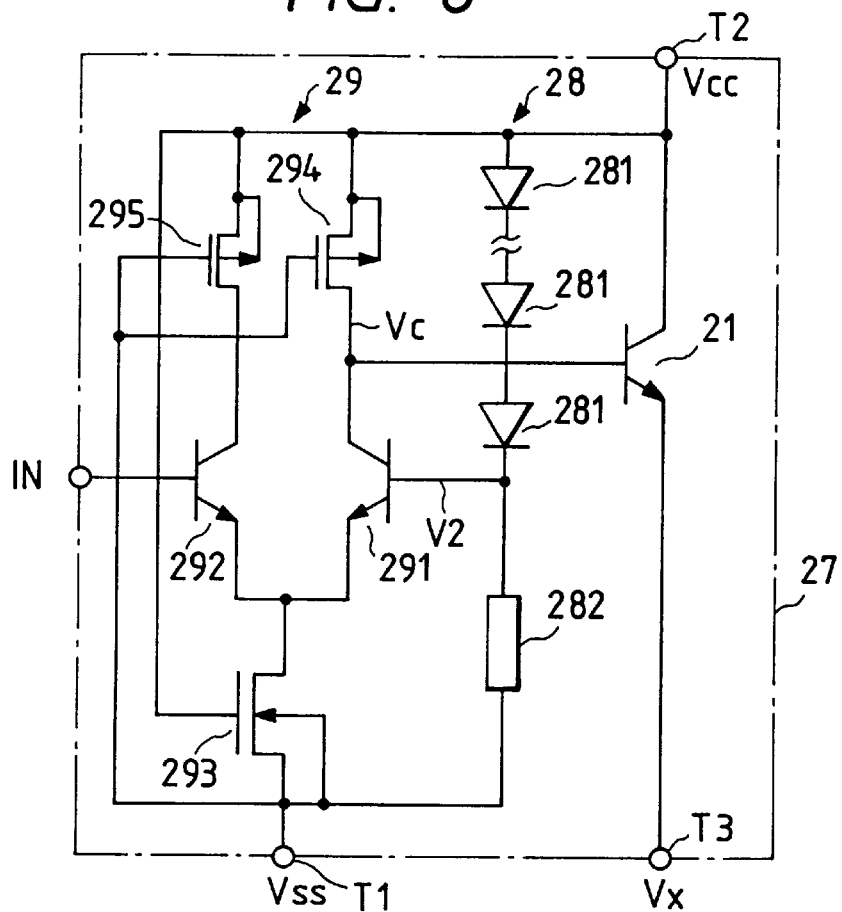
FIG. 6 is a circuit diagram showing another electric potential setting circuit according to a fourth embodiment of the present invention.

FIG. 6 is a circuit diagram of another electric potential setting circuit according to a fourth embodiment of the present invention.

As shown in FIG. 6, an electric potential setting circuit 27 connected with the n-type semiconductor substrate region 103 of the PMOS transistor Q10 comprises the n-p-n emitter follower transistor 21, a constant electric potential generating circuit 28 for generating a reference electric potential V2, and a differential amplifying circuit 29 for receiving the reference electric potential V2 of the constant electric potential generating circuit 28 and controlling an electric potential applied to the base of the n-p-n emitter follower transistor 21.

The constant electric potential generating circuit 28 comprises a series of p-n junction diodes 281 for dropping the high level electric potential Vcc applied to the high potential electric source terminal T2 to the reference electric potential V2, and a discharge resistor 282 connecting a cathode of one p-n junction diode 281 arranged on a lowest electric potential side and the low potential electric source terminal T1. An output terminal T4 between the p-n junction diodes 281 and the discharge resistor 282 is set to the reference electric potential V2. In this case, the discharge resistor 282 is not necessarily required. Also, it is applicable that a resistor element be used in place of the p-n junction diodes 281 to set the output terminal T1 to the reference electric potential V2. Also, it is applicable that a series of zener diodes be used in place of the p-n junction diodes 281.

The differential amplifying circuit 29 comprises a first n-p-n transistor 291 in which a base is connected with the output terminal T4 of the constant electric potential generating circuit 28 and a collector is connected with the base of the n-p-n emitter follower transistor 21, a second n-p-n transistor 292 in which a base is connected with the input terminal IN, a common emitter loading element 293 connected with a common line of emitters of the transistors 291 and 292 for limiting a sum of emitter currents of the transistors 291 and 292 to a prescribed value and transmitting a summed emitter current to the low potential electric source terminal T1, a first collector side resistor 294 connected with a collector of the first transistor 291 for generating a collector electric potential Vc applied to the base of the n-p-n emitter follower transistor 21 by dropping the high electric potential Vcc applied to the high potential electric source terminal T2, and a second collector side resistor 295 arranged between the high potential electric source terminal T2 and a collector of the second transistor 292. The common emitter loading element 293 is an NMOS transistor in which a p-type semiconductor region 296 placed just under a gate is connected with the low potential electric source terminal T1 and a gate is connected with the high potential electric source terminal T2. Therefore, the emitter currents of the transistors 291 and 292 are always transmitted to the low potential electric source terminal T1 through the common emitter loading element 293, and the common emitter loading element 293 functions as a constant current source.

Each of the collector side resistors 294 and 295 is a PMOS transistor in which an n-type semiconductor region 297 or 298 placed just under a gate is connected with the high potential electric source terminal T2 and a gate is connected with the low potential electric source terminal T1. In this case, it is applicable that each of the element and resistors 293, 294 and 295 be formed by a resistor element.

In the above configuration, an operation of the electric potential setting circuit 27 is described.

In cases where any positive surge pulse is not applied to the input terminal IN, the reference electric potential V2 applied to the base of the first transistor 291 is sufficiently higher than that applied to the base of the second transistor 292. In this case, a summed emitter current flowing the common emitter loading element 293 is almost equal to an emitter current of the first transistor 291. That is, the second transistor 292 is substantially turned off, the first transistor 291 is sufficiently turned on, and a value Ic of a collector current passing from the first resistor 294 having a resistance R to the low potential electric source terminal T1 through the first transistor 291 is determined by the common emitter loading element 293. Therefore, a collector electric potential Vc of the first transistor 291 is set to a value Vcc−Ic*R, the collector electric potential Vc is applied to the base of the n-p-n emitter follower transistor 21, and an emitter electric potential Vcc−Ic*R−ΔV of the n-p-n emitter follower transistor 21 is normally applied to the n-type semiconductor substrate region 103 of the PMOS transistor Q10. Here, a value ΔV denotes a forward voltage drop of the p-n junction between the emitter and the base in the n-p-n emitter follower transistor 21.

In contrast, when a positive surge pulse is applied to the input terminal IN and an electric potential of the input terminal IN exceeds the reference voltage V2, the second transistor 292 is turned on, and the first transistor 291 is substantially turned off because a constant current flowing the common emitter loading element 293 passes through the second transistor 292. Therefore, the high level electric potential Vcc is applied to the base of the n-p-n emitter follower transistor 21, and the emitter electric potential of the n-p-n emitter follower transistor 21 applied to the n-type semiconductor substrate region 103 of the PMOS transistor Q10 is set to a value Vcc−ΔV. That is, the emitter electric potential of the n-p-n emitter follower transistor 21 is increased by a value Ic*R.

Accordingly, even though an electric potential of the p-type input side semiconductor region 101 of the PMOS transistor Q10 is increased because of the positive surge pulse, because an electric potential of the n-type semiconductor substrate region 103 of the PMOS transistor Q10 is increased by a value Ic*R, a forward bias of a p-n junction between the p-type input side semiconductor region 101 and the n-type semiconductor substrate region 103 in the PMOS transistor Q10 can be prevented.

Also, because an electric potential of the n-type semiconductor substrate region 103 of the PMOS transistor Q10 is increased to prevent the forward bias of the p-n junction between the p-type input side semiconductor region 101 and the n-type semiconductor substrate region 103, a forward bias current of the p-n junction flowing from the p-type input side semiconductor region 101 to the n-type semiconductor substrate region 103 as a base current in the lateral p-n-p parasitic transistor Tpnp in which the n-type semiconductor substrate 103 functions as a base, the p-type input side semiconductor region 101 functions as an emitter and the p-type output side semiconductor region 102 functions as a collector is interrupted to turn off the lateral p-n-p parasitic transistor Tpnp. Therefore, a collector current flowing from the p-type input side semiconductor region 101 to the p-type output side semiconductor region 102 in the lateral p-n-p parasitic transistor Tpnp can be prevented. Accordingly, any adverse influence of the positive surge pulse is not exerted on the output terminal OUT.

(Fifth Embodiment)

Figure 7:
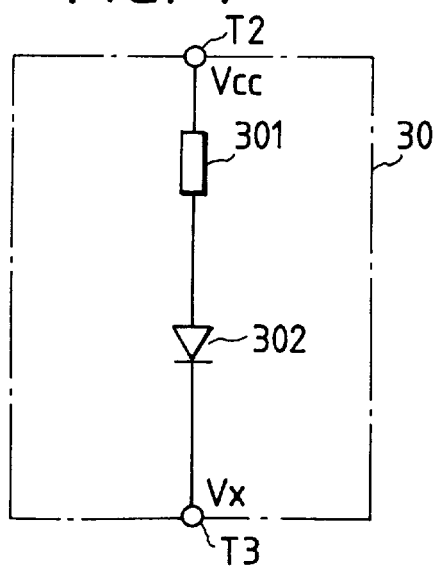
FIG. 7 is a circuit diagram showing another electric potential setting circuit according to a fifth embodiment of the present invention.

FIG. 7 is a circuit diagram of another electric potential setting circuit according to a fifth embodiment of the present invention.

As shown in FIG. 7, an electric potential setting circuit 30 comprises a resistor element 301 connected with the high potential electric source terminal T2, and a diode 302 in which an anode is connected with the resistor element 301 and a cathode is connected with the n-type semiconductor substrate region 103 of the PMOS transistor Q10.

In the above configuration, in cases where any positive surge pulse is not applied to the input terminal IN, a leakage current of the p-n junction flowing from the n-type semiconductor substrate region 103 to the p-type input side semiconductor region 101 is supplied from the electric potential setting circuit 30. In this case, the high level electric potential Vcc at the high potential electric source terminal T2 is dropped to Vcc–ΔV by the resistor element 301, and the dropped voltage Vcc–ΔV is applied to the n-type semiconductor substrate region 103. The voltage drop ΔV is equal to a product of a resistance of the resistor element 301 and the leakage current.

When a positive surge pulse is applied to the input terminal IN, an electric potential of the p-type input side semiconductor region 101 of the PMOS transistor Q10 is increased, and the n-type semiconductor substrate region 103 is increased. Therefore, the leakage current supplied to the n-type semiconductor substrate region 103 is decreased or disappeared, the voltage drop ΔV at the resistor element 301 is decreased or disappeared, and the electric potential applied to the n-type semiconductor substrate region 103 by the electric potential setting circuit 30 is increased. In addition, when an electric potential of the positive surge pulse applied to the input terminal IN is moreover increased, a base current flowing from the lateral p-n-p parasitic transistor Tpnp described in the fourth embodiment to the high potential electric source terminal T2 is stopped by the diode 302. Therefore, a collector current flowing from the p-type input side semiconductor region 101 to the p-type output side semiconductor region 102 in the lateral p-n-p parasitic transistor Tpnp can be prevented. Accordingly, any adverse influence of the positive surge pulse is not exerted on the output terminal OUT.

(Sixth Embodiment)

Figure 8:
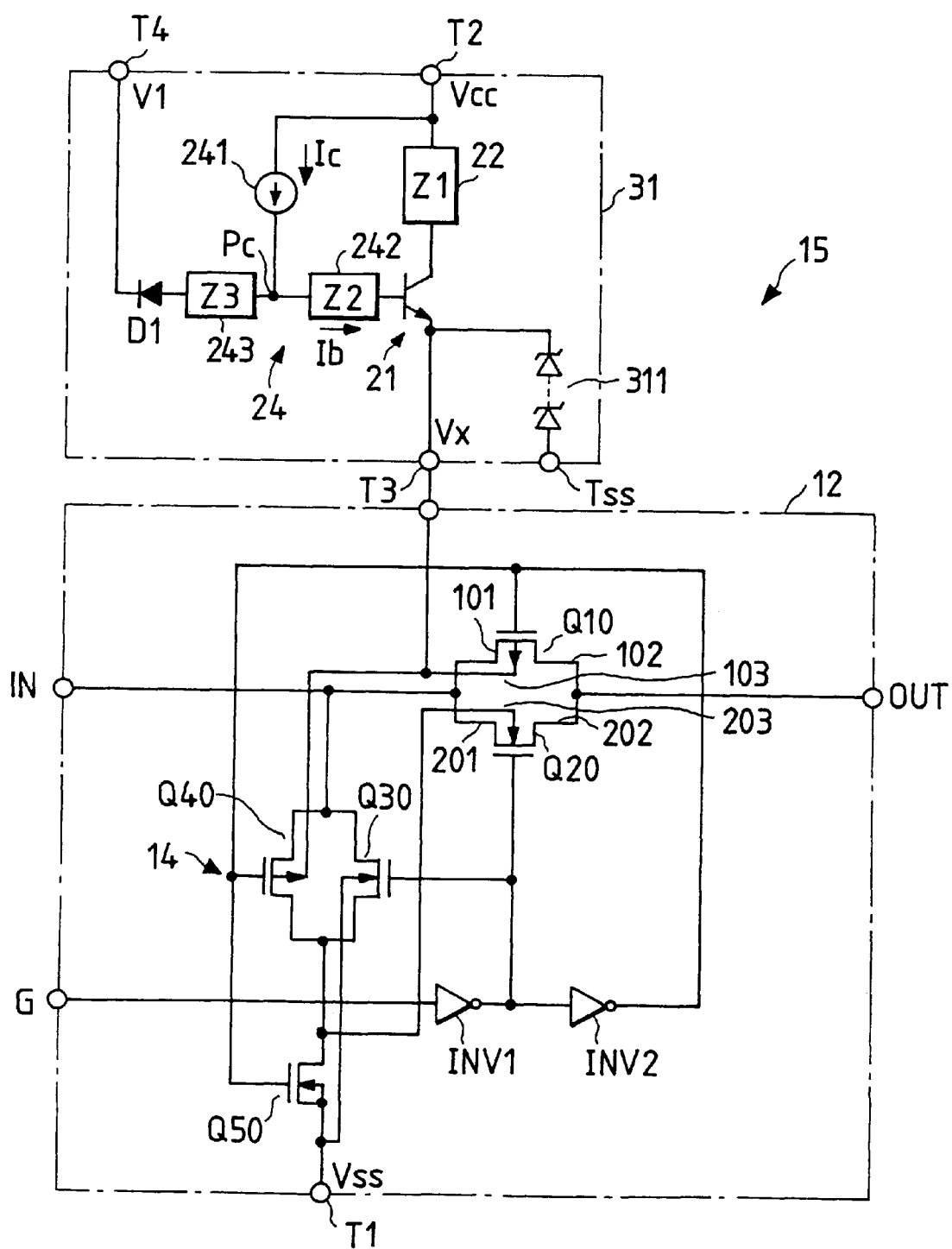
FIG. 8 is a circuit diagram showing another analog switching circuit according to a sixth embodiment of the present invention.

FIG. 8 is a circuit diagram of another analog switching circuit according to a sixth embodiment of the present invention.

As shown in FIG. 8, an analog switching circuit 15 comprises the CMOS analog switch 12 and an electric potential setting circuit 31 connected with the n-type semiconductor substrate region 103 of the PMOS transistor Q10. The electric potential setting circuit 31 comprises the n-p-n emitter follower transistor 21, the collector side resistor 22, the base current setting circuit 24, and a series of zener diodes 311 arranged between the emitter of the n-p-n emitter follower transistor 21 and a low potential electric source terminal Tss for preventing the breakdown of a p-n junction between the emitter and the base in the n-p-n emitter follower transistor 21.

In the above configuration, even though an electric potential of the n-type semiconductor substrate region 103 is increased because a positive surge pulse applied to the input terminal IN is transmitted to the region 103 through a p-n junction between the p-type input side semiconductor region 101 and the n-type semiconductor substrate region 103, the breakdown of a p-n junction between the emitter and the base in the n-p-n emitter follower transistor 21 does not occur, but the breakdown of the series of zener diodes 311 occurs. Therefore, the breakdown of the p-n junction between the emitter and the base in the n-p-n emitter follower transistor 21 can be prevented. Therefore, any base current of the lateral p-n-p parasitic transistor Tpnp does not flow to the higher potential electric source terminal T2 through the p-n junction between the emitter and the base in the n-p-n emitter follower transistor 21, and any collector current of the lateral p-n-p parasitic transistor Tpnp does not flow to the output terminal OUT when the PMOS transistor Q10 is turned off. Accordingly, any adverse influence of the positive surge pulse is not exerted on the output terminal OUT.

(Seventh Embodiment)

Figure 9:
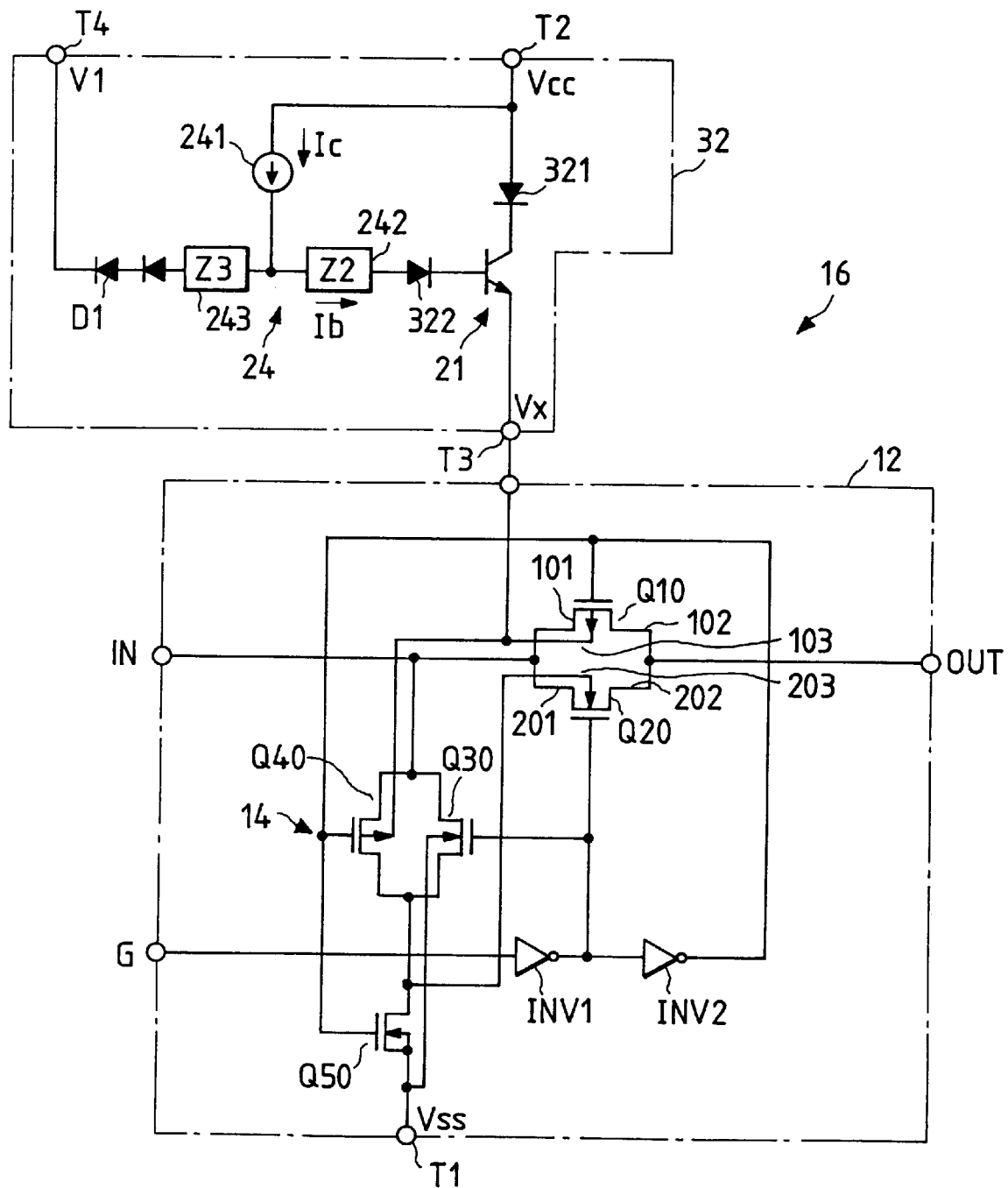
FIG. 9 is a circuit diagram showing another analog switching circuit according to a seventh embodiment of the present invention.

FIG. 9 is a circuit diagram of another analog switching circuit according to a seventh embodiment of the present invention.

As shown in FIG. 9, an analog switching circuit 16 comprises the CMOS analog switch 12 and an electric potential setting circuit 32 connected with the n-type semiconductor substrate region 103 of the PMOS transistor Q10. The electric potential setting circuit 32 comprises the n-p-n emitter follower transistor 21, a first junction diode 321 arranged between the higher potential electric source terminal T2 and the collector of the n-p-n emitter follower transistor 21 for protecting the n-p-n emitter follower transistor 21, a second junction diode 322 connected with the base of the n-p-n emitter follower transistor 21 for protecting the n-p-n emitter follower transistor 21, the first resistor 242 connected with the second junction diode 322, the second resistor 243, the diode D1, a third junction diode 323 arranged between the diode D1 and the second resistor 243 for keep balance with the second junction diode 322, and the constant current source 241.

In the above configuration, each of the junction diodes 321 and 322 has a high voltage resistance. Therefore, even though the breakdown of the p-n junction between the emitter and the base in the n-p-n emitter follower transistor 21 occurs when a very high positive surge pulse is applied to the input terminal IN, the junction diodes 321 and 322 prevent an excessive breakdown current flowing through the p-n junction between the emitter and the base in the n-p-n emitter follower transistor 21. Therefore, the p-n junction between the emitter and the base in the n-p-n emitter follower transistor 21 can be protected not to be broken.

In the first to seventh embodiments, the positive surge pulse is applied to the input terminal IN. However, even though the positive surge pulse is applied to the output terminal OUT, any adverse influence of the positive surge pulse is not exerted on the input terminal IN in the same manner. That is, even though the positive surge pulse is applied to the output terminal OUT and an electric potential of the n-type semiconductor substrate region 103 is increased, an electric potential of the base of the n-p-n emitter follower transistor 21 is increased to prevent the breakdown of the n-p-n emitter follower transistor 21 caused by the reverse bias of the p-n junction between the emitter and the base in the transistor 21, a base current of the lateral p-n-p parasitic transistor Tpnp flowing from the n-type semiconductor substrate region 103 to the n-p-n emitter follower transistor 21 is interrupted to turn off the lateral p-n-p parasitic transistor Tpnp, and a collector current flowing from the p-type output side semiconductor region 102 to the p-type input side semiconductor region 101 in the lateral p-n-p parasitic transistor Tpnp can be prevented. In this case, the base of the second n-p-n transistor 292 is connected with the output terminal OUT.

(Eighth Embodiment)

Figure 10A:
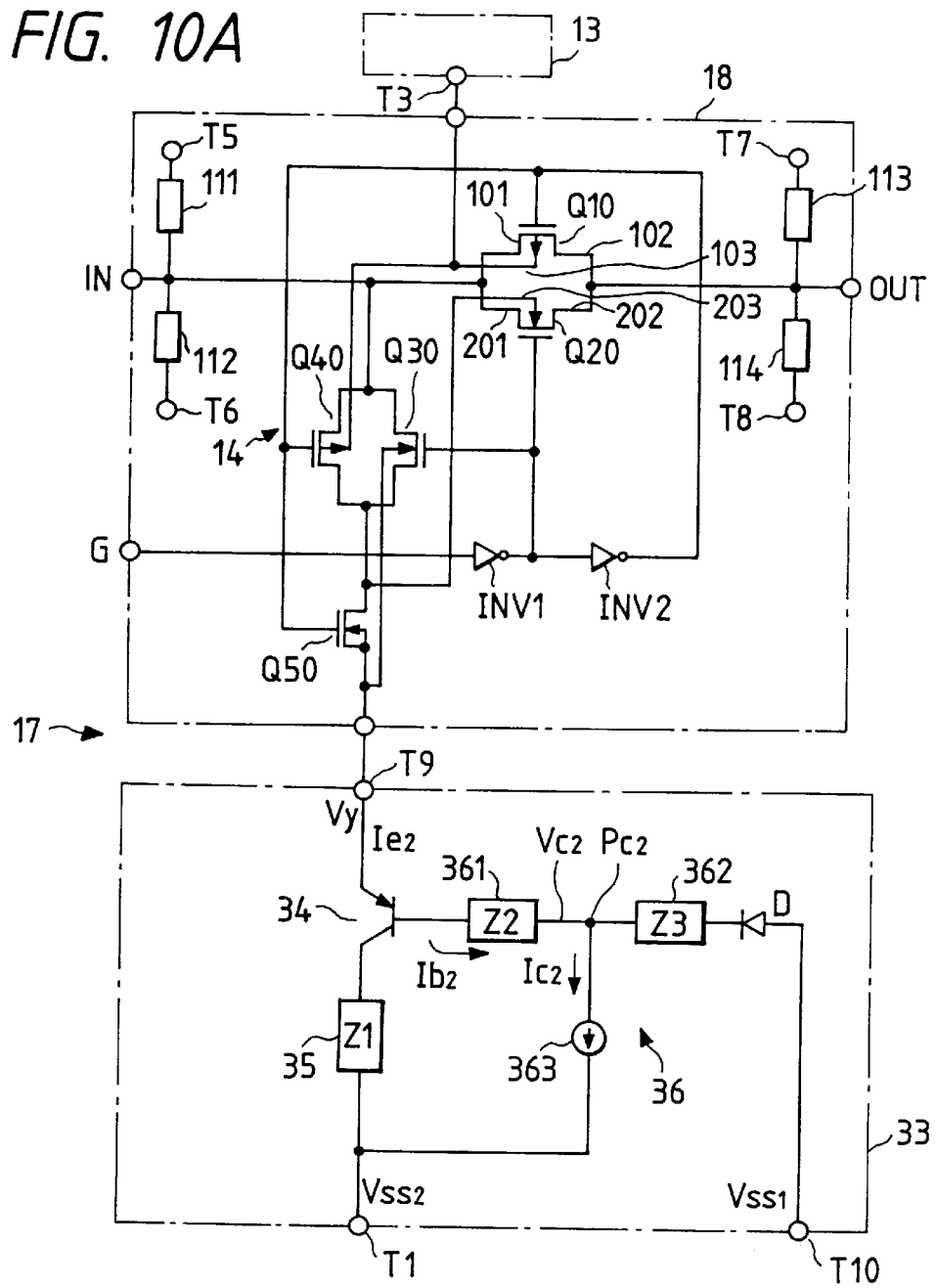
FIG. 10A is a circuit diagram showing another analog switching circuit according to an eighth embodiment of the present invention.

FIG. 10A is a circuit diagram of another analog switching circuit according to an eighth embodiment of the present invention.

As shown in FIG. 10A, an MOS analog switching circuit 17 comprises a CMOS analog switch (or a CMOS transfer gate) 18, the electric potential setting circuit 13 and a second electric potential setting circuit 33 for setting an electric potential applied to the CMOS analog switch. The second electric potential setting circuit 33 represents an electric potential setting means.

The CMOS analog switch 18 comprises the PMOS transistor Q10, the NMOS transistor Q20, the first CMOS converter INV1, the second CMOS converter INV2, the NMOS transistor electric potential setting element 14, a first impedance element 111 arranged between the input terminal IN and a high potential electric source T5 for suppressing a positive surge pulse applied to the input terminal IN, a second impedance element 112 arranged between the input terminal IN and a low potential electric source T6 for suppressing a negative surge pulse applied to the input terminal IN, a third impedance element 113 arranged between the output terminal OUT and a high potential electric source T7 for suppressing a positive surge pulse applied to the output terminal OUT, and a fourth impedance element 114 arranged between the output terminal OUT and a low potential electric source T8 for suppressing a negative surge pulse applied to the output terminal OUT.

The second electric potential setting circuit 33 comprises a p-n-p emitter follower transistor 34 of which an emitter is connected with the p-type well region 203 of the NMOS transistor Q20 through an output terminal T9 and the source-grounded NMOS transistor Q50, a collector side resistor 35 connecting a collector of the p-n-p emitter follower transistor 34 and the low potential electric source terminal T1, and a base current setting circuit 36 for setting a base current absorbed from a base of the p-n-p emitter follower transistor 34 to a constant value Ib2. The base current setting circuit 36 represents a base current setting means.

The base current setting circuit 36 comprises a third resistor 361 connected with the base of the p-n-p emitter follower transistor 34, a second diode D2 connected with a reference electric potential terminal T10, a fourth resistor 362 connecting the third resistor 361 and the second diode D2, and a constant current source 363 connected with the low potential electric source terminal T1 for passing a constant current Ic2 from a common connecting point Pc2 placed between the third and fourth resistors 361 and 362 to the terminal T1 to pass the base current Ib2 absorbed from the base of the p-n-p emitter follower transistor 34 through the third resistor 361. The constant current source 363 represents a reference current passing means for passing a reference current from the common connecting point Pc2 to the terminal T2, and the fourth resistor 362 represents a difference current absorbing means for absorbing a difference current obtained by subtracting the base current from the reference current.

An operation in the second electric potential setting circuit 33 is described.

When any negative surge pulse is not input to the input terminal IN, an emitter current Ie2 is supplied from the p-n-p emitter follower transistor 34 to the NMOS transistors Q20, Q40 and Q50 of the CMOS analog switch 18 as a leakage current at a p-n junction of each transistor. In this case, a base current Ib2 of which a value is 1/K of the emitter current Ie2 is absorbed from the base of the p-n-p emitter follower transistor 34 to the common connecting point Pc2. A value K denotes a current amplification factor in the p-n-p emitter follower transistor 34. Also, a difference current Ic2−Ib2 flows from the reference electric potential terminal T10 to the common connecting point Pc2 through the second diode D2 and the fourth resistor 362. Therefore, the base current Ib2 and the difference current Ic2−Ib2 are combined at the common connecting point Pc2 to the constant current Ic2, and the constant current Ic2 flows through the constant current source 363 to the low potential electric source terminal T1.

Next, an action of the second electric potential setting circuit 33 for a surge pulse having a steep negative voltage is described.

When a reference electric potential at the reference electric potential terminal T10 is Vss1, a resistance value of the third resistor 361 is Z2, a resistance value of the fourth resistor 362 is Z3, an output electric potential (or an emitter electric potential) of the second electric potential setting circuit 33 which is equivalent to an electric potential of the p-type well region 203 of the NMOS transistor Q20 is Vy, a forward voltage drop between the emitter and the base in the p-n-p emitter follower transistor 34 is ΔV, and the forward voltage drop ΔV is equal to another forward voltage drop in the second diode D2, a common contacting voltage Vc2 at the common contacting point Pc2 is formulated in the same manner as the derivation of the equation (7).

$$Vc2*(1+Z2/Z3)=Vy-Z2*(Ic2*Z3+\Delta V-Vss1)/Z3-\Delta V \qquad (8)$$

Therefore, when the emitter electric potential Vy is decreased because of a negative surge pulse applied to the input terminal IN, the common connecting electric potential Vc2 at the common connecting point Pc2 is decreased according to the equation (8). Also, even though a negative surge pulse is applied to the input terminal IN and the emitter electric potential Vy is decreased, because the common connecting electric potential Vc2 at the common connecting point Pc2 is decreased according to the decrease of the emitter electric potential Vy, a reverse bias of a p-n junction between the emitter and the base in the p-n-p emitter follower transistor 34 can be prevented. That is, the breakdown of the p-n-p emitter follower transistor 34 resulting from the reverse bias can be prevented.

Figure 10B:
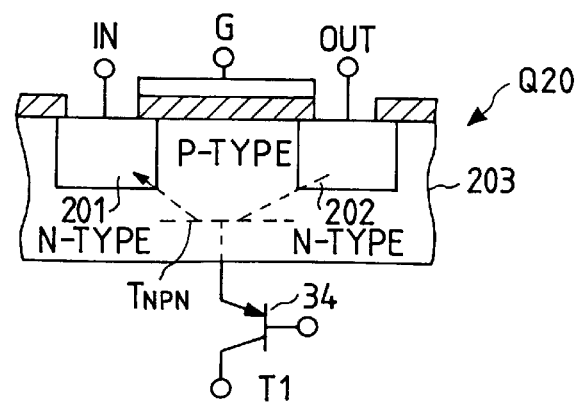
FIG. 10B is a cross-sectional view showing a PMOS transistor of a CMOS analog switch shown in FIG. 10A.

Accordingly, as shown in FIG. 10B, because a lateral n-p-n parasitic transistor Tnpn in which the p-type well region 203 of the NMOS transistor Q20 functions as a base, the n-type input side semiconductor region 201 of the NMOS transistor Q20 functions as an emitter and the n-type output side semiconductor region 202 of the NMOS transistor Q20 functions as a collector is not turned on because any base current of the lateral n-p-n parasitic transistor Tnpn does not flow from the low potential electric source terminal T1 to the p-type well region 203 through the p-n junction of the p-n-p emitter follower transistor 34, the negative surge pulse applied to the input terminal IN does not adversely influence on the output terminal OUT.

It is applicable that a base electric potential at the base of the p-n-p emitter follower transistor 34 be set to a constant value. In this case, the emitter electric potential Vy of the p-n-p emitter follower transistor 34 is decreased when a negative surge pulse is input to the input terminal IN. Therefore, there is a probability that the breakdown of the p-n junction between the emitter and the base in the p-n-p emitter follower transistor 34 occurs. Also, it is capable that a low level electric potential Vss2 of the low potential electric source terminal T1 be directly applied to the base of the p-n-p emitter follower transistor 34.

Figure 11:
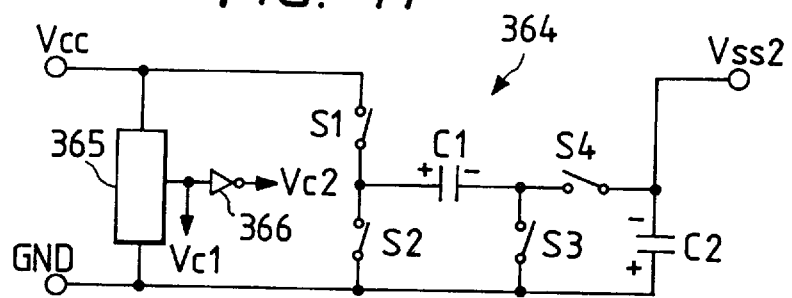
FIG. 11 is a circuit diagram showing a switched capacitor circuit used as a modification of the eighth embodiment.

Also, it is applicable that a grounded electric potential be used as the reference electric potential Vss1 at the reference electric potential terminal T10. Also, in cases where the low level electric potential Vss2 at the low potential electric source terminal T1 lower than the reference electric potential Vss1 is set to a negative value, as shown in FIG. 11, it is applicable that the reference electric potential Vss1 be prepared by a switched capacitor circuit 364. As is well known, in the switched capacitor circuit 364, a series of rectangular pulses is oscillated at a prescribed frequency in an oscillating circuit 365, a pair of switches S1 and S3 are opened or closed according to a clock electric potential Vc1 of each rectangular pulse, a pair of switches S2 and S4 are opened or closed according to a clock electric potential Vc2 obtained by inverting the clock electric potential Vc1 in an inverter 366, and the low level electric potential Vss2 is produced.

(Ninth Embodiment)

Figure 12:
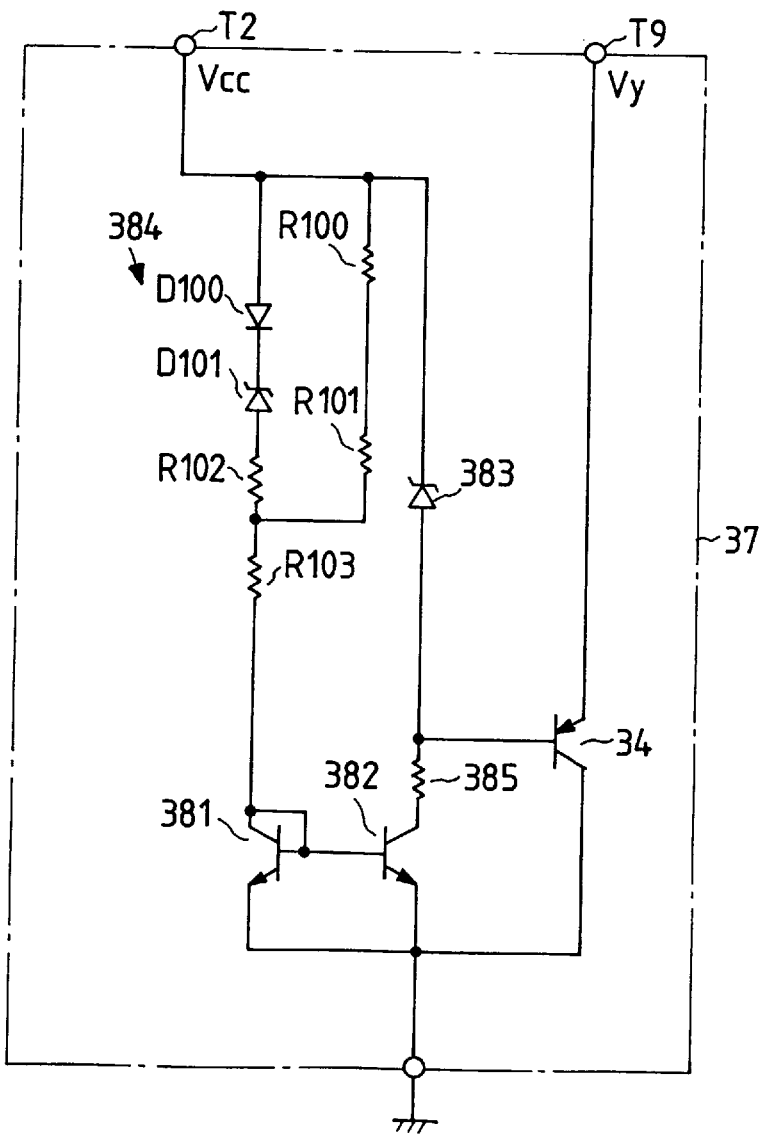
FIG. 12 is a circuit diagram showing another electric potential setting circuit according to a ninth embodiment of the present invention.

FIG. 12 is a circuit diagram of another electric potential setting circuit according to an ninth embodiment of the present invention.

As shown in FIG. 12, a second electric potential setting circuit 37 comprises the p-n-p emitter follower transistor 34 of which the emitter is connected with the p-type well region 203 of the NMOS transistor Q20 through an output terminal T9 and the source-grounded NMOS transistor Q50 and the collector is grounded, and a base electric potential maintaining circuit 38 for maintaining an electric potential applied to the base of the p-n-p emitter follower transistor 34 at a constant base electric potential.

The base electric potential maintaining circuit 38 comprises a current mirror circuit composed of a pair of transistors 381 and 382, a zener diode 383 arranged between the high potential electric source terminal T2 and the base of the p-n-p emitter follower transistor 34, a loading element 384 arranged between the high potential electric source terminal T2 and the transistor 381, and a resistor element 385 arranged between the base of the p-n-p emitter follower transistor 34 and the transistor 382. The loading element 384 comprises a diode D100, a zener diode D101, a resistor R102, a resistor R100, a resistor R101 and a resistor R103. Therefore, a base current of the p-n-p emitter follower transistor 34 is supplied from the high potential electric source terminal T2. In this case, because a constant base electric potential higher than a grounded electric potential can be applied to the base of the p-n-p emitter follower transistor 34, the collector of the p-n-p emitter follower transistor 34 can be grounded.

In the above configuration, even though a negative surge pulse is applied to the input terminal IN and an electric potential of the p-type well region 203 of the NMOS transistor Q20 is lowered because of a forward bias of a p-n junction between the n-type input side semiconductor region 201 and the p-type well region 203, because an electric potential applied to the base of the p-n-p emitter follower transistor 34 is maintained at a constant base electric potential by the base electric potential maintaining circuit 38 to turn off the p-n-p emitter follower transistor 34, an emitter current of the p-n-p emitter follower transistor 34 is stopped. Therefore, any forward bias current from the p-type well region 203 to the n-type input side semiconductor region 201 does not flow, the lateral n-p-n parasitic transistor Tnpn described in the eighth embodiment is turned off, and any collector current of the lateral n-p-n parasitic transistor Tnpn from the n-type output side semiconductor region 202 to the n-type input side semiconductor region 201 does not flow, and the negative surge pulse applied to the input terminal IN does not adversely influence on the output terminal OUT.

In this embodiment, a base current of the p-n-p emitter follower transistor 34 is supplied from the high potential electric source terminal T2. However, it is applicable that a base current of the p-n-p emitter follower transistor 34 be supplied from another high potential electric source terminal.

(Tenth Embodiment)

Figure 13:
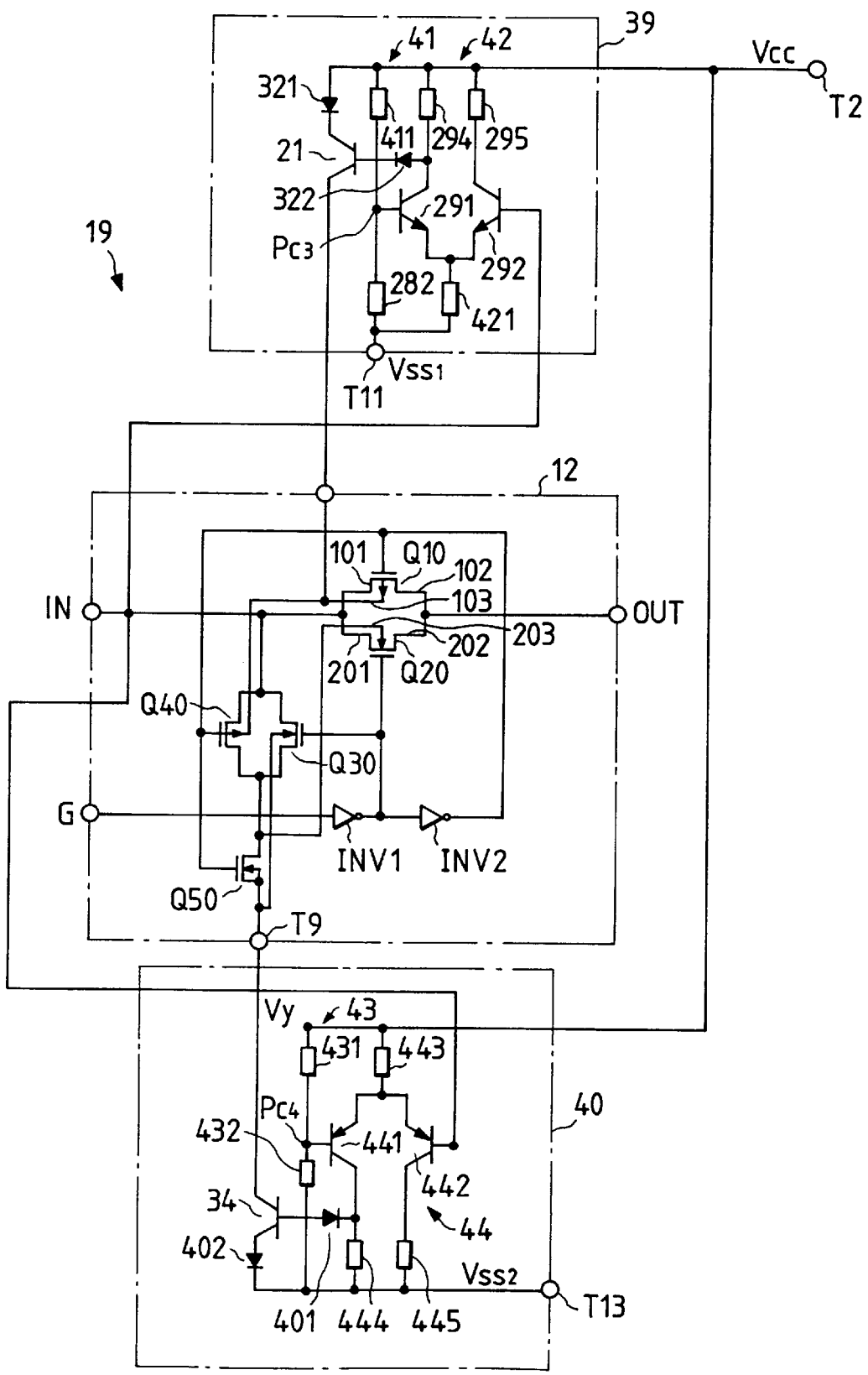
FIG. 13 is a circuit diagram showing another analog switching circuit according to a tenth embodiment of the present invention.

FIG. 13 is a circuit diagram of another analog switching circuit according to a tenth embodiment of the present invention.

As shown in FIG. 13, an MOS analog switching circuit 19 comprises the CMOS analog switch (or a CMOS transfer gate) 12, a first electric potential setting circuit 39 for setting an electric potential applied to the n-type semiconductor substrate regions of the PMOS transistors Q10 and Q30, and a second electric potential setting circuit 40 for setting an electric potential applied to the p-type well regions of the NMOS transistors Q20, Q40 and Q50. Each of the electric potential setting circuits 39 and 40 represents an electric potential setting means.

The first electric potential setting circuit 39 comprises the n-p-n emitter follower transistor 21, the junction diodes 321 and 322, a constant electric potential generating circuit 41 for generating a reference electric potential V2, and a differential amplifying circuit 42 for receiving the reference electric potential V2 of the constant electric potential generating circuit 41 and controlling an electric potential applied to the base of the n-p-n emitter follower transistor 21 through the junction diode 322.

The constant electric potential generating circuit 41 comprises a resistor element 411 for dropping the high level electric potential Vcc applied to the high potential electric source terminal T2 to the reference electric potential V2, and the discharge resistor 282 arranged between the resistor element 411 and a low potential electric source terminal T11. An output point Pc3 between the resistor element 411 and the discharge resistor 282 is set to the reference electric potential V2.

The differential amplifying circuit 42 comprises the first n-p-n transistor 291 in which the base is connected with the output point Pc3 of the constant electric potential generating circuit 41 and the collector is connected with the base of the n-p-n emitter follower transistor 21 through the junction diode 322, the second n-p-n transistor 292, a common emitter loading element 421 connected with a common line of emitters of the transistors 291 and 292 for transmitting an emitter current of the transistor 291 or 292 to the low potential electric source terminal T11, the first collector side resistor 294, and the second collector side resistor 295.

The common emitter loading element 421 is a resistor element. Therefore, an emitter current of the transistor 291 or 292 is always transmitted to the low potential electric source terminal T11 through the common emitter loading element 421, and the common emitter loading element 421 functions as a constant current source.

Therefore, even though a positive surge pulse is applied to the input terminal IN, a forward bias of a p-n junction between the p-type input side semiconductor region 101 and the n-type semiconductor substrate region 103 in the PMOS transistor Q10 can be prevented, and any adverse influence of the positive surge pulse is not exerted on the output terminal OUT in the same manner as in the fourth embodiment.

The second electric potential setting circuit 40 comprises the p-n-p emitter follower transistor 34, a pair of junction diodes 401 and 402 connected with the base and the collector of the p-n-p emitter follower transistor 34 for protecting the transistor 34, a constant electric potential generating circuit 43 for generating a reference electric potential V3, and a differential amplifying circuit 44 for receiving the reference electric potential V3 of the constant electric potential generating circuit 43 and controlling an electric potential of the base of the p-n-p emitter follower transistor 34 through the junction diode 401.

The constant electric potential generating circuit 43 comprises a resistor element 431 for dropping the high level electric potential Vcc applied to the high potential electric source terminal T2 to the reference electric potential V3, and a discharge resistor 432 arranged between the resistor element 431 and a low potential electric source terminal T13. An output point Pc4 between the resistor element 431 and the discharge resistor 432 is set to the reference electric potential V3.

The differential amplifying circuit 44 comprises a first p-n-p transistor 441 in which a base is connected with the output point Pc4 of the constant electric potential generating circuit 43 and a collector is connected with the base of the p-n-p emitter follower transistor 34 through the junction diode 401, a second p-n-p transistor 442 in which a base is connected with the input terminal IN, a common emitter loading element 443 connected with a common line of emitters of the transistors 441 and 442 for transmitting an emitter current supplied from the high potential electric source terminal T2 to the emitters of the transistor 441 or 442, a first collector side resistor 444 arranged between a collector of the transistor 441 and the low potential electric source terminal T13, and a second collector side resistor 445 arranged between a collector of the transistor 442 and the low potential electric source terminal T13.

In the above configuration, an operation of the second electric potential setting circuit 40 is described.

In cases where any negative surge pulse is not applied to the input terminal IN, the reference electric potential V3 applied to the base of the first transistor 441 is sufficiently lower than that applied to the base of the second transistor 442. Therefore, the second transistor 442 is substantially turned off, and the first transistor 441 is turned on. In this case, a value Ic of a collector current passing from the first resistor 444 having a resistance R to the low potential electric source terminal T13 through the first transistor 441 is determined by the common emitter loading element 293, and a base electric potential Vb of the first transistor 441 is set to a value Vss2+Ic*R+ΔV. Here a value Vss2 is an electric potential at the low potential electric source terminal T13, a value Ic*R is a voltage drop in the first resistor 444 and a value ΔV is a forward voltage drop in the junction diode 401.

In contrast, when a negative surge pulse is applied to the input terminal IN and an electric potential of the input terminal IN is sufficiently lower than the reference voltage V3, the second transistor 442 is turned on, and the first transistor 441 is substantially turned off because a constant current flowing the common emitter loading element 443 passes through the second transistor 442. Therefore, another base electric potential Vss2+Ic*R is applied to the base of the p-n-p emitter follower transistor 34. That is, when the negative surge pulse is applied to the input terminal IN, an electric potential of the base of the p-n-p emitter follower transistor 34 is lowered by the value Ic*R equal to the voltage drop in the first resistor 444.

Accordingly, even though an electric potential of the n-type input side semiconductor region 201 of the NMOS transistor Q20 is decreased because of the negative surge pulse, because an electric potential of the p-type well region 203 of the NMOS transistor Q20 is decreased, a forward bias of a p-n junction between the n-type input side semiconductor region 201 and the p-type well region 203 in the NMOS transistor Q20 can be prevented.

Also, because an electric potential of the p-type well region 203 of the NMOS transistor Q20 is decreased to prevent the forward bias of the p-n junction between the n-type input side semiconductor region 201 and the p-type well region 203, a forward bias current of the p-n junction flowing from the p-type well region 203 to the n-type input side semiconductor region 201 as a base current in the lateral n-p-n parasitic transistor Tnpn in which the p-type well region 203 functions as a base, the n-type input side semiconductor region 201 functions as an emitter and the n-type output side semiconductor region 202 functions as a collector is interrupted to turn off the lateral n-p-n parasitic transistor Tnpn. Therefore, a collector current flowing from the n-type output side semiconductor region 202 to the n-type input side semiconductor region 201 in the lateral n-p-n parasitic transistor Tnpn can be prevented. Accordingly, any adverse influence of the negative surge pulse is not exerted on the output terminal OUT.

In the eighth to tenth embodiments, the negative surge pulse is applied to the input terminal IN. However, even though the negative surge pulse is applied to the output terminal OUT, any adverse influence of the negative surge pulse is not exerted on the input terminal IN in the same manner. That is, even though the negative surge pulse is applied to the output terminal OUT and an electric potential of the p-type well region 203 is decreased, an electric potential of the base of the p-n-p emitter follower transistor 34 is lowered to prevent the breakdown of the p-n-p emitter follower transistor 34 caused by the reverse bias of the p-n junction between the emitter and the base in the transistor 34, a base current in the lateral n-p-n parasitic transistor Tnpn flowing from the p-n-p emitter follower transistor 34 to the p-type well region 203 is interrupted to turn off the lateral n-p-n parasitic transistor Tnpn, and a collector current flowing from the n-type input side semiconductor region 201 to the n-type output side semiconductor region 202 in the lateral n-p-n parasitic transistor Tnpn can be prevented. In this case, the base of the second p-n-p transistor 442 is connected with the output terminal OUT.

(Eleventh Embodiment)

Figure 14:
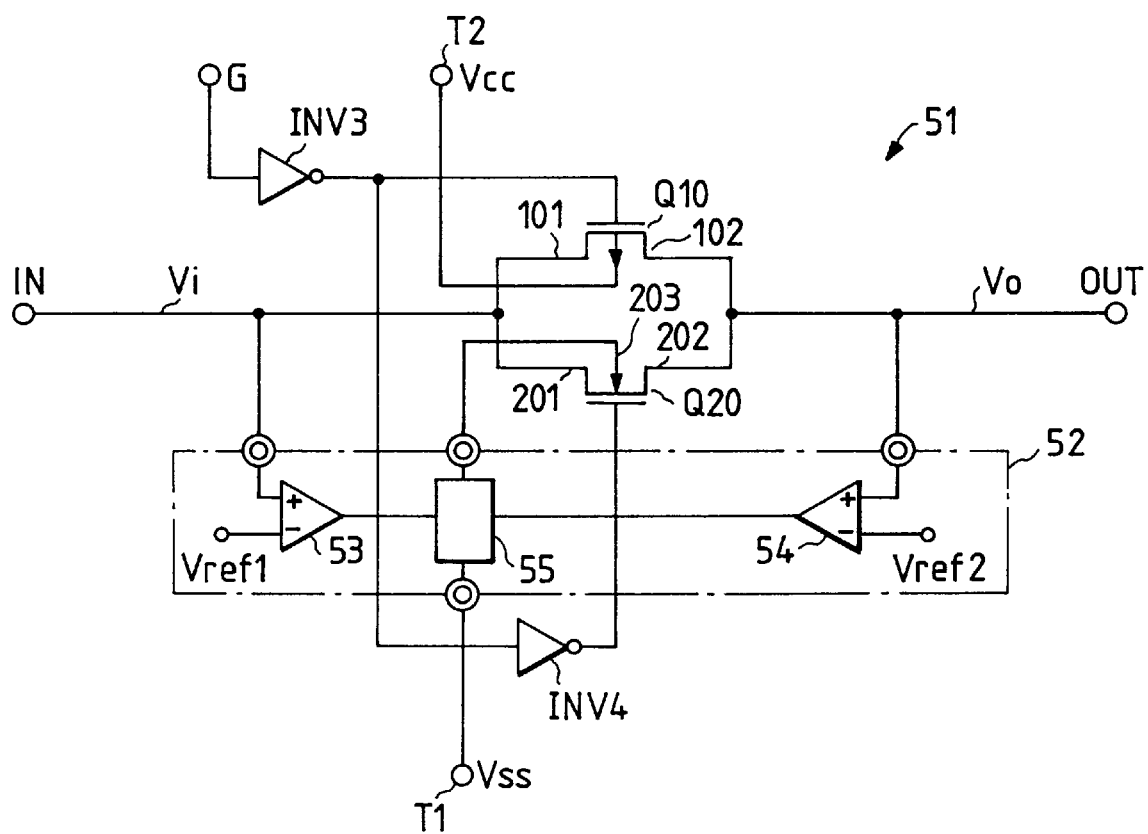
FIG. 14 is a circuit diagram showing another analog switching circuit according to an eleventh embodiment of the present invention.

FIG. 14 is a circuit diagram of another analog switching circuit according to an eleventh embodiment of the present invention.

As shown in FIG. 14, an MOS analog switching circuit 51 comprises a CMOS analog switch composed of the PMOS transistor Q10 and the NMOS transistor Q20, a first CMOS inverter INV3 for converting an electric potential of a control signal applied to the control input terminal G to apply the converted electric potential to the gate of the PMOS transistor Q10, and a second CMOS inverter INV4 for again converting the electric potential of the control signal converted by the first CMOS converter INV3 to apply the electric potential converted by the second CMOS inverter INV4 to the gate of the NMOS transistor Q20, and an electric potential setting circuit 52 for setting an electric potential of the p-type well region 203 of the NMOS transistor Q20.

The electric potential setting circuit 52 comprises a first surge pulse detecting comparator 53 for comparing an input electric potential Vi of an input signal applied to the input terminal IN with a first reference electric potential Vref1 to detect a negative surge pulse included in the input signal, outputting a high level signal indicating no detection of any negative surge in cases where the input electric potential Vi is equal to or higher than the first reference electric potential Vref1 and outputting a low level signal indicating the detection of the negative surge pulse in cases where the input electric potential Vi is lower than the first reference electric potential Vref1, a second surge pulse detecting comparator 54 for comparing an output electric potential Vo of an output signal output from the output terminal OUT with a second reference electric potential Vref2 to detect a negative surge pulse included in the output signal, outputting a high level signal indicating no detection of any negative surge in cases where the output electric potential Vo is equal to or higher than the second reference electric potential Vref2 and outputting a low level signal indicating the detection of the negative surge pulse in cases where the output electric potential Vo is lower than the second reference electric potential Vref2, and a well potential controlling unit 55 connected with the p-type well region 203 and the low potential electric source terminal T1 for controlling an electric potential of the p-type well region 203 of the NMOS transistor Q20 to set the electric potential of the p-type well region 203 at a particular electric potential Vp by connecting the p-type well region 203 with the low potential electric source terminal T1 in cases where the high level signals are received from the first and second surge pulse detecting comparators 53 and 54 and set the electric potential of the p-type well region 203 at a floating potential to prevent a current flow from the low potential electric source terminal T1 to the p-type well region 203 in cases where a low level signal is received from the first surge pulse detecting comparator 53 or the second surge pulse detecting comparator 54.

A first p-n junction between the n-type input side semiconductor region 201 and the p-type well region 203 is substantially set to an "on" condition when a forward voltage of the first p-n junction is equal to or higher than 0.6 V. Therefore, the first reference electric potential Vref1 is set to a value higher than an electric potential Vp−0.6 V. In this case, when the input electric potential Vi is decreased because of a negative surge pulse, the electric potential of the p-type well region 203 is set at a floating potential before the first p-n junction is set to the "on" condition. Therefore, a current flow from the low potential electric source terminal T1 to the p-type well region 203 is prevented. In the same manner, a second p-n junction between the n-type output side semiconductor region 202 and the p-type well region 203 is substantially set to an "on" condition when a forward voltage of the second p-n junction is equal to or higher than 0.6 V. Therefore, the second reference electric potential Vref2 is set to a value higher than an electric potential Vp−0.6 V. In this case, when the output electric potential Vo is decreased because of a negative surge pulse, the electric potential of the p-type well region 203 is set at a floating potential before the second p-n junction is set to the "on" condition.

In the above configuration, the input electric potential Vi of the input signal applied to the input terminal IN is compared with the first reference electric potential Vref1 by the first surge pulse detecting comparator 53, and the output electric potential Vo of the output signal applied to the output terminal OUT is compared with the second reference electric potential Vref2 by the second surge pulse detecting comparator 54. In cases where any negative surge pulse is not included in the input signal or the output signal, the input electric potential Vi of the input signal is equal to or higher than the first reference electric potential Vref1, and the output electric potential Vo of the output signal is equal to or higher than the second reference electric potential Vref2. Therefore, a high level signal is output from each of the surge pulse detecting comparators 53 and 54 to the well potential controlling unit 55, the electric potential of the p-type well region 203 of the NMOS transistor Q20 is set to the particular electric potential Vp by the well potential controlling unit 55 connected with the low potential electric source terminal T1 of the grounded electric potential Vss. Thereafter, when an electric potential of a control signal applied to the control input terminal G is set to a high level, the transistors Q10 and Q20 are turned on, and the CMOS analog switch is operated. That is, in cases where a signal is transmitted from the input terminal IN to the output terminal OUT, the first p-n junction between the n-type input side semiconductor region 201 and the p-type well region 203 is reversely biased. Also, in cases where a signal is transmitted from the output terminal OUT to the input terminal IN, the second p-n junction between the n-type output side semiconductor region 202 and the p-type well region 203 is reversely biased.

In contrast, when a negative surge pulse is included in the input signal and the input electric potential Vi of the input signal becomes lower than the first reference electric potential Vref1, a low level signal is output from the first surge pulse detecting comparator 53 to the well potential controlling unit 55. In this case, the electric potential of the n-type input side semiconductor region 201 is decreased in a direction that the first p-n junction is forward-biased. Also, when a negative surge pulse is included in the output signal, the output electric potential Vo of the output signal becomes lower than the second reference electric potential Vref2, and a low level signal is output from the second surge pulse detecting comparator 54 to the well potential controlling unit 55. In this case, the electric potential of the n-type input side semiconductor region 202 is decreased in a direction that the second p-n junction is forward-biased.

Thereafter, the well potential controlling unit 55 is operated according to a first logical function or a second logical function.

In the first logical function, when a low level signal is input from the surge pulse detecting comparator 53 or 54 to the well potential controlling unit 55, the connection between the low potential electric source terminal T1 and the p-type well region 203 of the NMOS transistor Q20 is cut off, and an electric potential of the p-type well region 203 is set to a floating potential. Therefore, when an electric potential of the n-type semiconductor region 201 or 202 is decreased because of the negative surge pulse applied to the input or output terminal IN or OUT, because the electric potential of the p-type well region 203 is set to a floating potential, a current flow from the low potential electric source terminal T1 to the p-type well region 203 is prevented. That is, a base current in the lateral n-p-n parasitic transistor Tnpn in which the p-type well region 203 functions as a base, the n-type input side semiconductor region 201 functions as an emitter (or a collector) and the n-type output side semiconductor region 202 functions as a collector (or an emitter) is interrupted to turn off the lateral n-p-n parasitic transistor Tnpn. Thereafter, the electric potential of the p-type well region 203 is gradually decreased according to various capacitances of capacitors relating to the p-type well region 203 by injecting electrons from the n-type semiconductor region 201 or 202 to the p-type well region 203 and injecting positive holes from the p-type well region 203 to the n-type semiconductor region 201 or 202.

Therefore, a forward bias of the p-n junction between the electric potential of the p-type well region 203 and the n-type semiconductor region 201 or 202 is delayed by a delaying time corresponding to a decrease degree of the electric potential of the p-type well region 203. Also, because the electric potential of the p-type well region 203 is moreover decreased because of the recombination of the electrons and remaining positive holes in the p-type well region 203 and the output of the positive holes, even though the p-n junction is set to a forward bias condition, the forward bias of the p-n junction soon disappears. Therefore, a forward bias current of the p-n junction flowing from the p-type well region 203 to the n-type semiconductor region 201 or 202 is reduced, a surge current between the n-type semiconductor regions 201 and 202 is suppressed, and the adverse influence of the negative surge pulse applied to the input terminal IN (or the output terminal OUT) on the output terminal OUT (or the input terminal IN) is suppressed.

In the second logical function, when a low level signal is input from one of the surge pulse detecting comparators 53 and 54 to the well potential controlling unit 55, the electric potential of the p-type well region 203 is changed under the control of the well potential controlling unit 55 to decrease a potential difference between the n-type semiconductor region 201 or 202 and the p-type well region 203. Therefore, even though an electric potential of the n-type semiconductor region 201 or 202 is decreased because of the negative surge pulse applied to the input or output terminal IN or OUT, a forward bias of the p-n junction between the electric potential of the p-type well region 203 and the n-type semiconductor region 201 or 202 can be perfectly prevented, a surge current between the n-type semiconductor regions 201 and 202 can be perfectly suppressed, and the adverse influence of the negative surge pulse applied to the input terminal IN (or the output terminal OUT) on the output terminal OUT (or the input terminal IN) can be perfectly suppressed.

(Twelfth Embodiment)

A constitutional example of the first and second surge pulse detecting comparators 53 and 54 and the well potential controlling unit 55 is described with reference to FIG. 15.

Figure 15:
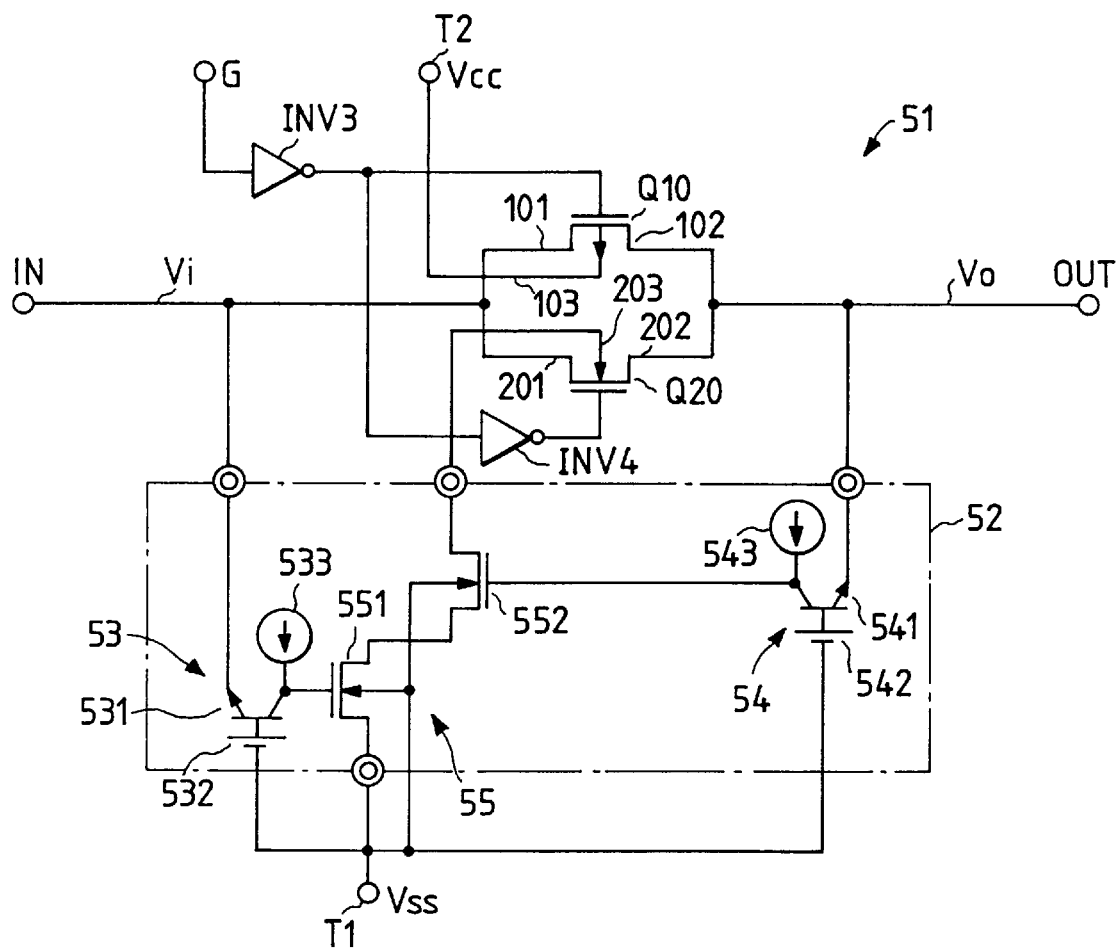
FIG. 15 is a constitutional example of the analog switching circuit 51 shown in FIG. 14 according to a twelfth embodiment of the present invention.

FIG. 15 shows a constitutional example of the analog switching circuit 51 shown in FIG. 14 according to a twelfth embodiment of the present invention.

As shown in FIG. 15, the first surge pulse detecting comparator 53 comprises an n-p-n transistor 531 in which an emitter is connected with the input terminal IN, a bias voltage source 532 arranged between a base of the n-p-n transistor 531 and the low potential electric source terminal T1 for applying an electric potential to the base of the n-p-n transistor 531 to turn on the n-p-n transistor 531 when the input electric potential Vi is lower than the first reference electric potential Vref1, and a constant current source 533 connected with a collector of the n-p-n transistor 531.

The bias voltage source 532 is composed of a series of resistor elements, and a divided electric potential at an output terminal placed in the middle of the resistor elements is applied to the base of the n-p-n transistor 531. Also, it is applicable that the bias voltage source 532 be composed of a zener diode.

The n-p-n transistor 531 is a common base transistor, and the constant current source 533 functions as a loading element for the n-p-n transistor 531. Therefore, it is applicable that the constant current source 533 be composed of a normal resistor element. For example, because a configuration of a binary CMOS integrated circuit is adopted in this embodiment, it is preferred that the constant current source 533 be composed of a PMOS transistor in which the grounded electric potential Vss of the low potential electric source terminal T1 is applied to a gate. Also, it is preferred that the constant current source 533 be composed of a p-n-p bipolar transistor. The electric potential applied to the base of the n-p-n transistor 531 by the bias voltage source 532 is higher than the electric potential Vss of the low potential electric source terminal T1 by a prescribed bias voltage.

The second surge pulse detecting comparator 54 comprises an n-p-n transistor 541 in which an emitter is connected with the output terminal OUT, a bias voltage source 542 arranged between a base of the n-p-n transistor 541 and the low potential electric source terminal T1 for applying an electric potential to the base of the n-p-n transistor 541 to turn on the n-p-n transistor 541 when the output electric potential Vo is lower than the second reference electric potential Vref2, and a constant current source 543 connected with a collector of the n-p-n transistor 541. The n-p-n transistor 541 functions in the same manner as the n-p-n transistor 531. The bias voltage source 542 is formed in the same manner as the bias voltage source 532. The constant current source 543 is formed in the same manner as the constant current source 533.

The well potential controlling unit 55 comprises a first NMOS transistor 551 in which a gate is connected with the collector of the n-p-n transistor 532 and a drain is connected with the low potential electric source terminal T1, and a second NMOS transistor 552 in which a gate is connected with the collector of the n-p-n transistor 542, a drain is connected with a source of the first NMOS transistor 551 and a source is connected with the p-type well region 203.

In the above configuration of the analog switching circuit 51, the first and second reference voltages Vref1 and Vref2 are equal to a reference electric potential Vref, the electric potential applied to the base of the n-p-n transistor 531 (or 541) by the bias voltage source 532 (or 542) is Vref+Vbe. Here, a value Vbe is a forward bias voltage (or an on-voltage) between the base and the emitter in the n-p-n transistor 531 (or 541). For example, the forward bias voltage Vbe is 0.65 V.

In cases where any negative surge pulse is not applied to the input terminal IN, the input electric potential Vi is higher than the reference voltages Vref, the n-p-n transistor 531 is turned off, the high level electric potential Vcc at the high potential electric source terminal T2 is applied to the gate of the first NMOS transistor 551 through the constant current source 533, and the first NMOS transistor 551 is turned on. In the same manner, in cases where any negative surge pulse is not applied to the output terminal OUT, the output electric potential Vo is higher than the reference voltages Vref, the n-p-n transistor 541 is turned off, the high level electric potential Vcc at the high potential electric source terminal T2 is applied to the gate of the second NMOS transistor 552 through the constant current source 543, and the second NMOS transistor 552 is turned on. Therefore, the particular electric potential Vp of the p-type well region 203 is set by the NMOS transistors 551 and 552 connected with the low potential electric source terminal T1 of the grounded electric potential Vss.

When a negative surge pulse is applied to the input terminal IN and the input electric potential Vi becomes lower than the reference voltages Vref, the n-p-n transistor 531 is turned on, a current supplied from the constant current source 533 passes through the n-p-n transistor 531 to decrease an electric potential applied to the gate of the first NMOS transistor 551, and the first NMOS transistor 551 is turned off. Therefore, the connection between the p-type well region 203 and the low potential electric source terminal T1 is cut off, and the p-type well region 203 is set to a floating potential. Also, when a negative surge pulse is applied to the output terminal OUT and the output electric potential Vo becomes lower than the reference voltages Vref, the n-p-n transistor 541 is turned on, a current supplied from the constant current source 543 passes through the n-p-n transistor 541 to decrease an electric potential applied to the gate of the second NMOS transistor 552, and the second NMOS transistor 552 is turned off. Therefore, the connection between the p-type well region 203 and the low potential electric source terminal T1 is cut off, and the p-type well region 203 is set to a floating potential.

Accordingly, because a base current in the lateral n-p-n parasitic transistor Tnpn is prevented to turn off the lateral n-p-n parasitic transistor Tnpn and the electric potential of the p-type well region 203 is decreased according to the first logical function, a surge current between the n-type semiconductor regions 201 and 202 is suppressed, and the adverse influence of the negative surge pulse applied to the input terminal IN (or the output terminal OUT) on the output terminal OUT (or the input terminal IN) can be suppressed.

In this embodiment, the second surge pulse detecting comparator 54 and the second NMOS transistor 552 are arranged in the analog switching circuit 51 to suppress the adverse influence of the negative surge pulse applied to the output terminal OUT. However, it is applicable that the electric potential setting circuit 52 be composed of the first surge pulse detecting comparator 53 and the first NMOS transistor 551 to suppress only the adverse influence of the negative surge pulse applied to the input terminal IN.

(Thirteenth Embodiment)

Figure 16A:
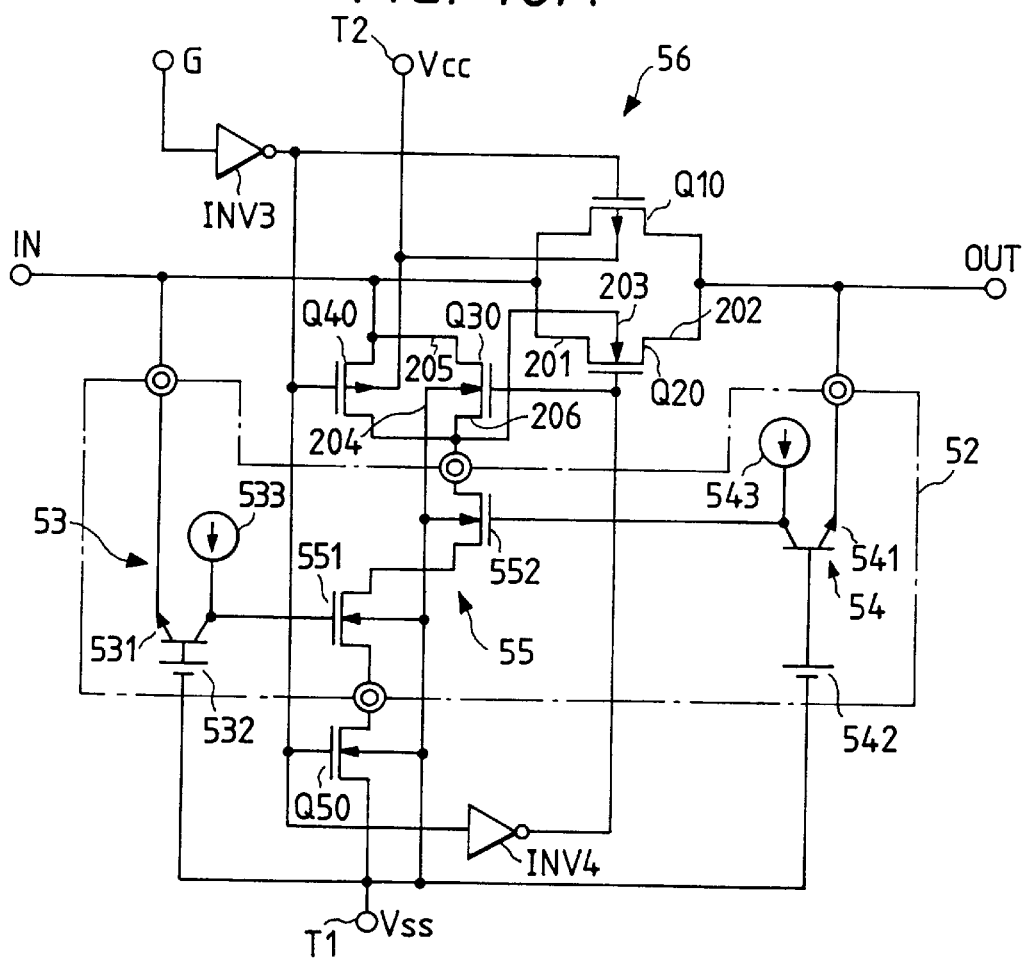
FIG. 16A is a circuit diagram showing another analog switching circuit according to a thirteenth embodiment of the present invention.

FIG. 16A is a circuit diagram of another analog switching circuit according to a thirteenth embodiment of the present invention.

As shown in FIG. 16A, an MOS analog switching circuit 56 comprises the CMOS analog switch composed of the PMOS transistor Q10 and the NMOS transistor Q20, the first CMOS inverter INV3, the second CMOS inverter INV4, the electric potential setting circuit 52 for setting an electric potential of the p-type well region 203 of the NMOS transistor Q20, the pair of NMOS transistor Q30 and PMOS transistor Q40, and the source-grounded NMOS transistor Q50 arranged between the first NMOS transistor 551 and the low potential electric source terminal T1. One main electrode of the second NMOS transistor 552 is connected with the input terminal IN through the CMOS transfer gate composed of the pair of NMOS transistor Q30 and PMOS transistor Q40, and one main electrode of the first NMOS transistor 551 is connected with the low potential electric source terminal T1 through the source-grounded NMOS transistor Q50.

In the above configuration, an operation of the MOS analog switching circuit 56 is described.

In cases where any negative surge pulse is not applied to the input terminal IN or the output terminal OUT, the first and second NMOS transistors 551 and 552 are turned on. Also, in cases where any control signal is not input to the control input terminal G, an electric potential at the control input terminal G is set to a low level, the transistor Q50 is turned on, and the transistors Q30 and Q40 are turned off. Therefore, an electric potential of the p-type well region 203 is set to the particular electric potential Vp.

In contrast, in cases where a control signal is input to the control input terminal G, an electric potential at the control input terminal G is set to a high level, the transistor Q50 is turned off, and the transistors Q30 and Q40 are turned on. Because a CMOS analog switch (or a transfer gate) is formed by the transistors Q30 and Q40, a channel conductance of each of the transistors Q30 and Q40 is maintained to a high value regardless of the change of the electric potential Vi applied to the input terminal IN. As a result, because the electric potential Vi at the input terminal IN is applied to the p-type well region 203 in the NMOS transistor Q20 through the transistors Q30 and Q40, an electric potential of the p-type well region 203 in the NMOS transistor Q20 changes with the electric potential Vi. That is, the electric potential of the p-type well region 203 is equal to that of the n-type input side semiconductor region 201. Therefore, a channel conductance demodulating effect of the NMOS transistor Q20 caused by the change of the electric potential of the n-type input side semiconductor region 201 of the NMOS transistor Q20 is reduced, and an on-state characteristic of the NMOS transistor Q20 is improved.

Figure 16B:
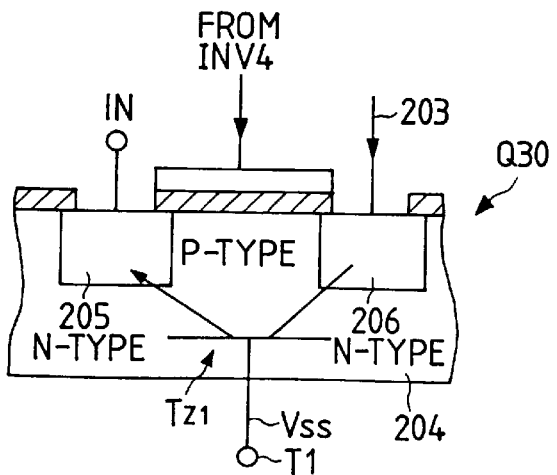
FIG. 16B is a cross-sectional view showing an NMOS transistor Q30 of a CMOS analog switch shown in FIG. 16A.

When a negative surge pulse is applied to the input terminal IN on condition that any control signal is not input to the control input terminal G, the transistor Q50 is turned on, the transistors Q30 and Q40 are turned off, and the first NMOS transistor 551 is turned off. In this case, as shown in FIG. 16B, a lateral n-p-n parasitic transistor Tz1 in which a p-type well region 204 placed just under the gate of the NMOS transistor Q30 functions as a base, an n-type input side semiconductor region 205 of the NMOS transistor Q30 functions as an emitter and an n-type output side semiconductor region 206 of the NMOS transistor Q30 functions as a collector is turned on because a base current is supplied from the low potential electric source terminal T1 to the p-type well region 204. That is, the lateral n-p-n parasitic transistor Tz1 functions in a saturation region. Therefore, the p-type well region 203 of the NMOS transistor Q20 is electrically connected with the input terminal IN through the lateral n-p-n parasitic transistor Tz1, and the electric potential of the p-type well region 203 becomes almost equal to the electric potential Vi of the n-type input side semiconductor region 201.

Accordingly, even though a negative surge pulse is applied to the input terminal IN, because the lateral n-p-n parasitic transistor Tz1 is turned on, the electric potential of the p-type well region 203 is quickly decreased according to the second logical function. Therefore, a base current in the lateral n-p-n parasitic transistor Tnpn of the NMOS transistor Q20 can be perfectly interrupted to turn off the lateral n-p-n parasitic transistor Tnpn of the NMOS transistor Q20, a surge current from the n-type output side semiconductor region 202 to the n-type input side semiconductor region 201 can be perfectly suppressed, and the adverse influence of the negative surge pulse applied to the input terminal IN on the output terminal OUT can be perfectly suppressed.

Also, when a negative surge pulse is applied to the output terminal OUT, the adverse influence of the negative surge pulse on the input terminal IN can be suppressed in the same manner as in the twelfth embodiment.

In the thirteenth embodiment, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Fourteenth Embodiment)

Figure 17:
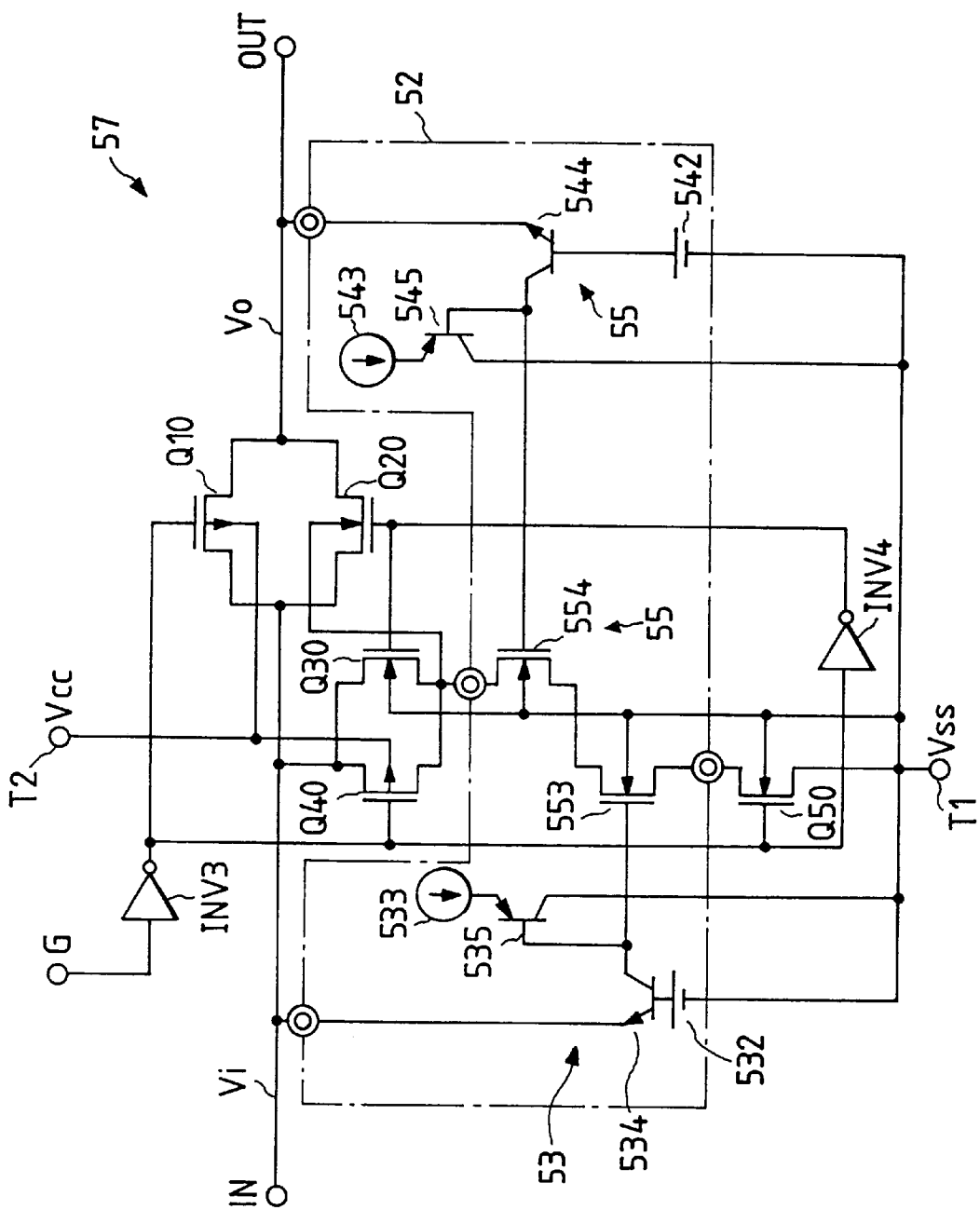
FIG. 17 is a circuit diagram showing another analog switching circuit according to a fourteenth embodiment of the present invention.

FIG. 17 is a circuit diagram of another analog switching circuit according to a fourteenth embodiment of the present invention.

As shown in FIG. 17, an MOS analog switching circuit 57 comprises the CMOS analog switch composed of the PMOS transistor Q10 and the NMOS transistor Q20, the first CMOS inverter INV3, the second CMOS inverter INV4, the pair of NMOS transistor Q30 and PMOS transistor Q40, the NMOS transistor Q50, a first NMOS transistor 553 in which one main electrode is connected with the NMOS transistor Q50, a second NMOS transistor 554 in which one main electrode is connected with the transistors Q30 and Q40 and the p-type well region 203 and the other main electrode is connected with the other main electrode of the first NMOS transistor 553, the source-grounded NMOS transistor Q50, the bias voltage source 532, the constant current source 533, an n-p-n transistor 534 in which an emitter is connected with the input terminal IN and a base is connected with the bias voltage source 532, a first p-n-p transistor 535 in which an emitter is connected with the constant current source 533, a base is connected with a common terminal of the base of the first NMOS transistor 553 and the collector of the n-p-n transistor 534 and a collector is connected with the low potential electric source terminal T1, the bias voltage source 542, the constant current source 543, an n-p-n transistor 544 in which an emitter is connected with the output terminal OUT and a base is connected with the bias voltage source 542, and a second p-n-p transistor 545 in which an emitter is connected with the constant current source 543, a base is connected with a common terminal of the base of the second NMOS transistor 554 and the collector of the n-p-n transistor 544 and a collector is connected with the low potential electric source terminal T1. The electric potential applied to the base of the n-p-n transistor 534 (or 544) by the bias voltage source 532 (or 542) is Vref+Vbe2. Here, a value Vbe2 is a forward bias voltage (or an on-voltage) between the base and the emitter in the n-p-n transistor 534 (or 544), and the forward bias voltage Vbe2 is lower than the forward bias voltage Vbe of the n-p-n transistor 531 (or 541). Each of the first and second NMOS transistors 553 and 554 have a smaller size than those of the first and second NMOS transistors 551 and 552.

In the above configuration, when the n-p-n transistor 534 is turned on, a value of a loading current flowing from the constant current source 533 to the n-p-n transistor 534 through the base of the first p-n-p transistor 535 is 1/K of a value of a collector current flowing from the constant current source 533 to the collector of the first p-n-p transistor 535. In this case, a value K denotes a current amplification factor K in the first p-n-p transistor 535. Therefore, an emitter current of the n-p-n transistor 534 is reduced as compared with that of the n-p-n transistor 531, and the forward bias voltage of the n-p-n transistor 534 is reduced to a value Vbe2. That is, even though a negative surge pulse included in the input signal has a small peak, because the forward bias voltage Vbe2 of the n-p-n transistor 534 is lower than 0.65 V, the n-p-n transistor 534 is reliably turned on, the first NMOS transistor 553 is turned off, and the electric potential of the p-type well region 203 is quickly decreased according to the second logical function.

Also, an emitter current of the n-p-n transistor 544 is reduced as compared with that of the n-p-n transistor 541, and the forward bias voltage of the n-p-n transistor 544 is reduced to a value Vbe2. Therefore, even though a negative surge pulse included in the output signal has a small peak, the n-p-n transistor 544 is reliably turned on, the second NMOS transistor 554 is turned off, and the electric potential of the p-type well region 203 is decreased according to the first logical function.

In addition, because a value of the loading current flowing from the first p-n-p transistor 535 to the first n-p-n transistor 534 is low, when the negative surge pulse is applied to the input terminal IN, the first n-p-n transistor 534 is strongly turned on in a short time, a gate electric potential of the first NMOS transistor 553 is quickly set to a low level, and the first NMOS transistor 553 is quickly turned off.

Accordingly, the electric potential of the p-type well region 203 is quickly decreased according to the second logical function, a base current in the lateral n-p-n parasitic transistor Tnpn of the NMOS transistor Q20 can be perfectly interrupted to turn off the lateral n-p-n parasitic transistor Tnpn of the NMOS transistor Q20, a surge current from the n-type output side semiconductor region 202 to the n-type input side semiconductor region 201 can be perfectly suppressed, and the adverse influence of the negative surge pulse applied to the input terminal IN on the output terminal OUT can be perfectly suppressed.

Also, because a value of the loading current flowing from the second p-n-p transistor 545 to the second n-p-n transistor 544 is low, when the negative surge pulse is applied to the output terminal OUT, the second n-p-n transistor 544 is strongly turned on in a short time, a gate electric potential of the second NMOS transistor 554 is quickly set to a low level, and the second NMOS transistor 554 is quickly turned off. Accordingly, the electric potential of the p-type well region 203 is quickly decreased according to the first logical function, and the adverse influence of the negative surge pulse applied to the output terminal OUT on the input terminal IN can be quickly suppressed.

In the fourteenth embodiment, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Fifteenth Embodiment)

Figure 18:
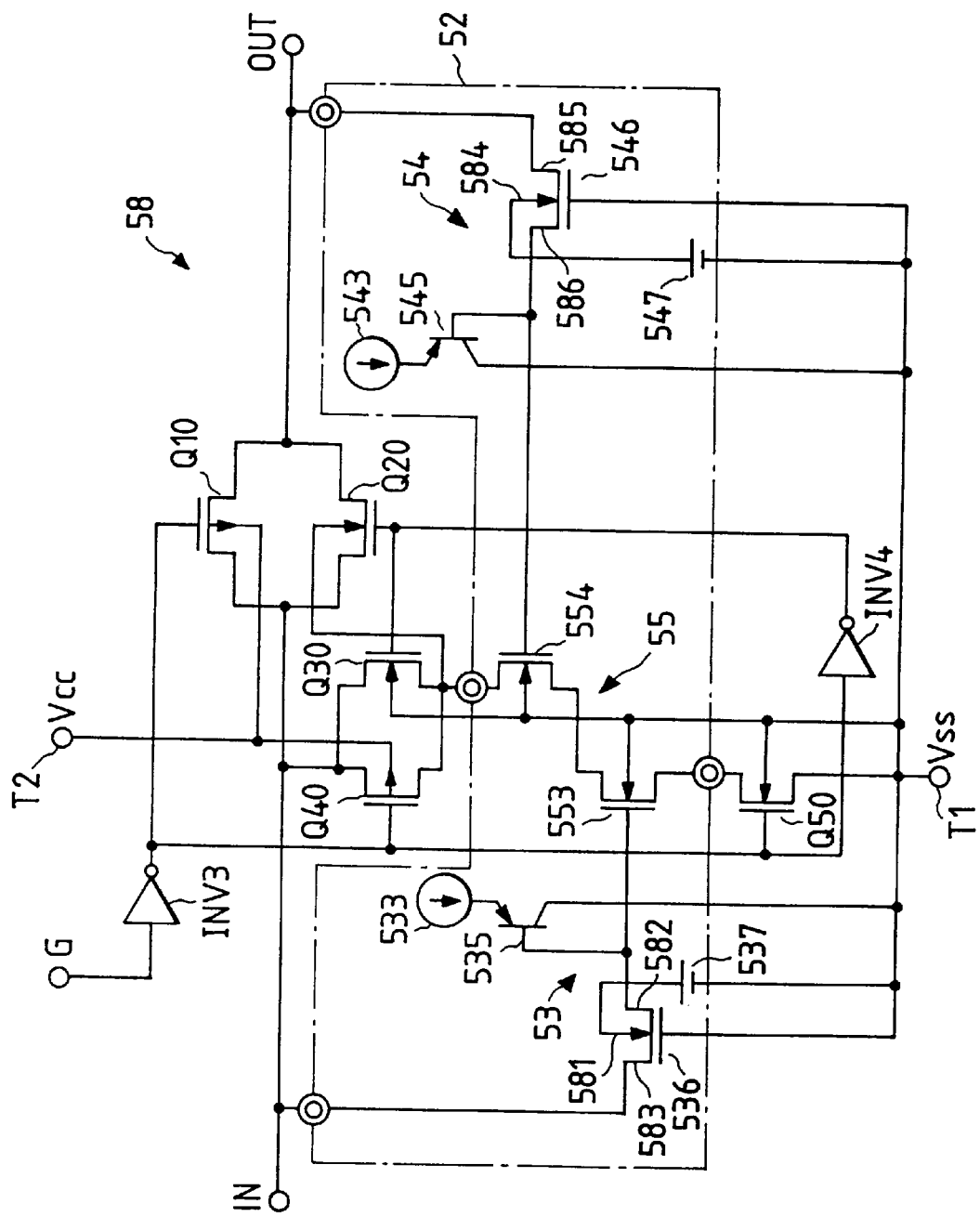
FIG. 18 is a circuit diagram showing another analog switching circuit according to a fifteenth embodiment of the present invention.

FIG. 18 is a circuit diagram of another analog switching circuit according to a fifteenth embodiment of the present invention.

As shown in FIG. 18, an MOS analog switching circuit 58 comprises the CMOS analog switch composed of the PMOS transistor Q10 and the NMOS transistor Q20, the first CMOS inverter INV3, the second CMOS inverter INV4, the pair of NMOS transistor Q30 and PMOS transistor Q40, the NMOS transistor Q50, the first surge pulse detecting comparator 53, the well potential controlling unit 55 composed of the first and second NMOS transistors 553 and 554, and the second surge pulse detecting comparator 54.

The first surge pulse detecting comparator 53 comprises the constant current source 533, the first p-n-p transistor 535, a first surge pulse detecting NMOS transistor 536 in which an n-type input side semiconductor region 582 is connected with the input terminal IN, an n-type output side semiconductor region 583 is connected with the base of the first p-n-p transistor 535 and the gate of the first NMOS transistor 553 and a gate is connected with the low potential electric source terminal T1, and a first bias voltage source 537 arranged between a p-type well region 581 placed just under the gate of the first surge pulse detecting NMOS transistor 536 and the low potential electric source terminal T1 for applying a bias voltage to the p-type well region 581.

The second surge pulse detecting comparator 54 comprises the constant current source 543, the second p-n-p transistor 545, a second surge pulse detecting NMOS transistor 546 in which one main electrode is connected with the output terminal OUT, the other main electrode is connected with the base of the second p-n-p transistor 545 and the gate of the second NMOS transistor 554 and a gate is connected with the low potential electric source terminal T1, and a second bias voltage source 547 arranged between a p-type well region 584 placed just under the gate of the second surge pulse detecting NMOS transistor 546 and the low potential electric source terminal T1 for applying a bias voltage to the p-type well region 584.

In the above configuration, when any negative surge pulse is not applied to the input terminal IN or the output terminal OUT, the first and second surge pulse detecting NMOS transistors 536 and 546 are turned off, the first and second NMOS transistors 553 and 554 are turned on, and the electric potential of the p-type well region 203 of the NMOS transistor Q20 is set to the value Vp.

In contrast, when a negative surge pulse is applied to the input terminal IN, even though the first surge pulse detecting NMOS transistor 536 is not turned on, because an electric potential of the n-type input side semiconductor region 582 of the NMOS transistor 536 is decreased, a forward bias of a p-n junction between the p-type well region 581 and the n-type input side semiconductor region 582 occurs, and a lateral n-p-n parasitic transistor Tz2 in which the p-type well region 581 functions as a base, the n-type input side semiconductor region 582 functions as an emitter and the n-type output side semiconductor region 583 functions as a collector is turned on because a base current is supplied from the low potential electric source terminal T1 to the p-type well region 581. Therefore, a loading current flows from the constant current source 533 to the input terminal IN through the base of the first p-n-p transistor 535 and the lateral n-p-n parasitic transistor Tz2, the first NMOS transistor 553 is turned off. Also, when a negative surge pulse is applied to the output terminal OUT, even though the second surge pulse detecting NMOS transistor 546 is not turned on, because an electric potential of an n-type input side semiconductor region 585 of the NMOS transistor 546 is decreased, a forward bias of a p-n junction between the p-type well region 584 and the n-type input side semiconductor region 585 occurs, and a lateral n-p-n parasitic transistor Tz3 in which the p-type well region 584 functions as a base, the n-type input side semiconductor region 585 functions as an emitter and an n-type output side semiconductor region 586 functions as a collector is turned on because a base current is supplied from the low potential electric source terminal T1 to the p-type well region 584. Therefore, a loading current flows from the constant current source 543 to the output terminal OUT through the base of the second p-n-p transistor 545 and the lateral n-p-n parasitic transistor Tz3, the second NMOS transistor 554 is turned off.

Accordingly, the electric potential of the p-type well region 203 is quickly decreased according to the first or second logical function, and the adverse influence of the negative surge pulse applied to the input terminal IN (or the output terminal OUT) on the output terminal OUT (or the input terminal IN) can be quickly suppressed in the same manner as in the fourteenth embodiment.

In this embodiment, the configuration of the NMOS transistor Q20 is the same as those of the NMOS transistors 536 and 546. That is, the transistors Q20, 536 and 546 are the same NMOS type. Therefore, the NMOS transistors 536 and 546 can be formed according to the same manufacturing process as that for the NMOS transistor Q20, and a relationship in characteristics between the NMOS transistor Q20 and the NMOS transistors 536 and 546 can be fixed even though the MOS analog switching circuit 58 are mass-produced. For example, a differential voltage Vdif between the base-emitter forward voltage Vbe in the lateral n-p-n parasitic transistor Tnpn of the NMOS transistor Q20 and a base-emitter forward voltage Vbe3 in the lateral n-p-n parasitic transistor Tz2 (or Tz3) of the NMOS transistor 536 (or 546) can be set to a constant value.

In detail, in cases where the NMOS transistors Q20 and 536 in which source electrodes are connected with each other when a negative surge pulse is applied to the input terminal IN are considered, the differential voltage Vdif can be formulated.

$$Vdif = Vbe - Vbe3$$
$$= (kT/q) * \{\ln(Ie_{536}/Is_1) - \ln(Ie_{Q20}/Is_2)\}$$
$$= (kT/q) * \ln\{(Ie_{536}/Ie_{Q20}) * (Is_2/Is_1)\}$$

Here, the symbol k denotes the Boltzmann's constant, the symbol T is an absolute temperature of the MOS analog switching circuit 58, the symbol q denotes the electric charge of a positive hole, the symbol $Ie_{536}$ denotes an emitter current of the lateral n-p-n parasitic transistor Tz2, the symbol $Ie_{Q20}$ denotes an emitter current of the lateral n-p-n parasitic transistor Tnpn of the NMOS transistor Q20, the symbol $Is_2$ denotes a reverse saturation current of the lateral n-p-n parasitic transistor Tnpn of the NMOS transistor Q20, and the symbol $Is_1$ denotes a reverse saturation current of the lateral n-p-n parasitic transistor Tz2. In cases where a reverse saturation current per a unit area is indicated by a symbol $Is_0$, though the reverse saturation current $Is_0$ considerably change with the manufacturing process, because the NMOS transistors 536 and Q20 are formed according to the same manufacturing process, a value of the reverse saturation current Iso for the NMOS transistor 536 is the same as that for the NMOS transistor Q20, and a relationship $Is_1=Is_0*A1$ and $Is_2=Is_0*A2$ is satisfied. Here, the symbol A1 denotes a junction area between the base and the emitter in the lateral n-p-n parasitic transistor Tz2, and the symbol A2 denotes a junction area between the base and the emitter in the lateral n-p-n parasitic transistor Tnpn of the NMOS transistor Q20.

Accordingly, because the differential voltage Vdif is indicated by a ratio $Is_2/Is_1$, the differential voltage Vdif is not influenced by the reverse saturation current $Is_0$, the differential voltage Vdif is independent of the manufacturing process, and the differential voltage Vdif can be easily set to a desired value. That is, because the transistors Q20, 536 and 546 are formed to the same NMOS type according to the same manufacturing process, the adverse influence of the negative surge pulse applied to the input terminal IN (or the output terminal OUT) on the output terminal OUT (or the input terminal IN) can be suppressed with a high accuracy.

Also, because the transistors Q20, 536 and 546 are integrated on the same chip according to the same manufacturing process, characteristics such as threshold values of the transistors Q20, 536 and 546 can be set to the same value, and a characteristic change can be reduced.

In the fifteenth embodiment, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Sixteenth Embodiment)

Figure 19:
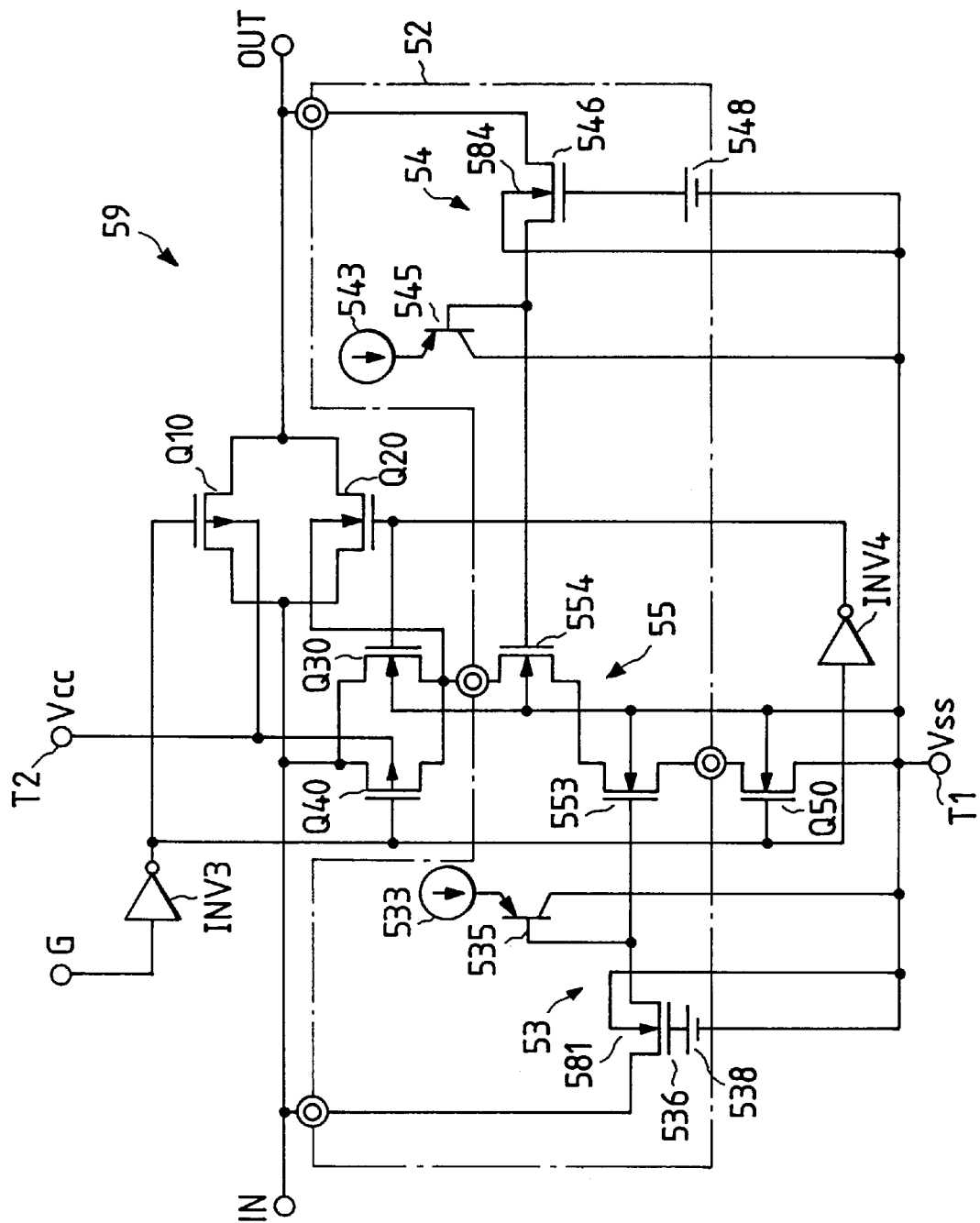
FIG. 19 is a circuit diagram showing another analog switching circuit according to a sixteenth embodiment of the present invention.

FIG. 19 is a circuit diagram of another analog switching circuit according to a sixteenth embodiment of the present invention.

As shown in FIG. 19, an MOS analog switching circuit 59 comprises the CMOS analog switch composed of the PMOS transistor Q10 and the NMOS transistor Q20, the first CMOS inverter INV3, the second CMOS inverter INV4, the pair of NMOS transistor Q30 and PMOS transistor Q40, the NMOS transistor Q50, the first surge pulse detecting comparator 53, the well potential controlling unit 55 composed of the first and second NMOS transistors 553 and 554, and the second surge pulse detecting comparator 54.

The first surge pulse detecting comparator 53 comprises the constant current source 533, the first p-n-p transistor 535, the first surge pulse detecting NMOS transistor 536 in which the gate and the p-type well region 581 are grounded, and a first bias voltage source 538 arranged between the gate of the NMOS transistor 536 and the low potential electric source terminal T1 for applying a positive bias voltage Vb to the gate of the NMOS transistor 536.

The second surge pulse detecting comparator 54 comprises the constant current source 543, the second p-n-p transistor 545, the second surge pulse detecting NMOS transistor 546 in which the gate and the p-type well region 584 are grounded, and a second bias voltage source 548 arranged between the gate of the NMOS transistor 546 and the low potential electric source terminal T1 for applying the positive bias voltage Vb to the gate of the NMOS transistor 546.

In the above configuration, because the positive bias voltage Vb is applied to the gate of the NMOS transistor 536 (or 546), in cases where an electric potential of the input terminal IN (or the output terminal OUT) is lower than a referential electric voltage Vref=Vb−Vt, the NMOS transistor 536 (or 546) is turned on. Therefore, when a negative surge pulse is applied to the input terminal IN (or the output terminal OUT) and the electric potential Vi of the input terminal IN (or the output terminal OUT) becomes lower than the referential electric voltage Vref=Vb−Vt, the NMOS transistor 536 (or 546) is turned on, the first NMOS transistor 553 (or 554) is turned off.

Accordingly, the adverse influence of the negative surge pulse applied to the input terminal IN (or the output terminal OUT) on the output terminal OUT (or the input terminal IN) can be suppressed in the same manner as the MOS analog switching circuit 57 shown in FIG. 17.

In this embodiment, the referential electric voltage Vref=Vb−Vt can be adjusted by changing the positive bias voltage Vb.

In the sixteenth embodiment, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Seventeenth Embodiment)

Figure 20:
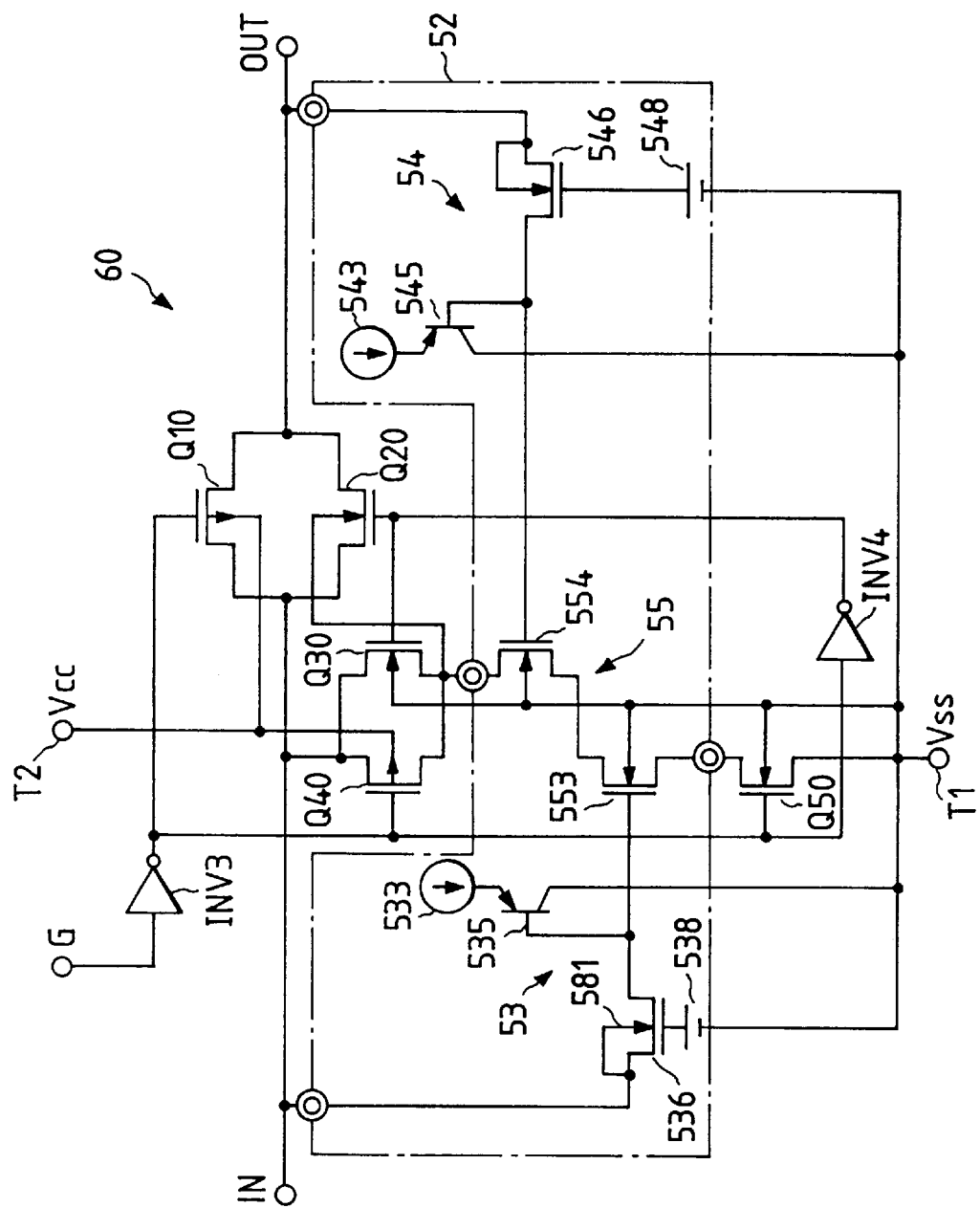
FIG. 20 is a circuit diagram showing another analog switching circuit according to a seventeenth embodiment of the present invention.

FIG. 20 is a circuit diagram of another analog switching circuit according to a seventeenth embodiment of the present invention.

As shown in FIG. 20, the difference between an analog switching circuit 60 and the analog switching circuit 59 is that the p-type well region 581 (or 584) of the NMOS transistor 536 (or 546) is connected with the input terminal IN (or the output terminal OUT).

In this case, even though a negative surge pulse is applied to the input terminal IN (or the output terminal OUT), a depletion layer placed between the source region 582 (or 585) and the p-type well region 581 (or 584) does not change, and an adverse influence of the change of the depletion layer can be avoided. Also, the referential electric voltage Vref=Vb−Vt can be adjusted by changing the positive bias voltage Vb in the same manner as in the sixteenth embodiment.

In the seventeenth embodiment, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Eighteenth Embodiment)

Figure 21:
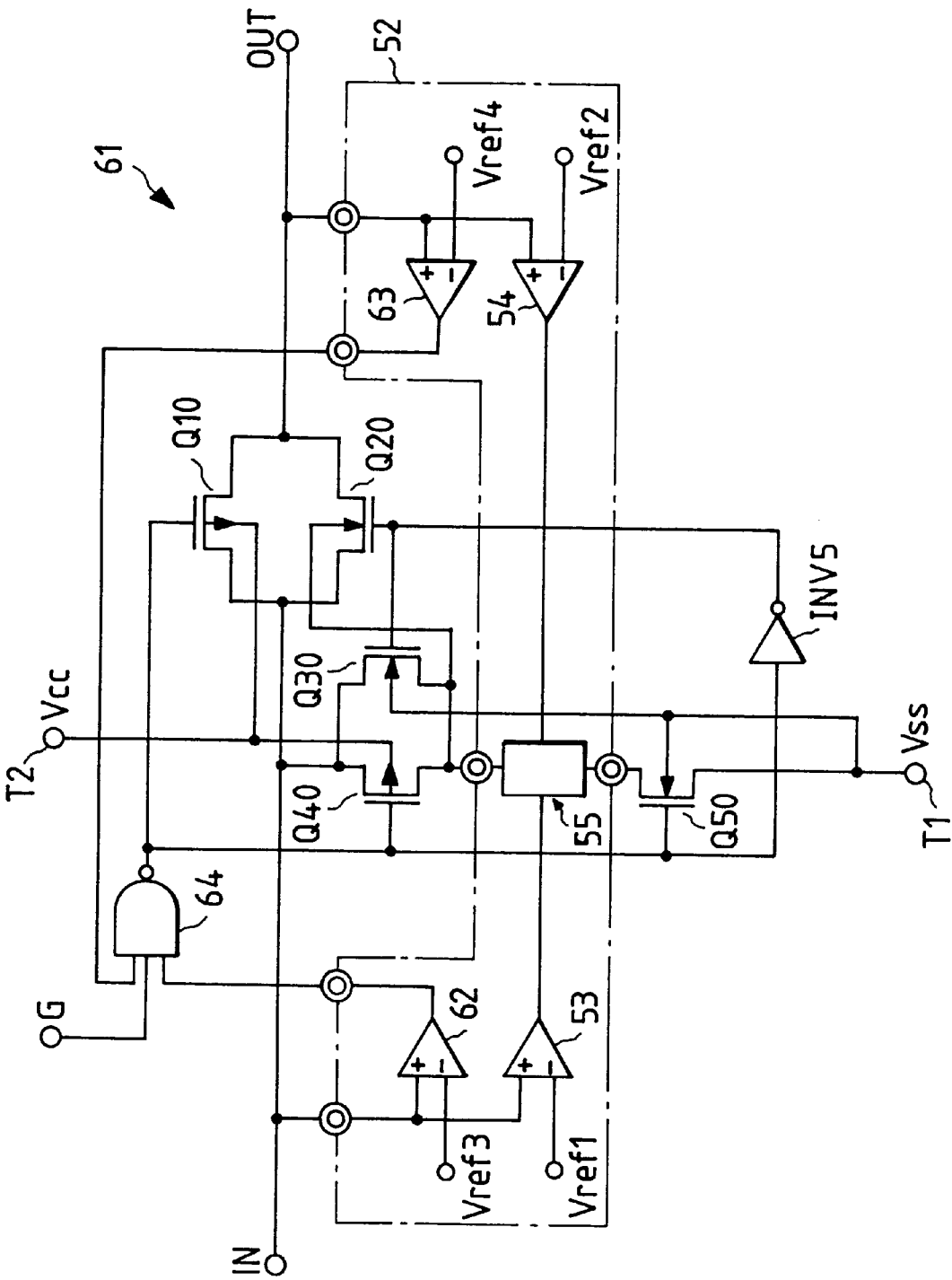
FIG. 21 is a circuit diagram showing another analog switching circuit according to a eighteenth embodiment of the present invention.

FIG. 21 is a circuit diagram of another analog switching circuit according to an eighteenth embodiment of the present invention.

As shown in FIG. 21, an MOS analog switching circuit 61 comprises the CMOS analog switch composed of the PMOS transistor Q10 and the NMOS transistor Q20, the pair of NMOS transistor Q30 and PMOS transistor Q40, the NMOS transistor Q50, the first surge pulse detecting comparator 53, the well potential controlling unit 55, the second surge pulse detecting comparator 54, a third surge pulse detecting comparator 62 for comparing the input electric potential Vi with a third reference electric potential Vref3, outputting a high level signal in case of Vi≧Vref3 and outputting a low level signal in case of Vi<Vref3, a fourth surge pulse detecting comparator 63 for comparing the output electric potential Vout with a fourth reference electric potential Vref4, outputting a high level signal in case of Vout≧Vref4 and outputting a low level signal in case of Vout<Vref4, an NAND circuit 64 for outputting a low level signal in cases where a control signal is input to the control input terminal G and the high level signals are received from the surge pulse detecting comparators 62 and 63 and outputting a high level signal in other cases, and a CMOS inverter INV5 for converting the signal output from the NAND circuit 64 and inputting the converted signal to the gate of the NMOS transistor Q20. The NAND circuit 64 functions as a signal transmission stopping means.

In the above configuration, in cases where any negative surge pulse is not applied to the input terminal IN or the output terminal OUT, the input electric potential Vi is higher than the third reference electric potential Vref3, the output electric potential Vo is higher than fourth reference electric potential Vref4, and high level signals are input from the surge pulse detecting comparators 62 and 63 to the NAND circuit 64. Thereafter, when a control signal is input to the control input terminal G, a low level signal output from the NAND circuit 64 is input to the gate of the PMOS transistor Q10, and a high level signal output from the CMOS inverter INV5 is input to the gate of the NMOS transistor Q20. Therefore, the NMOS transistors Q10 and Q20 are turned on, and a switching operation is performed in the MOS analog switching circuit 61.

In contrast, when a negative surge pulse is applied to the input terminal IN (or the output terminal OUT) and the input electric potential Vi (or the output electric potential Vo) becomes lower than the third reference electric potential Vref3 (or the fourth reference electric potential Vref4), a low level signal is input from the surge pulse detecting comparator 62 or 63 to the NAND circuit 64. Therefore, even though a control signal is input to the control input terminal G, a high level signal is output from the NAND circuit 64, the NMOS transistors Q10 and Q20 are turned off, and a switching operation in the MOS analog switching circuit 61 is stopped.

Accordingly, even though a control signal is input to the control input terminal G to perform a switching operation, when a negative surge pulse is applied to the input terminal IN or the output terminal OUT, the NMOS transistors Q10 and Q20 are immediately turned off, and the adverse influence of the negative surge pulse applied to the input terminal IN (or the output terminal OUT) on the output terminal OUT (or the input terminal IN) can be suppressed.

In this embodiment, the surge pulse detecting comparators 62 and 63 are additionally arranged. However, it is applicable that the surge pulse detecting comparators 62 and 63 be omitted and an output signal of each of the surge pulse detecting comparators 53 and 54 be input to the NAND circuit 64.

In the eighteenth embodiment, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Nineteenth Embodiment)

Figure 22:
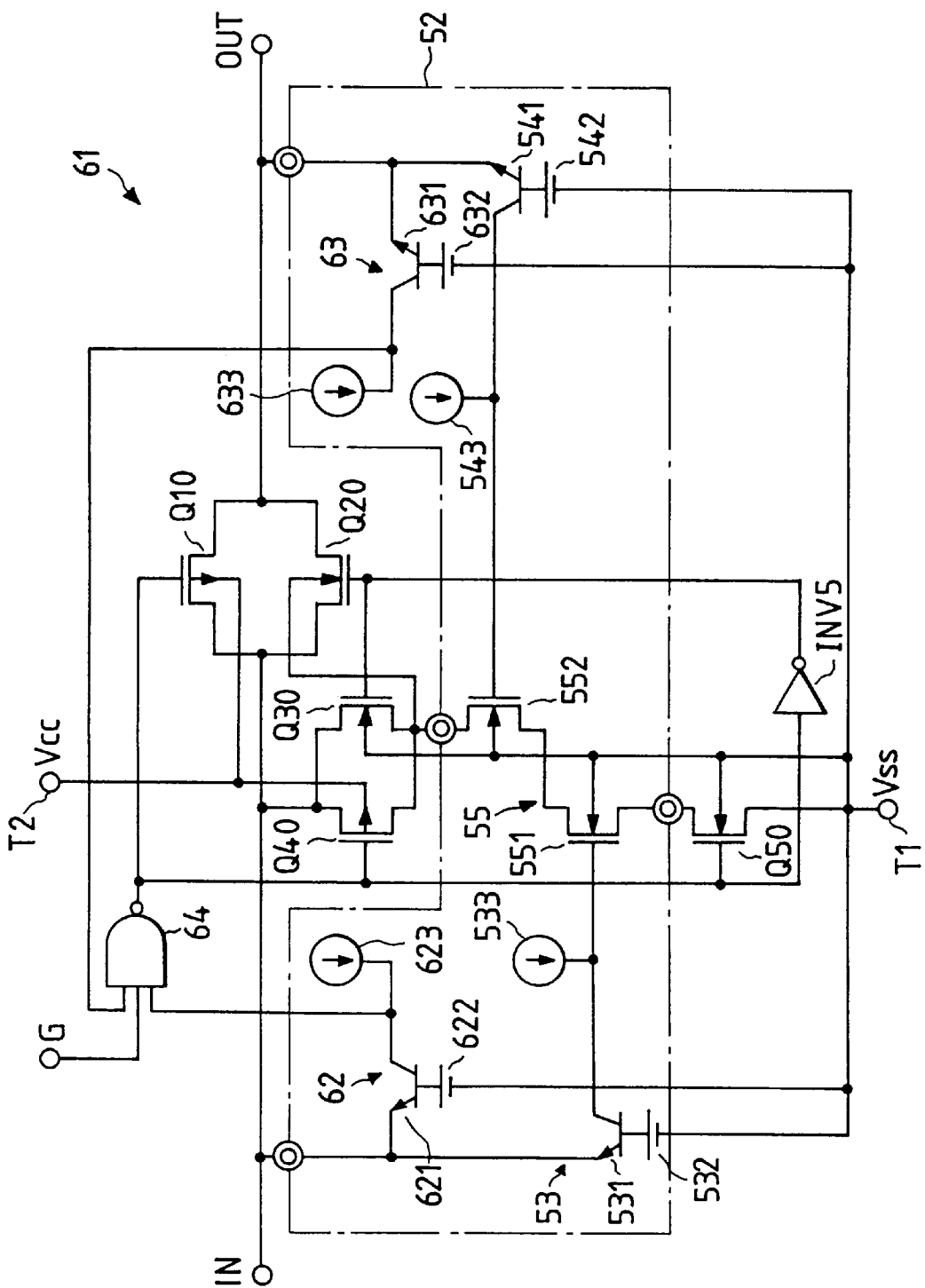
FIG. 22 shows a constitutional example of the analog switching circuit 61 shown in FIG. 21 according to a nineteenth embodiment of the present invention.

FIG. 22 shows a constitutional example of the analog switching circuit 61 shown in FIG. 21 according to a nineteenth embodiment of the present invention.

As shown in FIG. 22, the first surge pulse detecting comparator 53 comprises the n-p-n transistor 531, the bias voltage source 532, and the constant current source 533. The second surge pulse detecting comparator 54 comprises the n-p-n transistor 541, the bias voltage source 542, and the constant current source 543.

The third surge pulse detecting comparator 62 comprises an n-p-n transistor 621 in which an emitter is connected with the input terminal IN, a bias voltage source 622 arranged between a base of the n-p-n transistor 621 and the low potential electric source terminal T1 for applying a third electric potential Vref3+Vbe4 to the base of the n-p-n transistor 621 to turn on the n-p-n transistor 621 when the input electric potential Vi is lower than the third reference electric potential Vref3, and a constant current source 623 connected with a collector of the n-p-n transistor 621.

The fourth surge pulse detecting comparator 63 comprises an n-p-n transistor 631 in which an emitter is connected with the input terminal IN, a bias voltage source 632 arranged between a base of the n-p-n transistor 631 and the low potential electric source terminal T1 for applying a fourth electric potential Vref4+Vbe4 to the base of the n-p-n transistor 631 to turn on the n-p-n transistor 631 when the input electric potential Vi is lower than the third reference electric potential Vref3, and a constant current source 633 connected with a collector of the n-p-n transistor 631.

A value Vbe4 is a base-emitter forward voltage of the n-p-n transistor 621 (or 631). A first input line of the NAND circuit 64 is connected with the collector of the n-p-n transistor 621, and a second input line of the NAND circuit 64 is connected with the collector of the n-p-n transistor 641.

In the above configuration, in cases where any negative surge pulse is not applied to the input terminal IN or the output terminal OUT, the n-p-n transistors 621 and 631 are turned off, and a high electric potential of the high potential electric source terminal T2 is applied to the first and second input lines of the NAND circuit 64 through the constant current sources 623 and 633.

In contrast, when a negative surge pulse is applied to the input terminal IN (or the output terminal OUT) and the input electric potential Vi (or the output electric potential Vo) becomes lower than the third reference electric potential Vref3 (or the fourth reference electric potential Vref4), the n-p-n transistor 621 (or 631) is turned on, a low level signal is transmitted from the collector of the n-p-n transistor 621 (or 631) to the NAND circuit 64.

In the nineteenth embodiment, the configuration of each of the surge pulse detecting comparator 62 and 63 is the same as that of the surge pulse detecting comparator 53 shown in FIG. 16A. However, it is applicable that the configuration of each of the surge pulse detecting comparator 62 and 63 be the same as that of the surge pulse detecting comparator 53 shown in FIG. 17, 18, 19 or 20.

Also, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Twentieth Embodiment)

Figure 23:
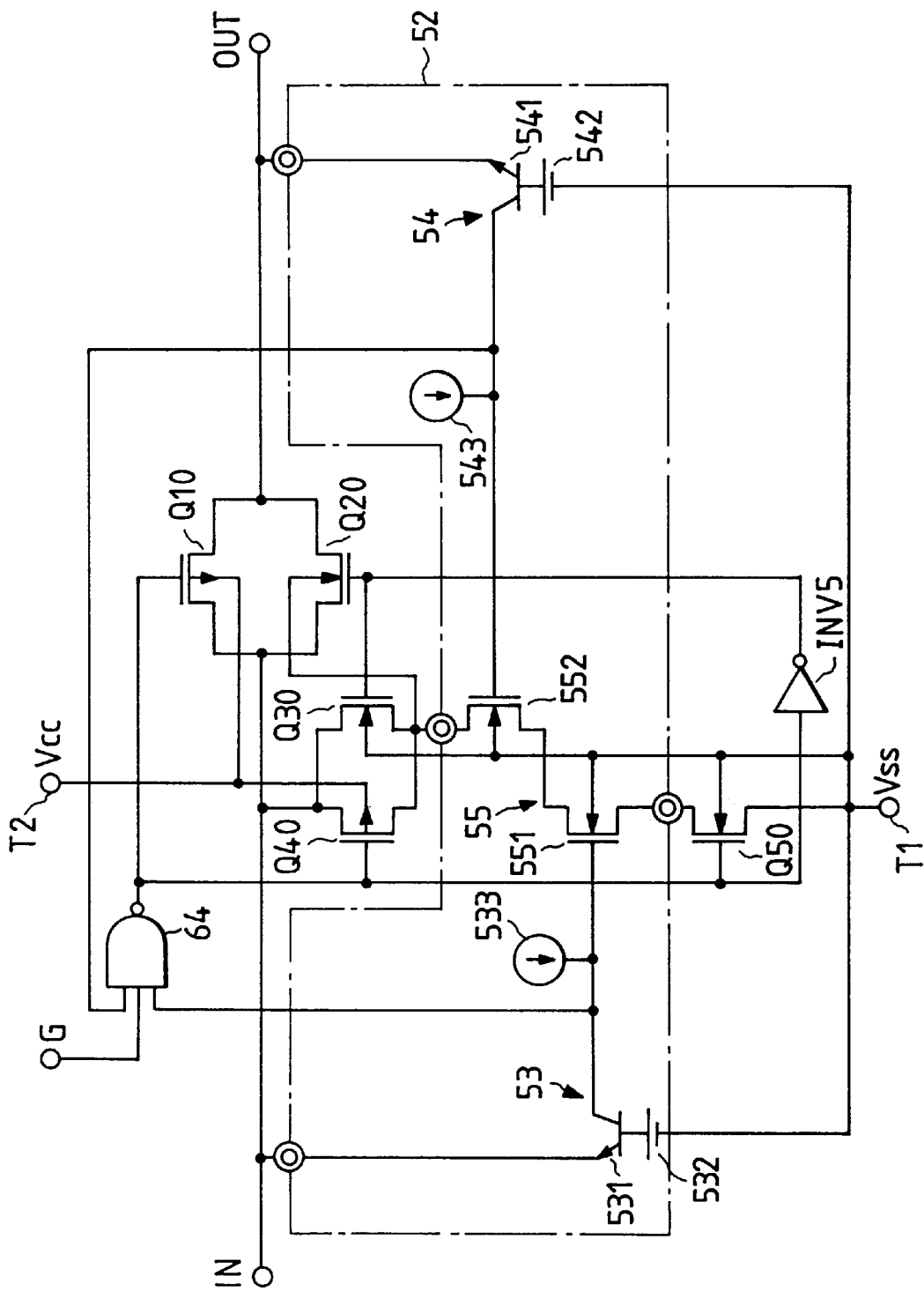
FIG. 23 is a circuit diagram showing another analog switching circuit according to a twentieth embodiment of the present invention.

FIG. 23 is a circuit diagram of another analog switching circuit according to an twentieth embodiment of the present invention.

As shown in FIG. 23, an MOS analog switching circuit 65 comprises the CMOS analog switch composed of the PMOS transistor Q10 and the NMOS transistor Q20, the pair of NMOS transistor Q30 and PMOS transistor Q40, the NMOS transistor Q50, the first surge pulse detecting comparator 53 comprising the n-p-n transistor 531, the bias voltage source 532 and the constant current source 533, the well potential controlling unit 55 composed of the first and second NMOS transistors 551 and 552, the second surge pulse detecting comparator 54 comprising the n-p-n transistor 541, the bias voltage source 542 and the constant current source 543, the NAND circuit 64, and the CMOS inverter INV5.

A first input line of the NAND circuit 64 is connected with the collector of the n-p-n transistor 531, and a second input line of the NAND circuit 64 is connected with the collector of the n-p-n transistor 541.

In the above configuration, in cases where any negative surge pulse is not applied to the input terminal IN or the output terminal OUT, the n-p-n transistors 531 and 541 are turned off, and a high electric potential of the high potential electric source terminal T2 is applied to the first and second input lines of the NAND circuit 64 through the constant current sources 533 and 543.

In contrast, when a negative surge pulse is applied to the input terminal IN (or the output terminal OUT) and the input electric potential Vi (or the output electric potential Vo) becomes lower than the first reference electric potential Vref1 (or the second reference electric potential Vref2), the n-p-n transistor 531 (or 541) is turned on, a low level signal is transmitted from the collector of the n-p-n transistor 531 (or 541) to the NAND circuit 64.

In the twentieth embodiment, the transistors Q30 and Q40 are connected with the input terminal IN. However, it is applicable that the transistors Q30 and Q40 be connected with the output terminal OUT to prevent the adverse influence of a surge pulse applied to the output terminal OUT on the input terminal IN according to the second logical function.

(Twenty-first Embodiment)

Figure 24:
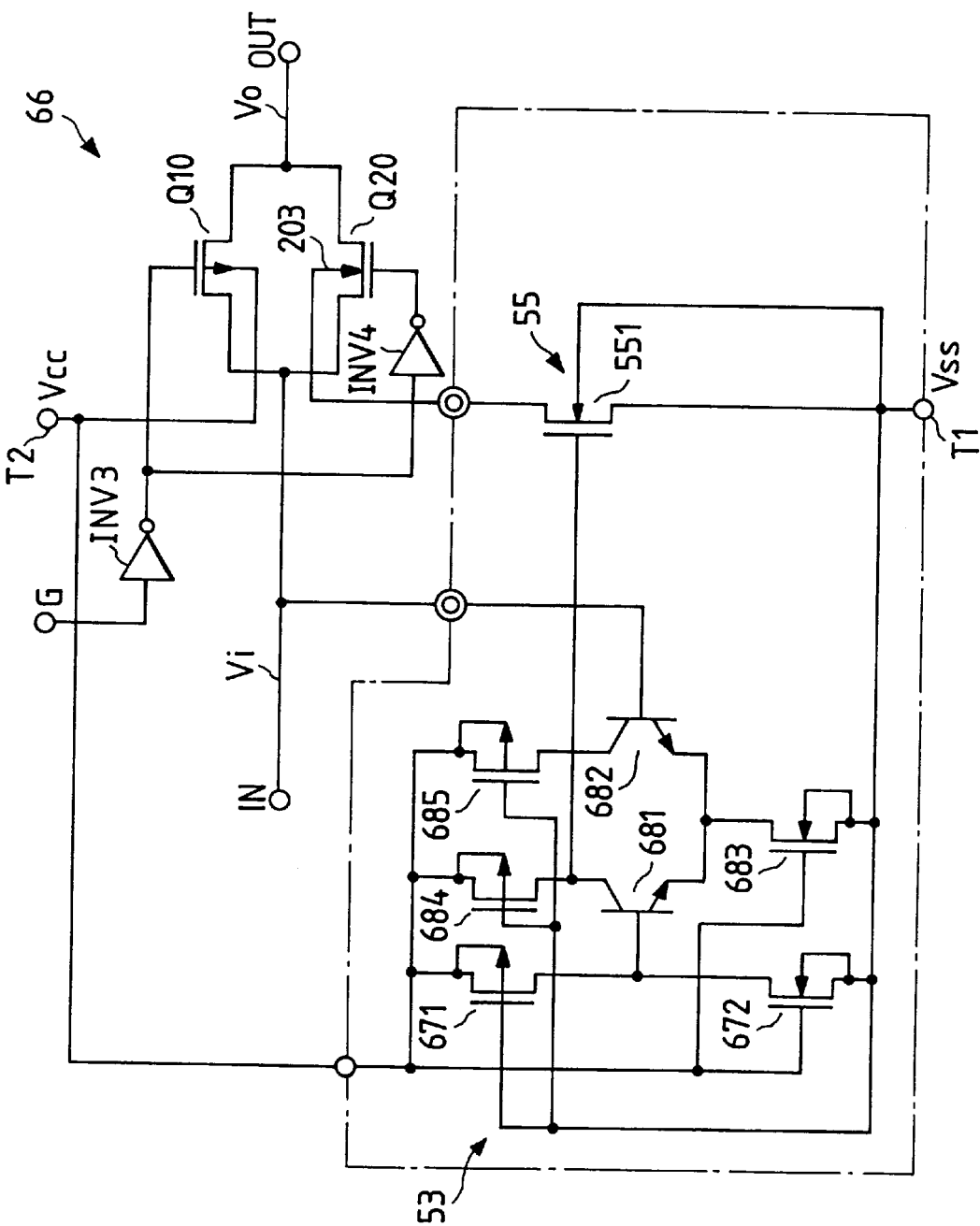
FIG. 24 is a circuit diagram showing another analog switching circuit according to a twenty-first embodiment of the present invention.

FIG. 24 is a circuit diagram of another analog switching circuit according to a twenty-first embodiment of the present invention.

As shown in FIG. 24, an MOS analog switching circuit 66 comprises the CMOS analog switch composed of the PMOS transistor Q10 and the NMOS transistor Q20, the first and second CMOS inverters INV3 and INV4, the first surge pulse detecting comparator 53, and the well potential controlling unit 55 composed of the first NMOS transistor 551.

The first surge pulse detecting comparator 53 comprises a reference electric potential generating circuit 67 for generating the reference electric potential Vref, and a differential amplifying circuit 68 for receiving the reference electric potential Vref of the constant electric potential generating circuit 67 and controlling an electric potential applied to the base of the first NMOS transistor 551.

The reference electric potential generating circuit 67 comprises a PMOS transistor 671 in which one main electrode is connected with the high potential electric source terminal T2 and a gate and an n-type semiconductor substrate region placed just under the gate are grounded to the low potential electric source terminal T1, and an NMOS transistor 672 in which one main electrode is connected with the other main electrode of the PMOS transistor 671, the other main electrode is connected with the terminal T2 and a gate and a p-type well region are connected with the terminal T2. A connecting point Pc5 between the transistor 671 and 672 is set to the reference electric potential Vref.

The differential amplifying circuit 68 comprises a first n-p-n transistor 681 in which a base is connected with the connecting point Pc5 of the constant electric potential generating circuit 67 and a collector is connected with the base of the first NMOS 551, a second n-p-n transistor 682 in which a base is connected with the input terminal IN, a common emitter loading element 683 connected with a common line of emitters of the transistors 681 and 682 for transmitting an emitter current of the transistor 681 or 682 to the low potential electric source terminal T1, a first collector side PMOS transistor 684 connected with a collector of the first transistor 681 for dropping the high electric potential Vcc applied to the high potential electric source terminal T2, and a second collector side resistor 685 arranged between the high potential electric source terminal T2 and a collector of the second transistor 682.

In the above configuration, the transistors 671, 672, 683, 684 and 685 are always opened, and the reference electric potential Vref is applied to the gate of the transistor 681. In cases where any negative surge pulse is not applied to the input terminal IN, because the input electric potential Vi is higher than the reference electric potential Vref, the first n-p-n transistor 681 is turned off, and the second n-p-n transistor 682 is turned on. Therefore, the high electric potential Vcc is applied to the gate of the first NMOS transistor 551, the first NMOS transistor 551 is turned on, and the electric potential of the p-type well region 203 of the NMOS transistor Q20 is set to Vp. In contrast, when a negative surge pulse is applied to the input terminal IN and the input electric potential Vi becomes lower than the reference electric potential Vref, the first n-p-n transistor 681 is turned on, and the second n-p-n transistor 682 is turned off. Therefore, an electric potential applied to the gate of the first NMOS transistor 551 is reduced, the first NMOS transistor 551 is turned off, and the electric potential of the p-type well region 203 of the NMOS transistor Q20 is set in a floating potential.

Accordingly, the adverse influence of the negative surge pulse applied to the input terminal IN on the output terminal OUT can be suppressed in the same manner as in the twelfth embodiment.

In this embodiment it is applicable that each of the n-p-n transistors 681 and 682 be replaced with an NMOS transistor.

Also, it is applicable that the base of the second n-p-n transistor 682 be connected with the output terminal OUT. In this case, the adverse influence of the negative surge pulse applied to the output terminal OUT on the input terminal IN can be suppressed.

In the eleventh to twentieth embodiments, the well potential controlling unit 55 is connected with the p-type well region 203 and the low potential electric source terminal T1. However, it is applicable that the well potential controlling unit 55 is connected with the n-type semiconductor substrate region 103 and the high potential electric source terminal T2 to prevent the adverse influence of the positive surge pulse applied to the input terminal IN (or the output terminal OUT) on the output terminal OUT (or the input terminal IN)
(Twenty-second Embodiment)

Figure 25:
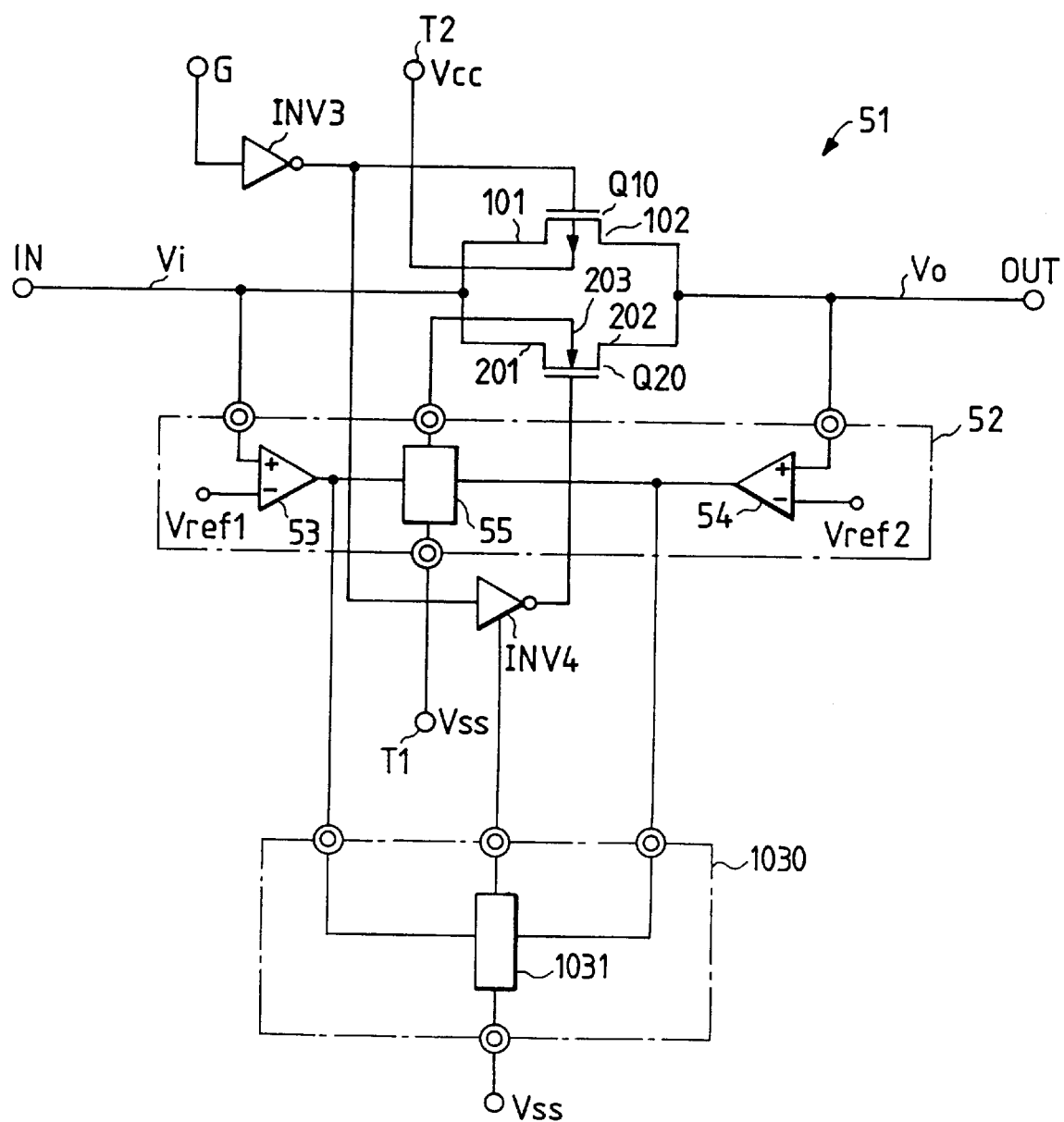
FIG. 25 is a circuit diagram showing another analog switching circuit according to a twenty-second embodiment of the present invention.

FIG. 25 is a circuit diagram showing another analog switching circuit according to a twenty-second embodiment of the present invention.

The twenty-second embodiment is a modification of the eleventh embodiment, characterized by a gate potential control circuit incorporated in the analog switching circuit shown in FIG. 14.

A gate potential control circuit 1030, constituted by an analog switch circuit 1031, has one input terminal connected to an output terminal of the first surge pulse detecting comparator 53, the other input terminal connected to an output terminal of the second surge pulse detecting comparator 54, and an output terminal connected to the second CMOS inverter INV4.

The arrangement and function of this analog switching circuit other than the gate potential control circuit 1030 are substantially the same as those of the eleventh embodiment shown in FIG. 14 or related embodiments.

That is, according to the twenty-second embodiment, a switching circuit transmits a first signal applied to the input terminal IN to the output terminal OUT and transmits a second signal applied to the output terminal OUT to the input terminal IN according to a control signal applied to the control terminal G. This switching circuit comprises an insulated-gate field-effect transistor Q20 having a first-conductive type input-side semiconductor region 201 connected to the input terminal IN, a first-conductive type output-side semiconductor region 202 connected to the output terminal OUT, and a second-conductive type semiconductor substrate (or well) region 203 arranged between the input-side semiconductor region 201 and the output-side semiconductor region 202.

A first p-n junction is set between the semiconductor substrate region 203 and the input-side semiconductor region 201, while a second p-n junction is set between the semiconductor substrate region 203 and the output-side semiconductor region 202. A channel portion of the semiconductor substrate region 203 has a conductive type inverted from the second-conductive type to the first-conductive type in response to the control signal supplied from the control terminal G. Thus, the input signal is transmitted from the input-side semiconductor region 201 to the output-side semiconductor region 202 through the channel portion of the semiconductor substrate region 203. Or, the output signal is transmitted from the output-side semiconductor region 202 to the input-side semiconductor region 201 through the channel portion of the semiconductor substrate region 203.

An electric potential setting circuit 52 is provided for varying an electric potential of the semiconductor substrate region 203 to prevent a first forward current from flowing across the first p-n junction by decreasing a first differential voltage at the first p-n junction when a surge pulse is applied to the input terminal IN so as to increase the first differential voltage, or to prevent a second forward current from flowing across the second p-n junction by decreasing a second differential voltage at the second p-n junction when a surge pulse is applied to the output terminal OUT so as to increase the second differential voltage.

Furthermore, the gate potential control circuit 1030 varies a gate potential of the insulated-gate field-effect transistor Q20 in the same direction as the electric potential of the semiconductor substrate region 203 when the surge pulse is applied to the input terminal IN or the output terminal OUT.

In one preferable mode, the first-conductive type is an n-type and the second-conductive type is a p-type, and the electric potential of the semiconductor substrate region 203 is set to a particular electric potential. The electric potential setting circuit 52 comprises a first surge pulse detecting comparator 53 and a substrate (or well) potential controlling unit 55. The first surge pulse detecting comparator 53 judges whether or not an electric potential Vi of the input terminal IN is lower than a reference electric potential Vref1 to detect the surge pulse when the electric potential Vi of the input terminal IN is lower than the reference electric potential Vref1. The substrate potential controlling unit 55 maintains the particular electric potential of the semiconductor substrate region 203 when no surge pulse is detected by the first surge pulse detecting comparator 53 sets the semiconductor substrate region 203 to a floating potential when any surge pulse is detected by the first surge pulse detecting comparator 53.

Alternatively, it is preferable in the above-described one preferable mode that the substrate potential controlling unit 55 maintains the particular electric potential of the semiconductor substrate region 203 when no surge pulse is detected by the first surge pulse detecting comparator 53 and changes the particular electric potential of the semiconductor substrate region 203 to decrease an electric potential difference between the semiconductor substrate region 203 and the input-side semiconductor region 201 when any surge pulse is detected by the first surge pulse detecting comparator 53.

According to another preferable mode, the first-conductive type is an n-type and the second-conductive type is a p-type, and the electric potential of the semiconductor substrate region 203 is set to a particular electric potential. The electric potential setting circuit 52 comprises a second surge pulse detecting comparator 54 and the substrate potential controlling unit 55. The second surge pulse detecting comparator 54 judges whether or not an electric potential Vo of the output terminal OUT is lower than the reference electric potential Vref2 to detect the surge pulse when the electric potential Vo of the output terminal OUT is lower than the reference electric potential Vref2. The substrate potential controlling unit 55 maintains the particular electric potential of the semiconductor substrate region 203 when no surge pulse is detected by the second surge pulse detecting comparator 54 and sets the semiconductor substrate region 203 to a floating potential when any surge pulse is detected by the second surge pulse detecting comparator 54.

Alternatively, it is preferable in the above-described another preferable mode that the substrate potential controlling unit 55 maintains the particular electric potential of the semiconductor substrate region 203 when no surge pulse is detected by the second surge pulse detecting comparator 54 and changes the particular electric potential of the semiconductor substrate region 203 to decrease an electric potential difference between the semiconductor substrate region 203 and the output-side semiconductor region 202 when any surge pulse is detected by the second surge pulse detecting means 54.

(Twenty-third Embodiment)

Figure 26:
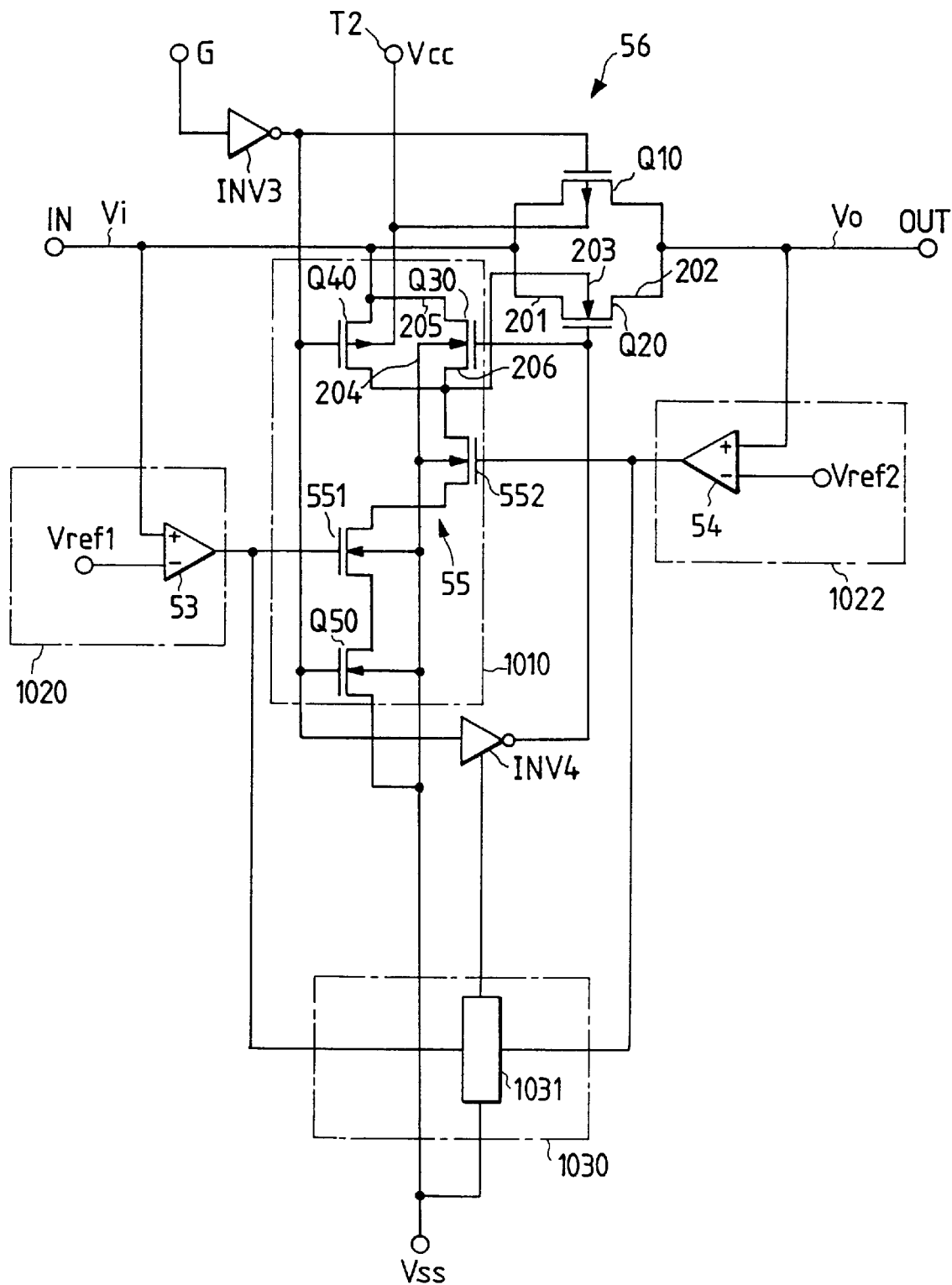
FIG. 26 is a circuit diagram showing another analog switching circuit according to a twenty-third embodiment of the present invention.

FIG. 26 is a circuit diagram showing another analog switching circuit according to a twenty-third embodiment of the present invention.

The electric potential setting circuit 52 shown in FIG. 25 is constituted by a first surge pulse detecting circuit 1020, a second surge pulse detecting circuit 1022, and a substrate (or well) potential setting circuit 1010.

First surge pulse detecting circuit 1020 is connected to input terminal IN to detect a surge pulse having a negative potential applied to the input terminal IN. More specifically, the first surge pulse detecting circuit 1020 is constituted by the first surge pulse detecting comparator 53 having one input terminal connected to the input terminal IN and the other input terminal inputting the first reference electric potential Vref1. First surge pulse detecting comparator 53 compares the electric potential Vi of an input signal applied to the input terminal IN with the first reference electric potential Vref1 to detect a negative surge pulse included in the input signal. A high level signal indicating no detection of any negative surge is produced from the first surge pulse detecting comparator 53 when the input electric potential Vi is equal to or higher than the first reference electric potential Vref1. A low level signal indicating a detection of the negative surge is produced from the first surge pulse detecting comparator 53 when the input electric potential Vi is lower than the first reference electric potential Vref1.

Second surge pulse detecting circuit 1022 is connected to output terminal OUT to detect a surge pulse having a negative potential involved in the output terminal OUT. More specifically, the second surge pulse detecting circuit 1022 is constituted by the second surge pulse detecting comparator 54 having one input terminal connected to the output terminal OUT and the other input terminal inputting the second reference electric potential Vref2. Second surge pulse detecting comparator 54 compares the electric potential Vo of an output signal output from the output terminal OUT with the second reference electric potential Vref2 to detect a negative surge pulse included in the output signal. A high level signal indicating no detection of any negative surge is produced from the second surge pulse detecting comparator 54 when the output electric potential Vo is equal to or higher than the second reference electric potential Vref2. A low level signal indicating a detection of the negative surge is produced from the second surge pulse detecting comparator 54 when the output electric potential Vo is lower than the second reference electric potential Vref2.

The substrate (or well) potential setting circuit 1010, provided for setting an electric potential of the p-type substrate (or well) region 203 of the NMOS transistor Q20, comprises a pair of NMOS transistor Q30 and PMOS transistor Q40, first NMOS transistor 551, second NMOS transistor 552 and source-grounded NMOS transistor Q50. The arrangement and functions of these components constituting the substrate potential setting circuit 1010 are described in greater detail in the thirteenth embodiment explained with reference to FIG. 16A.

One input terminal of the analog switch circuit 1031 is connected to the first surge pulse detecting circuit 1020 to receive a voltage corresponding to a detected input surge pulse. The other input terminal of the analog switch circuit 1031 is connected to the second surge pulse detecting circuit 1022 to receive a voltage corresponding to a detected output surge pulse.

The received input voltage, representing the detected input or output surge pulse, is applied to the gate of NMOS transistor Q20 via second CMOS inverter INV4. Thus, the gate potential of NMOS transistor Q20 varies in accordance with a change of the electric potential Vi of input terminal IN as well as a change of the electric potential Vo of output terminal OUT.

When PMOS transistor Q10 and NMOS transistor Q20 are both turned off, a negative surge pulse may applied to the input terminal IN. In this case, the electric potential of the p-type substrate (well) region 203 of NMOS transistor Q20 is changed in accordance with the electric potential Vi of an input signal applied to the input terminal IN by the function of the substrate potential setting circuit 1010.

According to the circuit arrangement of this embodiment, even if the threshold value of NMOS transistor Q20 is extremely low, the gate-potential control circuit 1030 functions in such a manner that the gate potential of NMOS transistor Q20 varies in accordance with a change of the electric potential Vi of input terminal IN. Thus, it becomes possible to prevent the NMOS transistor Q20 from being turned on undesirably.

When a negative surge is applied to the output terminal OUT, the same function is performed by the gate-potential control circuit 1030.

That is, according to the above-described twenty-third embodiment, the analog switching circuit comprises the insulated-gate field-effect transistor Q20 having the first-conductive type input-side semiconductor region 201 connected to the input terminal IN, the first-conductive type output-side semiconductor region 202 connected to the output terminal OUT, and the second-conductive type semiconductor substrate region 203. The insulated-gate field-effect transistor Q20 controls conductiveness between the input terminal IN and the output terminal OUT based on a gate potential. The first surge pulse detecting circuit 1020, responsive to the electric potential Vi of the input terminal IN, produces the detection signal when the electric potential Vi of the input terminal IN reaches the surge voltage level equivalent to the forward bias of the PN junction formed between the semiconductor substrate region 203 and the input-side semiconductor region 201. The substrate potential setting circuit 1010 varies the electric potential of the semiconductor substrate region 203 in response to the electric potential Vi of the input terminal IN when the detection signal is produced from the first surge pulse detecting circuit 1020. In addition, the gate potential control circuit 1030 varies the gate potential of the insulated-gate field-effect transistor Q20 in the same direction as the electric potential of the semiconductor substrate region 203 when the detection signal is produced from the first surge pulse detecting circuit 1020.

(Twenty-fourth Embodiment)

Figure 27:
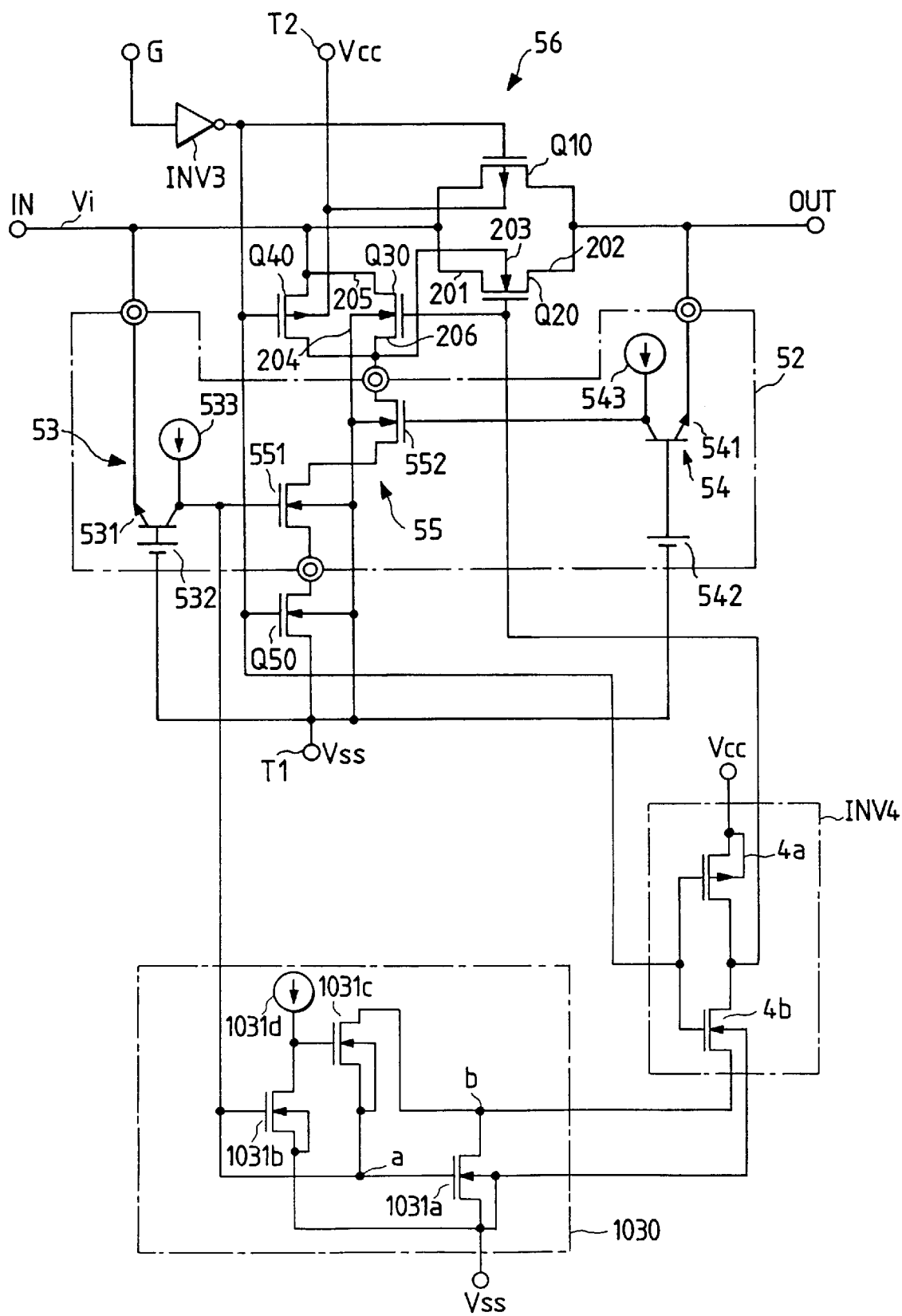
FIG. 27 is a circuit diagram showing another analog switching circuit according to a twenty-fourth embodiment of the present invention.

FIG. 27 is a circuit diagram showing another analog switching circuit according to a twenty-fourth embodiment of the present invention.

FIG. 27 shows the detained arrangement of the electric potential setting circuit 52 (i.e., substrate potential setting circuit 1010, and first 1020 and second 1022 surge pulse detecting circuits), gate-potential control circuit 1030, and second CMOS inverter INV4. As shown in FIGS. 25 and 26, each surge pulse detecting circuit 1020 or 1022 is connected symmetrically to the gate-potential control circuit 1030. Therefore, only the connection between the first surge pulse detecting comparator 54 and the gate-potential control circuit 1030 is disclosed in detail and the connection between the second surge pulse detecting comparator 54 and the gate-potential control circuit 1030 is omitted for the purpose of simplifying the drawing.

The first surge pulse detecting comparator 53 consists of n-p-n transistor 531, bias voltage source 532 and constant current source 533. In this case, the voltage of bias voltage source 532 minus a base-emitter voltage of n-p-n transistor 531 is equivalent to the above-described first reference electric potential Vref1. Accordingly, when the electric potential Vi of input terminal IN is within a normal range, the n-p-n transistor 531 is turned off. When the electric potential Vi of input terminal IN is decreased to a negative surge level, the n-p-n transistor 531 is turned on.

When n-p-n transistor 531 is turned off under a condition where the electric potential Vi of input terminal IN is within the normal range, current of constant current source 533 flows into the gate of first NMOS transistor 551. Thus, first NMOS transistor 551 is turned on. In this case, the CMOS analog switch, composed of PMOS transistor Q10 and NMOS transistor Q20, performs an ordinary operation.

On the other hand, when n-p-n transistor 531 is turned on under a condition where the electric potential Vi of input terminal IN is decreased to the negative surge level, no current is supplied to the gate of first NMOS transistor 551. Thus, first NMOS transistor 551 is turned off. This forcibly isolates the NMOS transistor Q30 from the electric potential Vss terminal. Thus, the parasitic transistor of NMOS transistor Q30 becomes active. The activation of the parasitic transistor of NMOS transistor Q30 causes the electric potential of p-type substrate region 203 of NMOS transistor Q20 to vary in accordance with the electric potential Vi of the input terminal IN. In other words, the NMOS transistor Q20 is surely prevented from being undesirably operated due to the turning on operation of its parasitic transistor.

The analog switch circuit 1031, i.e., gate potential control circuit 1030, consists of three NMOS transistors 1031*a*, 1031*b* and 1031*c* and a constant current source 1031*d*. When n-p-n transistor 531 is turned off under the condition where the electric potential Vi of input terminal IN is within the normal range, current of constant current source 533 flows into the gates of NMOS transistors 1031*a* and 1031*b*. Thus, both of NMOS transistors 1031*a* and 1031*b* are turned on, while the remaining NMOS transistor 1031*c* is turned off. Accordingly, second CMOS inverter INV4 is connected to the electric potential Vss terminal. Thus, the CMOS analog switch, composed of PMOS transistor Q10 and NMOS transistor Q20, performs an ordinary operation. In this case, as shown in FIG. 27, the second CMOS inverter INV4 consists of a PMOS transistor 4*a* and a NMOS transistor 4*b* serially connected.

On the other hand, when a negative pulse is added to the electric potential Vi of the input signal, the n-p-n transistor 531 is turned on. No current is supplied to the gates of NMOS transistors 1031*a* and 1031*b*. Thus, both of NMOS transistors 1031*a* and 1031*b* are turned off, while the remaining NMOS transistor 1031*c* is turned on.

In this case, the collector potential of n-p-n transistor 531 is equivalent to the electric potential Vi of input terminal IN plus the collector-emitter saturation voltage of n-p-n transistor 531. As the NMOS transistor 1031*a* is turned off while the NMOS transistor 1031*c* is turned on in this case, an electric potential at a point "a" is equalized with an electric potential at a point "b", in FIG. 27. Accordingly, a voltage corresponding to the electric potential Vi of input terminal IN is applied to the gate of NMOS transistor Q20 via NMOS transistor 4*b* of second CMOS inverter INV4. In other words, an undesirable operation of NMOS transistor Q20 due to the turning on of its the parasitic transistor can be surely prevented.

(Other modifications)

The gate potential control circuit 1030 of the above-described twenty-second to twenty-fourth embodiments can be incorporated in any one of the analog switching circuits of the above-described embodiments of the present invention, for example in the twelfth to twenty-first embodiments explained with reference to FIGS. 15–24, in the same manner as in the twenty-second to twenty-fourth embodiments.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. An analog switching circuit comprising:

an insulated-gate field-effect transistor having a first-conductive type input-side semiconductor region connected to the input terminal, a first-conductive type output-side semiconductor region connected to the output terminal, and a second-conductive type semiconductor substrate region, said insulated-gate field-effect transistor controlling conductiveness between said input terminal and said output terminal based on a gate potential;

surge pulse detecting means responsive to an electric potential of said input terminal for producing a detection signal when said electric potential of said input terminal reaches a surge voltage level equivalent to a forward bias of a PN junction formed between said semiconductor substrate region and said input-side semiconductor region;

substrate potential setting means for varying an electric potential of said semiconductor substrate region in response to the electric potential of said input terminal when said detection signal is produced from said surge pulse detecting means; and gate potential control means for varying said gate potential of said insulated-gate field-effect transistor in the same direction as said electric potential of said semiconductor substrate region when said detection signal is produced from said surge pulse detecting means.

2. The analog switching circuit in accordance with claim 1, wherein the gate potential of said insulated-gate field-effect transistor follows the electric potential of said input terminal under a control of said gate potential control means.

3. The analog switching circuit in accordance with claim 2, wherein said gate potential control means comprises voltage transmission means for transmitting the electric potential of said input terminal to a gate of said insulated-gate field-effect transistor.

4. The analog switching circuit in accordance with claim 2, wherein said insulated-gate field-effect transistor serves as a first insulated-gate field-effect transistor, said substrate potential setting means comprises a second insulated-gate field-effect transistor connected between said input terminal and said semiconductor substrate region, and a control is performed in the following manner:

said second insulated-gate field-effect transistor is turned on when said first insulated-gate field-effect transistor is turned on so that the electric potential of said semiconductor substrate region follows the electric potential of said input terminal;

said second insulated-gate field-effect transistor is turned off when said first insulated-gate field-effect transistor is turned off so that the electric potential of said semiconductor substrate region is fixed to a constant voltage; and a parasitic transistor of said second insulated-gate field-effect transistor is activated when the electric potential of said input terminal reaches said surge voltage level under a condition where said second insulated-gate field-effect transistor in turned off so that the electric potential of said semiconductor substrate region follows the electric potential of said input terminal.

5. The analog switching circuit in accordance with claim 4, wherein said substrate potential setting means comprises switch means interposed between said second insulated-gate field-effect transistor and a voltage source providing said constant voltage, said switch means disconnects said second insulated-gate field-effect transistor from said voltage source when said detection signal is produced from said surge pulse detecting means.

6. A switching circuit for transmitting a first signal applied to an input terminal to an output terminal and transmitting a second signal applied to the output terminal to the input terminal according to a control signal applied to a control terminal, comprising:

an insulated-gate field-effect transistor having a first-conductive type input-side semiconductor region connected to the input terminal, a first-conductive type output-side semiconductor region connected to the output terminal, and a second-conductive type semiconductor substrate region arranged between said input-side semiconductor region and said output-side semiconductor region to set a first p-n junction between said semiconductor substrate region and said input-side semiconductor region and set a second p-n junction between said semiconductor substrate region and said output-side semiconductor region, in which a channel portion of said semiconductor substrate region has a conductive type inverted from said second-conductive type to said first-conductive type in response to the control signal supplied from said control terminal to transmit the input signal from said input-side semiconductor region to said output-side semiconductor region through the channel portion of said semiconductor substrate region or to transmit the output signal from the output-side semiconductor region to said input-side semiconductor region through the channel portion of said semiconductor substrate region;

electric potential setting means for varying an electric potential of said semiconductor substrate region to prevent a first forward current from flowing across said first p-n junction by decreasing a first differential voltage at said first p-n junction when a surge pulse is applied to said input terminal so as to increase the first differential voltage or to prevent a second forward current from flowing across said second p-n junction by decreasing a second differential voltage at said second p-n junction when a surge pulse is applied to said output terminal so as to increase the second differential voltage; and gate potential control means for varying a gate potential of said insulated-gate field-effect transistor in the same direction as said electric potential of said semiconductor substrate region when the surge pulse is applied to said input terminal or said output terminal.

7. The switching circuit in accordance with claim 6, wherein said first-conductive type is an n-type and the second-conductive type is a p-type, said electric potential of said semiconductor substrate region is set to a particular electric potential, and said electric potential setting means comprises:

surge pulse detecting means for judging whether or not an electric potential of said input terminal is lower than a reference electric potential to detect the surge pulse when said electric potential of said input terminal is lower than the reference electric potential; and substrate potential controlling means for maintaining the particular electric potential of the semiconductor substrate region when no surge pulse is detected by said surge pulse detecting means and setting the semiconductor substrate region to a floating potential when any surge pulse is detected by said surge pulse detecting means.

8. The switching circuit in accordance with claim 6, wherein said first-conductive type is an n-type and the second-conductive type is a p-type, said electric potential of said semiconductor substrate region is set to a particular electric potential, and said electric potential setting means comprises:

surge pulse detecting means for judging whether or not an electric potential of said input terminal is lower than a reference electric potential to detect the surge pulse when said electric potential of said input terminal is lower than the reference electric potential; and substrate potential controlling means for maintaining said particular electric potential of the semiconductor substrate region when no surge pulse is detected by said surge pulse detecting means and changing said particular electric potential of said semiconductor substrate region to decrease an electric potential difference between said semiconductor substrate region and said input-side semiconductor region when any surge pulse is detected by said surge pulse detecting means.

9. The switching circuit in accordance with claim 6, wherein said first-conductive type is an n-type and the second-conductive type is a p-type, said electric potential of said semiconductor substrate region is set to a particular electric potential, and said electric potential setting means comprises:

surge pulse detecting means for judging whether or not an electric potential of said output terminal is lower than a reference electric potential to detect the surge pulse when said electric potential of said output terminal is lower than the reference electric potential; and substrate potential controlling means for maintaining the particular electric potential of the semiconductor substrate region when no surge pulse is detected by said surge pulse detecting means and setting the semiconductor substrate region to a floating potential when any surge pulse is detected by said surge pulse detecting means.

10. The switching circuit in accordance with claim 6, wherein said first-conductive type is an n-type and the second-conductive type is a p-type, said electric potential of said semiconductor substrate region is set to a particular electric potential, and said electric potential setting means comprises:

surge pulse detecting means for judging whether or not an electric potential of said input terminal is lower than a reference electric potential to detect the surge pulse when said electric potential of said output terminal is lower than the reference electric potential; and substrate potential controlling means for maintaining said particular electric potential of the semiconductor substrate region when no surge pulse is detected by said surge pulse detecting means and changing said particular electric potential of said semiconductor substrate region to decrease an electric potential difference between said semiconductor substrate region and said output-side semiconductor region when any surge pulse is detected by said surge pulse detecting means.

11. A switching circuit for transmitting a first signal applied to an input terminal to an output terminal and transmitting a second signal applied to the output terminal to the input terminal according to a control signal applied to a control terminal, comprising:

an input side semiconductor region of a first conductive type which is connected with the input terminal;

an output side semiconductor region of the first conductive type which is connected with the output terminal;

a semiconductor substrate region of a second conductive type which is arranged between the input side semiconductor region and the output side semiconductor region to set a first p-n junction between the semiconductor substrate region and the input side semiconductor region and set a second p-n junction between the semiconductor substrate region and the output side semiconductor region, the second conductive type in a channel portion of the semiconductor substrate region being inverted to the first conductive type by the control signal applied to the control input terminal to transmit the input signal from the input side semiconductor region to the output side semiconductor region through the channel portion of the semiconductor substrate region or to transmit the output signal from the output side semiconductor region to the input side semiconductor region through the channel portion of the semiconductor substrate region; and electric potential setting means for decrease or increase an electric potential of the semiconductor substrate region to prevent a first forward current at the first p-n junction by decreasing a first differential voltage at the first p-n junction in cases where a surge pulse is applied to the input terminal to increase the first differential voltage or to prevent a second forward current at the second p-n junction by decreasing a second differential voltage at the second p-n junction in cases where a surge pulse is applied to the output terminal to increase the second differential voltage.

12. A switching circuit according to claim 11 wherein:

the first conductive type is a p-type;

the second conductive type is an n-type; and the electric potential setting means includes an n-p-n emitter follower transistor, in which an emitter is connected with the semiconductor substrate region and a collector is connected with a high potential electric source terminal, for supplying an emitter current from the high potential electric source terminal to the semiconductor substrate region.

13. A switching circuit according to claim 11 wherein:

the first conductive type is a p-type and the second conductive type is an n-type, and the electric potential setting means comprises:

an n-p-n emitter follower transistor, in which an emitter is connected with the semiconductor substrate region and a collector is connected with a high potential electric source terminal, for supplying an emitter current from the high potential electric source terminal to the semiconductor substrate region; and base current setting means for setting a base current supplied to a base of the n-p-n emitter follower transistor to a constant value and increasing a base electric potential applied to the base of the n-p-n emitter follower transistor to prevent a current from the semiconductor substrate region to the base of the n-p-n emitter follower transistor through the emitter of the n-p-n emitter follower transistor in cases where an electric potential of the semiconductor substrate region is increased by the surge pulse applied to the input terminal or the output terminal.

14. A switching circuit according to claim 13 wherein the base current setting means comprises:

reference current supplying means for supplying a reference current flowing from the high potential electric source terminal to a common connecting point;

base current supplying means for dividing the base current from the reference current supplied to the common connecting point by the reference current supplying means and supplying the base current to the base of the n-p-n emitter follower transistor; and difference current absorbing means for absorbing a difference current obtained by subtracting the base current from the reference current supplied to the common connecting point by the reference current supplying means and transmitting the difference current to a reference potential terminal set at a referential electric potential.

15. A switching circuit according to claim 11 wherein:

the first conductive type is a p-type and the second conductive type is an n-type, and the electric potential setting means comprises:

an n-p-n emitter follower transistor, in which an emitter is connected with the semiconductor substrate region and a collector is connected with a high potential electric source terminal, for supplying an emitter current from the high potential electric source terminal to the semiconductor substrate region; and a differential amplifying circuit for controlling a base electric potential applied to a base of the n-p-n emitter follower transistor by increasing the base electric potential in cases where an electric potential of the semiconductor substrate region is increased by the surge pulse applied to the input terminal or the output terminal.

16. A switching circuit according to claim 15 wherein the differential amplifying circuit comprises:

a first n-p-n transistor in which a collector is connected with the base of the n-p-n emitter follower transistor and a base is connected with a reference control terminal applied at a reference voltage higher than an electric potential of the first signal in cases where any surge pulse having a positive voltage is not applied to the input terminal;

a second n-p-n transistor in which a base is connected with the input terminal and a collector is connected with the high potential electric source terminal;

a loading element, arranged between the collector of the first n-p-n transistor and the high potential electric source terminal, for dropping a control electric potential applied to the base of the n-p-n emitter follower transistor in cases where an emitter current of the first n-p-n transistor passes through the loading element; and a common emitter loading element connected with an emitter of the first n-p-n transistor and an emitter of the second n-p-n transistor for limiting a sum of emitter currents of the first and second n-p-n transistors to a prescribed value.

17. A switching circuit according to claim 11 wherein:

the first conductive type is an n-type and the second conductive type is a p-type, and the electric potential setting means comprises:

a p-n-p emitter follower transistor, in which an emitter is connected with the semiconductor substrate region and a collector is connected with a low potential electric source terminal, for absorbing an emitter current from the semiconductor substrate region to the low potential electric source terminal.

18. A switching circuit according to claim 11 wherein:

the first conductive type is an n-type and the second conductive type is a p-type, and the electric potential setting means comprises:

a p-n-p emitter follower transistor, in which an emitter is connected with the semiconductor substrate region and a collector is connected with a low potential electric source terminal, for absorbing an emitter current from the semiconductor substrate region to the low potential electric source terminal; and base current setting means for setting a base current absorbed from a base of the p-n-p emitter follower transistor to a constant value and decreasing a base electric potential applied to the base of the p-n-p emitter follower transistor to prevent a current from the base of the n-p-n emitter follower transistor to the semiconductor substrate region through the emitter of the n-p-n emitter follower transistor in cases where an electric potential of the semiconductor substrate region is decreased by the surge pulse applied to the input terminal or the output terminal.

19. A switching circuit according to claim 18 wherein the base current setting means comprises:

reference current supplying means for supplying a reference current flowing from a common connecting point to the low potential electric source terminal;

base current absorbing means for absorbing the base current from the base of the p-n-p emitter follower transistor to the common connecting point; and difference current supplying means for supplying a difference current from a reference potential terminal set at a referential electric potential to the common connecting point, the difference current being determined by subtracting the base current from the reference current supplied to the low potential electric source terminal by the reference current supplying means.

20. A switching circuit according to claim 11 wherein:

the first conductive type is an n-type and the second conductive type is a p-type, and the electric potential setting means comprises:

a p-n-p emitter follower transistor, in which an emitter is connected with the semiconductor substrate region and a collector is connected with a low potential electric source terminal, for absorbing an emitter current from the semiconductor substrate region to the low potential electric source terminal; and base electric potential maintaining means for maintaining a base electric potential applied to a base of the p-n-p emitter follower transistor to interrupt the emitter current in cases where an electric potential of the semiconductor substrate region is decreased by the surge pulse.

21. A switching circuit according to claim 11 wherein:

the first conductive type is an n-type and the second conductive type is a p-type, and the electric potential setting means comprises:

a p-n-p emitter follower transistor, in which an emitter is connected with the semiconductor substrate region and a collector is connected with a low potential electric source terminal, for absorbing an emitter current from the semiconductor substrate region to the low potential electric source terminal; and a differential amplifying circuit for controlling a base electric potential applied to a base of the p-n-p emitter follower transistor by decreasing the base electric potential in cases where an electric potential of the semiconductor substrate region is decreased by the surge pulse applied to the input terminal or the output terminal.

22. A switching circuit according to claim 21 wherein the differential amplifying circuit comprises:
- a first p-n-p transistor in which a collector is connected with the base of the p-n-p emitter follower transistor and a base is connected with a reference control terminal applied at a reference voltage lower than an electric potential of the first signal in cases where any surge pulse having a negative voltage is not applied to the input terminal;
- a second p-n-p transistor in which a base is connected with the input terminal and a collector is connected with the high potential electric source terminal;
- a loading element, arranged between the collector of the first p-n-p transistor and the low potential electric source terminal, for dropping a control electric potential applied to the base of the p-n-p emitter follower transistor in cases where an emitter current of the first p-n-p transistor passes through the loading element; and
- a common emitter loading element connected with an emitter of the first p-n-p transistor and an emitter of the second p-n-p transistor for limiting a sum of emitter currents of the first and second p-n-p transistors to a prescribed value.

23. A switching circuit according to claim 11 wherein:
the first conductive type is an n-type and the second conductive type is a p-type, an electric potential of the semiconductor substrate region is set to a particular electric potential, and the electric potential setting means comprises:
surge pulse detecting means for judging whether or not an input electric potential of the input signal is lower than a reference electric potential and judging that the surge pulse is detected in cases where the input electric potential of the input signal is lower than the reference electric potential, the reference electric potential being determined on condition that the first p-n junction between the input side semiconductor region set to the reference electric potential and the semiconductor substrate region set to the particular electric potential is not set to an "on" condition; and
substrate region potential controlling means for maintaining the particular electric potential of the semiconductor substrate region in cases where any surge pulse is not detected by the surge pulse detecting means and setting the semiconductor substrate region to a floating potential in cases where the detection of the surge pulse is judged by the surge pulse detecting means.

24. A switching circuit according to claim 23 wherein the surge pulse detecting means comprises:
- an n-p-n transistor in which a low electric potential is applied to a base and an emitter is connected with the input terminal; and
- a constant current source connected with a collector of the n-p-n transistor to transmit a constant current supplied from a high potential electric source terminal through the n-p-n transistor, and the substrate region potential controlling means comprises:
- an NMOS transistor in which one main electrode is connected with the semiconductor substrate region, the low electric potential is applied to the other main electrode and a gate is connected with the collector of the n-p-n transistor.

25. A switching circuit according to claim 23 wherein the surge pulse detecting means comprises:
- an n-p-n transistor in which a low electric potential is applied to a base and an emitter is connected with the input terminal;
- a p-n-p transistor in which the low electric potential is applied to a collector and a base is connected with a collector of the n-p-n transistor; and
- a constant current source connected with an emitter of the p-n-p transistor to transmit a constant current supplied from a high potential electric source terminal through the base of the p-n-p transistor and the n-p-n transistor, and the substrate region potential controlling means comprises:
- an NMOS transistor in which one main electrode is connected with the semiconductor substrate region, the low electric potential is applied to the other main electrode and a gate is connected with the collector of the n-p-n transistor.

26. A switching circuit according to claim 23, further comprising:
signal transmission stopping means for preventing the inversion of the second conductive type in the channel portion of the semiconductor substrate region to the first conductive type regardless of the control signal applied to the control input terminal to stop the transmission of the input signal in cases where the detection of the surge pulse is judged by the surge pulse detecting means.

27. A switching circuit according to claim 23 wherein substrate region potential controlling means comprises:
an NMOS transistor in which one main electrode is connected with the semiconductor substrate region, a low electric potential is applied to the other main electrode, and the surge pulse detecting means comprises:
- a first n-p-n transistor in which a collector is connected with a gate of the AMOS transistor and the reference electric potential is applied to a base;
- a second n-p-n transistor in which a base is connected with the input terminal and a high electric potential is applied to a collector;
- a common emitter loading element connected with an emitter of the first n-p-n transistor and an emitter of the second n-p-n transistor for limiting a sum of emitter currents of the first and second n-p-n transistors to a prescribed value; and
- a loading element for dropping a control electric potential applied to the gate of the NMOS transistor in cases where a collector current of the first n-p-n transistor passes through the loading element.

28. A switching circuit according to claim 11 wherein:
the first conductive type is an n-type and the second conductive type is a p-type, an electric potential of the semiconductor substrate region is set to a particular electric potential, and the electric potential setting means comprises:
surge pulse detecting means for judging whether or not an input electric potential of the input signal is lower than a reference electric potential and judging that the surge pulse is detected in cases where the input electric potential of the input signal is lower than the reference electric potential, the reference electric potential being determined on condition that the first p-n junction between the input side semiconductor region set to the reference electric potential and the semiconductor substrate region set to the particular electric potential is not set to an "on" condition; and substrate region potential controlling means for maintaining the particular electric potential of the semiconductor substrate region in cases where any surge pulse is not detected by the surge pulse detecting means and changing the particular electric potential of the semiconductor substrate region to decrease an electric potential difference between the semiconductor substrate region and the input side semiconductor region in cases where the detection of the surge pulse is judged by the surge pulse detecting means.

29. A switching circuit according to claim 28 wherein the surge pulse detecting means comprises:

an n-p-n transistor in which a low electric potential is applied to a base and an emitter is connected with the input terminal;

a p-n-p transistor in which the low electric potential is applied to a collector and a base is connected with a collector of the n-p-n transistor; and a constant current source connected with an emitter of the p-n-p transistor to transmit a constant current supplied from a high potential electric source terminal through the base of the p-n-p transistor and the n-p-n transistor, and the substrate region potential controlling means comprises:

a first NMOS transistor in which one main electrode is connected with the semiconductor substrate region, the low electric potential is applied to the other main electrode and a gate is connected with the collector of the n-p-n transistor; and a second NMOS transistor in which one main electrode is connected with the semiconductor substrate region and the first NMOS transistor and the other main electrode is connected with the input terminal, a lateral n-p-n parasitic transistor in which one n-type semiconductor region connected with the one main electrode of the second NMOS transistor functions as a collector, the other n-type semiconductor region connected with the other main electrode of the second NMOS transistor functions as an emitter and a p-type semiconductor region placed just under a gate of the second NMOS transistor functions as a base being turned on in cases where the surge pulse is applied to the input terminal.

30. A switching circuit according to claim 28 wherein the surge pulse detecting means comprises:

an n-p-n transistor in which a low electric potential is applied to a base and an emitter is connected with the input terminal;

a p-n-p transistor in which the low electric potential is applied to a collector and a base is connected with a collector of the n-p-n transistor; and a constant current source connected with an emitter of the p-n-p transistor to transmit a constant current supplied from a high potential electric source terminal through the base of the p-n-p transistor and the n-p-n transistor, and the substrate region potential controlling means comprises:

a first NMOS transistor in which one main electrode is connected with the semiconductor substrate region, the low electric potential is applied to the other main electrode and a gate is connected with the collector of the n-p-n transistor; and a second NMOS transistor in which one main electrode is connected with the semiconductor substrate region and the first NMOS transistor and the other main electrode is connected with the input terminal, a lateral n-p-n parasitic transistor in which one n-type semiconductor region connected with the one main electrode of the second NMOS transistor functions as a collector, the other n-type semiconductor region connected with the other main electrode of the second NMOS transistor functions as an emitter and a p-type semiconductor region placed just under a gate of the second NMOS transistor functions as a base being turned on in cases where the surge pulse is applied to the input terminal.

31. A switching circuit according to claim 28, further comprising:

signal transmission stopping means for preventing the inversion of the second conductive type in the channel portion of the semiconductor substrate region to the first conductive type regardless of the control signal applied to the control input terminal to stop the transmission of the input signal in cases where the detection of the surge pulse is judged by the surge pulse detecting means.

32. A switching circuit according to claim 28 wherein the substrate region potential controlling means comprises:

an NMOS transistor in which one main electrode is connected with the semiconductor substrate region, a low electric potential is applied to the other main electrode, and the surge pulse detecting means comprises:

a first n-p-n transistor in which a collector is connected with a gate of the NMOS transistor and the reference electric potential is applied to a base;

a second n-p-n transistor in which a base is connected with the input terminal and a high electric potential is applied to a collector;

a common emitter loading element connected with an emitter of the first n-p-n transistor and an emitter of the second n-p-n transistor for limiting a sum of emitter currents of the first and second n-p-n transistors to a prescribed value; and a loading element for dropping a control electric potential applied to the gate of the NMOS transistor in cases where a collector current of the first n-p-n transistor passes through the loading element.

33. A switching circuit according to claim 11 wherein:

the first conductive type is an n-type and the second conductive type is a p-type, an electric potential of the semiconductor substrate region is set to a particular electric potential, and the electric potential setting means comprises:

surge pulse detecting means for judging whether or not an output electric potential of the output signal is lower than a reference electric potential and judging that the surge pulse is detected in cases where the output electric potential of the output signal is lower than the reference electric potential, the reference electric potential being determined on condition that the second p-n junction between the output side semiconductor region set to the reference electric potential and the semiconductor substrate region set to the particular electric potential is not set to an "on" condition; and substrate region potential controlling means for maintaining the particular electric potential of the semiconductor substrate region in cases where any surge pulse is not detected by the surge pulse detecting means and setting the semiconductor substrate region to a floating potential in cases where the detection of the surge pulse is judged by the surge pulse detecting means.

34. A switching circuit according to claim 33 wherein the surge pulse detecting means comprises:

an n-p-n transistor in which a low electric potential is applied to a base and an emitter is connected with the output terminal, and a constant current source connected with a collector of the n-p-n transistor to transmit a constant current supplied from a high potential electric source terminal through the n-p-n transistor; and the substrate region potential controlling means includes an NMOS transistor in which one main electrode is connected with the semiconductor substrate region, the low electric potential is applied to the other main electrode and a gate is connected with the collector of the n-p-n transistor.

35. A switching circuit according to claim 33 wherein the surge pulse detecting means comprises:

an n-p-n transistor in which a low electric potential is applied to a base and an emitter is connected with the output terminal;

a p-n-p transistor in which the low electric potential is applied to a collector and a base is connected with a collector of the n-p-n transistor; and a constant current source connected with an emitter of the p-n-p transistor to transmit a constant current supplied from a high potential electric source terminal through the base of the p-n-p transistor and the n-p-n transistor, and the substrate region potential controlling means comprises:

an NMOS transistor in which one main electrode is connected with the semiconductor substrate region, the low electric potential is applied to the other main electrode and a gate is connected with the collector of the n-p-n transistor.

36. A switching circuit according to claim 33, further comprising:

signal transmission stopping means for preventing the inversion of the second conductive type in the channel portion of the semiconductor substrate region to the first conductive type regardless of the control signal applied to the control input terminal to stop the transmission of the output signal in cases where the detection of the surge pulse is judged by the surge pulse detecting means.

37. A switching circuit according to claim 33 wherein the substrate region potential controlling means comprises:

an NMOS transistor in which one main electrode is connected with the semiconductor substrate region, a low electric potential is applied to the other main electrode, and the surge pulse detecting means comprises:

a first n-p-n transistor in which a collector is connected with a gate of the NMOS transistor and the reference electric potential is applied to a base;

a second n-p-n transistor in which a base is connected with the input terminal and a high electric potential is applied to a collector;

a common emitter loading element connected with an emitter of the first n-p-n transistor and an emitter of the second n-p-n transistor for limiting a sum of emitter currents of the first and second n-p-n transistors to a prescribed value; and a loading element for dropping a control electric potential applied to the gate of the NMOS transistor in cases where a collector current of the first n-p-n transistor passes through the loading element.

38. A switching circuit according to claim 11 wherein:

the first conductive type is an n-type and the second conductive type is a p-type, an electric potential of the semiconductor substrate region is set to a particular electric potential, and the electric potential setting means comprises:

surge pulse detecting means for judging whether or not an output electric potential of the output signal is lower than a reference electric potential and judging that the surge pulse is detected in cases where the output electric potential of the output signal is lower than the reference electric potential, the reference electric potential being determined on condition that the second p-n junction between the output side semiconductor region set to the reference electric potential and the semiconductor substrate region set to the particular electric potential is not set to an "on" condition; and substrate region potential controlling means for maintaining the particular electric potential of the semiconductor substrate region in cases where any surge pulse is not detected by the surge pulse detecting means and changing the particular electric potential of the semiconductor substrate region to decrease an electric potential difference between the semiconductor region in cases where the detection of the surge pulse is judged by the surge pulse detecting means.

39. A switching circuit according to claim 38 wherein:

the surge pulse detecting means comprises:

an n-p-n transistor in which a low electric potential is applied to a base and an emitter is connected with the output terminal, a p-n-p transistor in which the low electric potential is applied to a collector and a base is connected with a collector of the n-p-n transistor, and a constant current source connected with an emitter of the p-n-p transistor to transmit a constant current supplied from a high potential electric source terminal through the base of the p-n-p transistor and the n-p-n transistor; and the substrate region potential controlling means comprises:

a first NMOS transistor in which one main electrode is connected with the semiconductor substrate region, the low electric potential is applied to the other main electrode and a gate is connected with the collector of the n-p-n transistor, and a second NMOS transistor in which one main electrode is connected with the semiconductor substrate region and the first NMOS transistor and the other main electrode is connected with the output terminal, a lateral n-p-n parasitic transistor in which one n-type semiconductor region connected with the one main electrode of the second NMOS transistor functions as a collector, the other e-type semiconductor region connected with the other main electrode of the second NMOS transistor functions as an emitter and a p-type semiconductor region placed just under a gate of the second NMOS transistor functions as a base being turned on in cases where the surge pulse is applied to the output terminal.

40. A switching circuit according to claim 39 wherein the surge pulse detecting means comprises:

an n-p-n transistor in which a low electric potential is applied to a base and an emitter is connected with the output terminal;

a p-n-p transistor in which the low electric potential is applied to a collector and a base is connected with a collector of the n-p-n transistor; and a constant current source connected with an emitter of the p-n-p transistor to transmit a constant current supplied from a high potential electric source terminal through the base of the p-n-p transistor and the n-p-n transistor, and the substrate region potential controlling means comprises:

a first NMOS transistor in which one main electrode is connected with the semiconductor substrate region, the low electric potential is applied to the other main electrode and a gate is connected with the collector of the n-p-n transistor; and a second NMOS transistor in which one main electrode is connected with the semiconductor substrate region and the first NMOS transistor and the other main electrode is connected with the output terminal, a lateral n-p-n parasitic transistor in which one n-type semiconductor region connected with the one main electrode of the second NMOS transistor functions as a collector, the other n-type semiconductor region connected with the other main electrode of the second NMOS transistor functions as an emitter and a p-type semiconductor region placed just under a gate of the second NMOS transistor functions as a base being turned on in cases where the surge pulse is applied to the output terminal.

41. A switching circuit according to claim 38, further comprising:

signal transmission stopping means for preventing the inversion of the second conductive type in the channel portion of the semiconductor substrate region to the first conductive type regardless of the control signal applied to the control input terminal to stop the transmission of the output signal in cases where the detection of the surge pulse is judged by the surge pulse detecting means.

42. A switching circuit according to claim 38 wherein the substrate region potential controlling means comprises:

an NMOS transistor in which one main electrode is connected with the semiconductor substrate region, a low electric potential is applied to the other main electrode, and the surge pulse detecting means comprises:

a first n-p-n transistor in which a collector is connected with a gate of the NMOS transistor and the reference electric potential is applied to a base;

a second n-p-n transistor in which a base is connected with the input terminal and a high electric potential is applied to a collector;

a common emitter loading element connected with an emitter of the first n-p-n transistor and an emitter of the second n-p-n transistor for limiting a sum of emitter currents of the first and second n-p-n transistors to a prescribed value; and a loading element for dropping a control electric potential applied to the gate of the NMOS transistor in cases where a collector current of the first n-p-n transistor passes through the loading element.

* * * * *